United States Patent
Gilbert et al.

(10) Patent No.: US 9,431,594 B2
(45) Date of Patent: *Aug. 30, 2016

(54) EXTREMELY LOW RESISTANCE COMPOSITIONS AND METHODS FOR CREATING SAME

(71) Applicant: Ambature, Inc., Scottsdale, AZ (US)

(72) Inventors: Douglas J. Gilbert, Flagstaff, AZ (US); Timothy S. Cale, Phoenix, AZ (US)

(73) Assignee: Ambature, Inc., Scottsdale, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/195,392

(22) Filed: Mar. 3, 2014

(65) Prior Publication Data

US 2014/0329686 A1    Nov. 6, 2014

Related U.S. Application Data

(63) Continuation of application No. 13/832,051, filed on Mar. 15, 2013, now abandoned, which is a continuation of application No. 13/076,188, filed on Mar. 30, 2011, now Pat. No. 8,404,620.

(51) Int. Cl.
| | | |
|---|---|---|
| *H01L 39/12* | (2006.01) | |
| *H01B 12/00* | (2006.01) | |
| *H01L 39/24* | (2006.01) | |

(52) U.S. Cl.
CPC ......... *H01L 39/128* (2013.01); *H01L 39/2422* (2013.01); *H01L 39/2464* (2013.01); *Y10T 428/31678* (2015.04)

(58) Field of Classification Search
CPC ............... H01L 39/12; H01L 39/125–39/128; H01L 25/16
See application file for complete search history.

(56) References Cited

U.S. PATENT DOCUMENTS

| | | | | |
|---|---|---|---|---|
| 5,120,707 A | * | 6/1992 | Maxfield et al. | 505/325 |
| 6,383,989 B2 | * | 5/2002 | Jia et al. | 505/236 |
| 6,930,875 B2 | * | 8/2005 | Sakashita | 361/306.3 |

* cited by examiner

*Primary Examiner* — Colleen Dunn
(74) *Attorney, Agent, or Firm* — Toering Patents PLLC

(57) ABSTRACT

The invention pertains to creating new extremely low resistance ("ELR") materials, which may include high temperature superconducting ("HTS") materials. In some implementations of the invention, an ELR material may be modified by depositing a layer of modifying material unto the ELR material to form a modified ELR material. The modified ELR material has improved operational characteristics over the ELR material alone. Such operational characteristics may include operating at increased temperatures or carrying additional electrical charge or other operational characteristics. In some implementations of the invention, the ELR material is a cuprate-perovskite, such as, but not limited to BSCCO. In some implementations of the invention, the modifying material is a conductive material that bonds easily to oxygen, such as, but not limited to, chromium.

19 Claims, 43 Drawing Sheets

EXTREMELY LOW RESISTANCE COMPOSITIONS AND METHODS FOR CREATING SAME

CROSS-REFERENCE TO RELATED APPLICATIONS

This application is a continuation of U.S. application Ser. No. 13/832,051, entitled "Extremely Low Resistance Compositions and Methods for Creating Same," filed on Mar. 15, 2013; which is a continuation of U.S. application Ser. No. 13/076,188, entitled "Extremely Low Resistance Compositions and Methods for Creating Same," filed on Mar. 30, 2011 and now issued as U.S. Pat. No. 8,404,620. Each of the foregoing applications is incorporated herein by reference in its entirety.

FIELD OF THE INVENTION

The invention is generally related to materials with extremely low resistance ("ELR materials") at high temperatures, and more particularly to modifying ELR materials, including various existing high temperature superconducting ("HTS") materials, to operate at higher temperatures and/or with increased charge carrying capacity.

BACKGROUND OF THE INVENTION

Ongoing research attempts to achieve new materials with improved operational characteristics, for example, reduced electrical resistance at higher temperatures over that of existing materials, including superconducting materials. Scientists have theorized a possible existence of a "perfect conductor," or a material that operates with extremely low resistance, but that may not necessarily demonstrate all the conventionally accepted characteristics of a superconducting material.

Notwithstanding their name, conventional high temperature superconducting ("HTS") materials still operate at very low temperatures. In fact, most commonly used HTS materials still require use of a cooling system that uses liquids with very low boiling points (e.g., liquid nitrogen). Such cooling systems increase implementation costs and discourage widespread commercial and consumer use and/or application of such materials.

What is needed are improved ELR materials that operate with improved operating characteristics over conventional ELR materials.

BRIEF DESCRIPTION OF THE DRAWINGS

The accompanying drawings, which are included to provide a further understanding of the invention and are incorporated in and constitute a part of this specification, illustrate various exemplary implementations of the invention and together with the detailed description serve to explain various principles and/or aspects of the invention.

SUMMARY OF THE INVENTION

Figure 1:
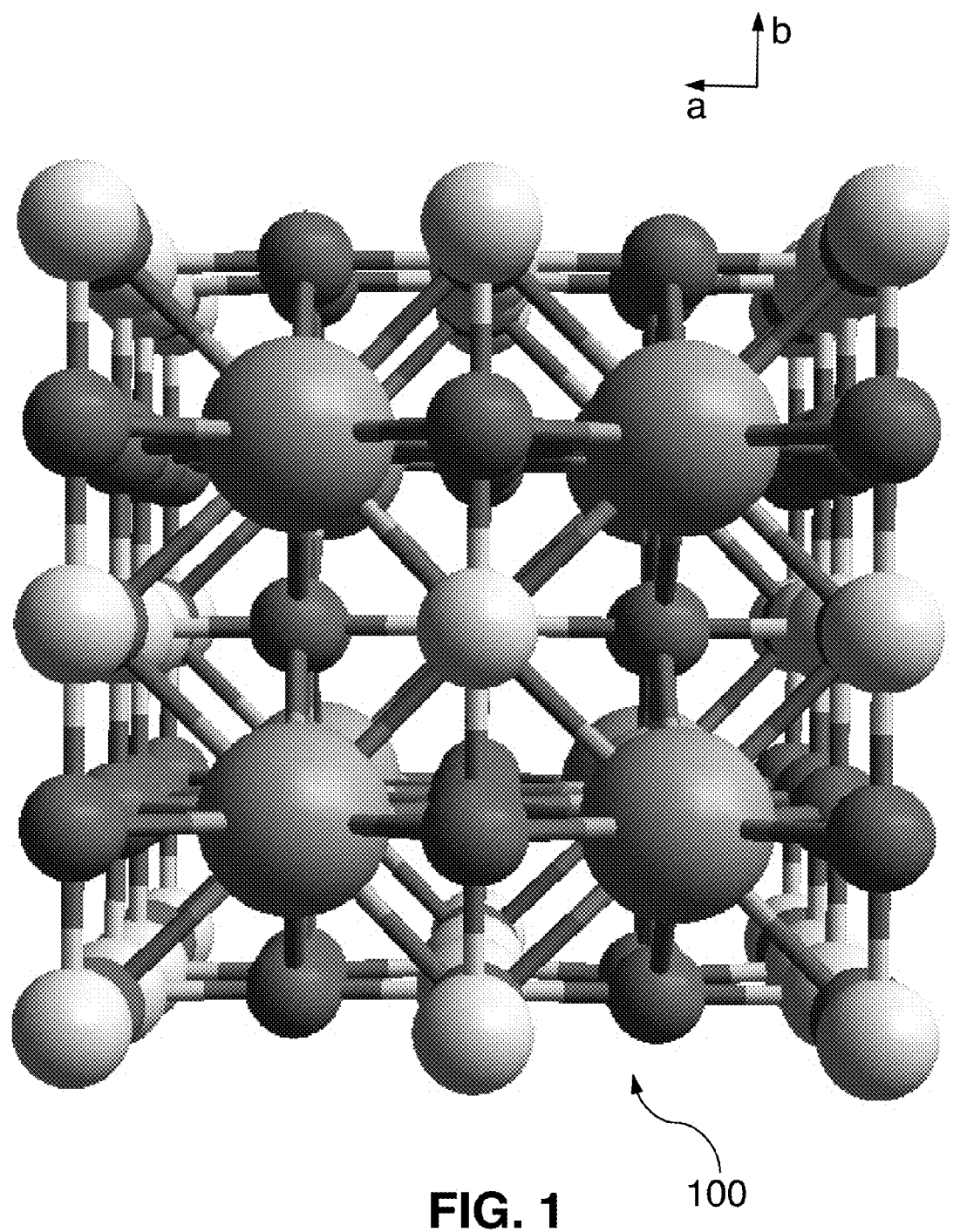
FIG. 1 illustrates a crystalline structure of an exemplary ELR material as viewed from a first perspective.

Generally speaking, various implementations of the invention relate to new ELR materials and/or processes for creating new ELR materials. In some implementations of the invention, existing ELR materials, including existing HTS materials, are modified to create modified ELR materials with improved operating characteristics. These operating characteristics may include, but are not limited to, operating in an extremely low resistance state at increased temperatures, operating with increased charge carrying capacity at the same (or higher) temperatures, and/or other improved operating characteristics. With regard to HTS materials, these operating characteristics may correspondingly include, but are not limited to, operating in a superconducting state at increased temperatures, operating with increased charge carrying capacity at the same (or higher) temperatures, and/or other improved operating characteristics.

In some implementations, a modifying material is layered onto an ELR material to form a modified ELR material that operates at a higher temperature than that of the ELR material without a modifying material. Exemplary ELR materials may be selected from a family of HTS materials known as cuprate-perovskite ceramic materials. In some implementations of the invention, modifying material may be a conductive material. In some implementations of the invention, modifying material may be a material with high oxygen affinity (i.e., a material that bonds easily with oxygen) ("oxygen bonding material"). In some implementations of the invention, modifying material may be a conductive material that bonds easily with oxygen ("oxygen bonding conductive materials"). Such oxygen bonding conductive materials may include, but are not limited to: chromium, copper, bismuth, cobalt, vanadium, and titanium. Such oxygen bonding conductive materials may also include, but are not limited to: rhodium or beryllium. Other modifying materials may include gallium or selenium. Other modifying materials may include silver.

In some implementations of the invention, a composition comprises an ELR material and a modifying material bonded to the ELR material.

In some implementations of the invention, a composition comprises an extremely low resistance material, and a modifying material bonded to the extremely low resistance material, where the composition has improved operating characteristics over the extremely low resistance material.

In some implementations of the invention, a composition comprises an extremely low resistance material, and a modifying material bonded to the extremely low resistance material such that the composition operates in an ELR state at a temperature greater than that of the extremely low resistance material alone or without the modifying material.

In some implementations of the invention, a method comprises bonding a modifying material to an extremely low resistance material to form a modified extremely low resistance material, where the modified extremely low resistance material operates at a temperature greater than that of the extremely low resistance material alone or without the modifying material.

In some implementations of the invention, a method for creating an extremely low resistance material comprises depositing a modifying material onto an initial extremely low resistance material thereby creating the extremely low resistance material, wherein the extremely low resistance material has improved operating characteristics over the initial extremely low resistance material alone or without the modifying material.

In some implementations of the invention, a method comprises bonding a modifying material to a superconducting material to form a modified superconducting material such that the modified superconducting material operates in superconducting state at a temperature greater than that of the superconducting material alone or without the modifying material.

In some implementations of the invention, a composition comprises a first layer comprising an extremely low resistance material, and a second layer comprising a modifying material, where the second layer is bonded to the first layer. In some implementations of the invention, a composition comprises a first layer comprising an extremely low resistance material, a second layer comprising a modifying material, where the second layer is bonded to the first layer, a third layer comprising the extremely low resistance material, and a fourth layer of the modifying material, where the third layer is bonded to the fourth layer. In some implementations of the invention, the second layer is deposited onto the first layer. In some implementations of the invention, the first layer is deposited onto the second layer. In some implementations of the invention, the extremely low resistance material of the first layer is formed on the second layer. In some implementations of the invention, the first layer has a thickness of at least a single crystalline unit cell of the extremely low resistance material. In some implementations of the invention, the first layer has a thickness of several crystalline unit cells of the extremely low resistance material. In some implementations of the invention, the second layer has a thickness of at least a single atom of the modifying material. In some implementations of the invention, the second layer has a thickness of several atoms of the modifying material.

In some implementations of the invention, a composition comprises a first layer comprising BSCCO, and a second layer comprising a modifying material, wherein the modifying material of the second layer is bonded to the BSCCO of the first layer, wherein the modifying material is an element selected as any one or more of the group consisting of chromium, copper, bismuth, cobalt, vanadium, titanium, rhodium, beryllium, gallium, selenium, and silver. In some implementations of the invention, the modifying material of the second layer is bonded to a face of the BSCCO of the first layer, where the face is not substantially perpendicular to a c-axis of the BSCCO. In some implementations of the invention, the modifying material of the second layer is bonded to a face of the BSCCO of the first layer, where the face is substantially perpendicular to any line in an "a-b" face of the BSCCO. In some implementations of the invention, the modifying material of the second layer is bonded to a face of the BSCCO of the first layer, where the face is substantially perpendicular to a b-axis of the BSCCO. In some implementations of the invention, the modifying material of the second layer is bonded to a face of the BSCCO of the first layer, where the face is substantially perpendicular to an a-axis of the BSCCO. In some implementations of the invention, the modifying material of the second layer is bonded to a face of the BSCCO of the first layer, where the face is substantially parallel to the c-axis.

In any of the aforementioned or following implementations of the invention, the ELR material comprises a HTS material. In any of the aforementioned or following implementations of the invention, the ELR material comprises an HTS perovskite material. In any of the aforementioned or following implementations of the invention, the HTS perovskite material may be selected from the groups generically referred to as LaBaCuO, LSCO, YBCO, BSCCO, TBCCO, $HgBa_2Ca_2Cu_3O_x$, or other HTS perovskite materials. In any of the aforementioned or following implementations of the invention, the modifying materials may be a conductive material that bonds easily with oxygen. In any of the aforementioned or following implementations of the invention, the modifying materials may be any one or combination of chromium, copper, bismuth, cobalt, vanadium, titanium, rhodium, beryllium, gallium, selenium, and/or silver. In any of the aforementioned or following implementations of the invention, various combinations of the ELR materials and the modifying materials may be used. In any of the aforementioned or following implementations of the invention, the ELR material is BSCCO and the modifying material is chromium.

In any of the aforementioned or following implementations of the invention, the composition operates at a higher temperature than the extremely low resistance material alone or without the modifying material. In any of the aforementioned or following implementations of the invention, the composition demonstrates extremely low resistance at a higher temperature than that of the extremely low resistance material alone or without the modifying material. In any of the aforementioned or following implementations of the invention, the composition transitions from a non-ELR state to an ELR state at a temperature higher than that of the extremely low resistance material alone or without the modifying material. In any of the aforementioned or following implementations of the invention, the composition has a transition temperature greater than that of the extremely low resistance material alone or without the modifying material. In any of the aforementioned or following implementations of the invention, the composition carries a greater amount of current in an ELR state than that carried by the extremely low resistance material alone or without the modifying material.

In any of the aforementioned or following implementations, the composition operates in an extremely low resistance state at a higher temperature than the extremely low resistance material alone or without the modifying material. In any of the aforementioned or following implementations, the composition operates in an extremely low resistance state at temperatures greater than one or more of the following temperatures: 100K, 110K, 120K, 130K, 140K, 150K, 160K, 170K, 180K, 190K, 200K, 210K, 220K, 230K, 240K, 250K, 260K, 270K, 280K, 290K, 300K, or 310K.

In any of the aforementioned or following implementations where the ELR material is BSCCO, the composition has improved operating characteristics over those of BSCCO alone or without the modifying material. In any of the aforementioned or following implementations where the ELR material is BSCCO, the composition operates at a higher temperature than that of BSCCO alone or without the modifying material. In any of the aforementioned or following implementations where the ELR material is BSCCO, the composition demonstrates extremely low resistance at a higher temperature than that of BSCCO alone or without the modifying material. In any of the aforementioned or following implementations where the ELR material is BSCCO, the composition transitions from a non-ELR state to an ELR state at a temperature higher than that of BSCCO alone or without the modifying material. In any of the aforementioned or following implementations where the ELR material is BSCCO, the composition has a transition temperature greater than that of BSCCO alone or without the modifying material. In any of the aforementioned or following implementations where the ELR material is BSCCO, the composition carries a greater amount of current in an ELR state than that carried by BSCCO in its ELR state alone or without the modifying material.

In some implementations of the invention, a product or composition is produced by any of the aforementioned methods or processes.

DETAILED DESCRIPTION

Various features, advantages, and implementations of the invention may be set forth or be apparent from consideration of the following detailed description, the drawings, and the claims. It is to be understood that the detailed description and the drawings are exemplary and intended to provide further explanation without limiting the scope of the invention except as set forth in the claims.

For purposes of this description, extremely low resistance ("ELR") materials may include: superconducting materials, including, but not limited to, HTS materials; perfectly conducting materials (e.g., perfect conductors); and other conductive materials with extremely low resistance. For purposes of this description, operating characteristics with regard to ELR materials and/or various implementations of the invention may include, but are not limited to, a resistance of the ELR material in its ELR state (for example, with regard to superconductors, a superconducting state), a transition temperature of the ELR material to its ELR state, a charge propagating capacity of the ELR material in its ELR state, one or more magnetic properties of the ELR material, one or more mechanical properties of the ELR material, and/or other operating characteristics of the ELR material. Further, for purposes of this description, improved operating characteristics may include, but are not limited to, operating in an ELR state (including, for example, a superconducting state) at higher temperatures, operating with increased charge propagating capacity at the same (or higher) temperatures, operating with improved magnetic properties, operating with improved mechanical properties, and/or other improved operating characteristics.

For purposes of this description, "extremely low resistance" is resistance similar in magnitude to the flux flow resistance of Type II superconducting materials in their superconducting state, and may generally be expressed in terms of resistivity in a range of zero Ohm-cm to one fiftieth (1/50) of the resistivity of substantially pure copper at 293K. For example, as used herein, substantially pure copper is 99.999% copper. In various implementations of the invention, portions of ELR materials have a resistivity in a range of zero Ohm-cm to $3.36 \times 10^{-8}$ Ohm-cm.

As generally understood, the transition temperature is a temperature below which the ELR material "operates" or exhibits (or begins exhibiting) extremely low resistance, and/or other phenomenon associated with ELR materials. When operating with extremely low resistance, the ELR material is referred to as being in an ELR state. At temperatures above the transition temperature, the ELR material ceases to exhibit extremely low resistance and the ELR material is referred to as being in its non-ELR state. In other words, the transition temperature corresponds to a temperature at which the ELR material changes between its non-ELR state and its ELR state. As would be appreciated, for some ELR materials, the transition temperature may be a range of temperatures over which the ELR material changes between its non-ELR state and its ELR state. As would also be appreciated, the ELR material may have hysteresis in its transition temperature with one transition temperature as the ELR material warms and another transition temperature as the ELR material cools.

Figure 13:
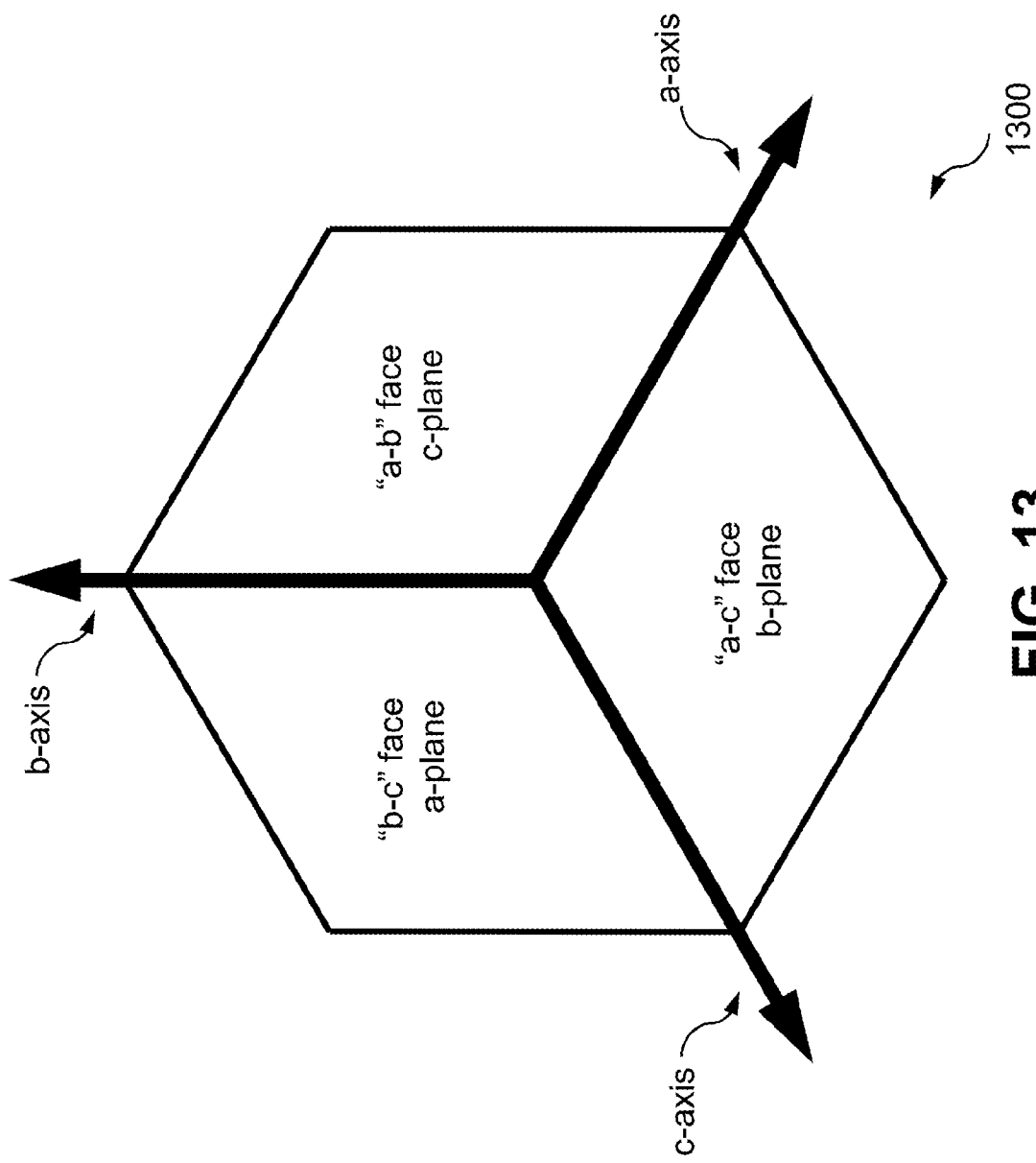
FIG. 13 illustrates a reference frame useful for describing various implementations of the invention.

FIG. 13 illustrates a reference frame 1300 which may be used to describe various implementations of the invention. Reference frame 1300 includes a set of axes referred to as an a-axis, a b-axis, and a c-axis. For purposes of this description: reference to the a-axis includes the a-axis and any other axis parallel thereto; reference to the b-axis includes the b-axis and any other axis parallel thereto; and reference to the c-axis includes the c-axis and any other axis parallel thereto. Various pairs of the axes form a set of planes in reference frame 1300 referred to as an a-plane, a b-plane, and a c-plane, where: the a-plane is formed by the b-axis and the c-axis and is perpendicular to the a-axis; the b-plane is formed by the a-axis and the c-axis and is perpendicular to the b-axis; and the c-plane is formed by the a-axis and the b-axis and is perpendicular to the c-axis. For purposes of this description: reference to the a-plane includes the a-plane and any plane parallel thereto; reference to the b-plane includes the b-plane and any plane parallel thereto; and reference to the c-plane includes the c-plane and any plane parallel thereto. Further, with regard to various "faces" or "surfaces" of the crystalline structures described herein, a face parallel to the a-plane may sometimes be referred to as a "b-c" face; a face parallel to the b-plane may sometimes be referred to as an "a-c" face; and a face parallel to the c-plane may sometimes be referred to as a "a-b" face.

Figure 2:
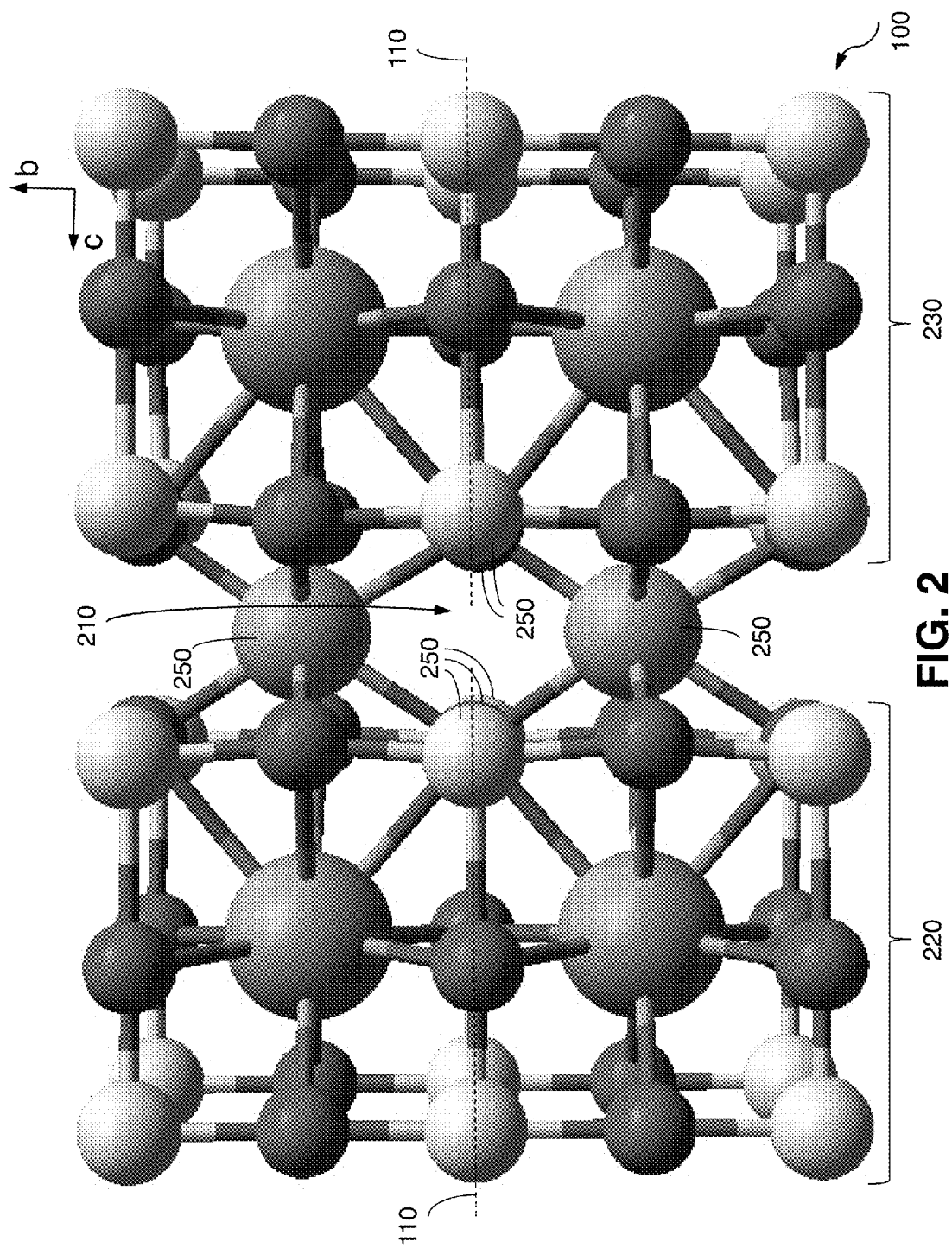
FIG. 2 illustrates a crystalline structure of an exemplary ELR material as viewed from a second perspective.

FIG. 1 illustrates a crystalline structure 100 of an exemplary ELR material as viewed from a first perspective, namely, a perspective perpendicular to an "a-b" face of crystalline structure 100 and parallel to the c-axis thereof. FIG. 2 illustrates crystalline structure 100 as viewed from a second perspective, namely, a perspective perpendicular to a "b-c" face of crystalline structure 100 and parallel to the a-axis thereof. For purposes of this description, the exemplary ELR material illustrated in FIG. 1 and FIG. 2 is generally representative of various ELR materials. In some implementations of the invention, the exemplary ELR material may be a representative of a family of superconducting materials referred to as mixed-valence copper-oxide perovskites. The mixed-valence copper-oxide perovskite materials include, but are not limited to, $LaBaCuO_x$, LSCO (e.g., $La_{2-x}Sr_xCuO_4$, etc.), YBCO (e.g., $YBa_2Cu_3O_7$, etc.), BSCCO (e.g., $Bi_2Sr_2Ca_2Cu_3O_{10}$, etc.), TBCCO (e.g., $Tl_2Ba_2Ca_2Cu_3O_{10}$ or $Tl_mBa_2Ca_{n-1}Cu_nO_{2n+m+2+\delta}$), $HgBa_2Ca_2Cu_3O_x$, and other mixed-valence copper-oxide perovskite materials. The other mixed-valence copper-oxide perovskite materials may include, but are not limited to, various substitutions of the cations as would be appreciated. As would also be appreciated, the aforementioned named mixed-valence copper-oxide perovskite materials may refer to generic classes of materials in which many different formulations exist. In some implementations of the invention, the exemplary ELR materials may include an HTS material outside of the family of mixed-valence copper-oxide perovskite materials ("non-perovskite materials"). Such non-perovskite materials may include, but are not limited to, iron pnictides, magnesium diboride ($MgB_2$), and other non-perovskites. In some implementations of the invention, the exemplary ELR materials may be other superconducting materials.

Figure 4:
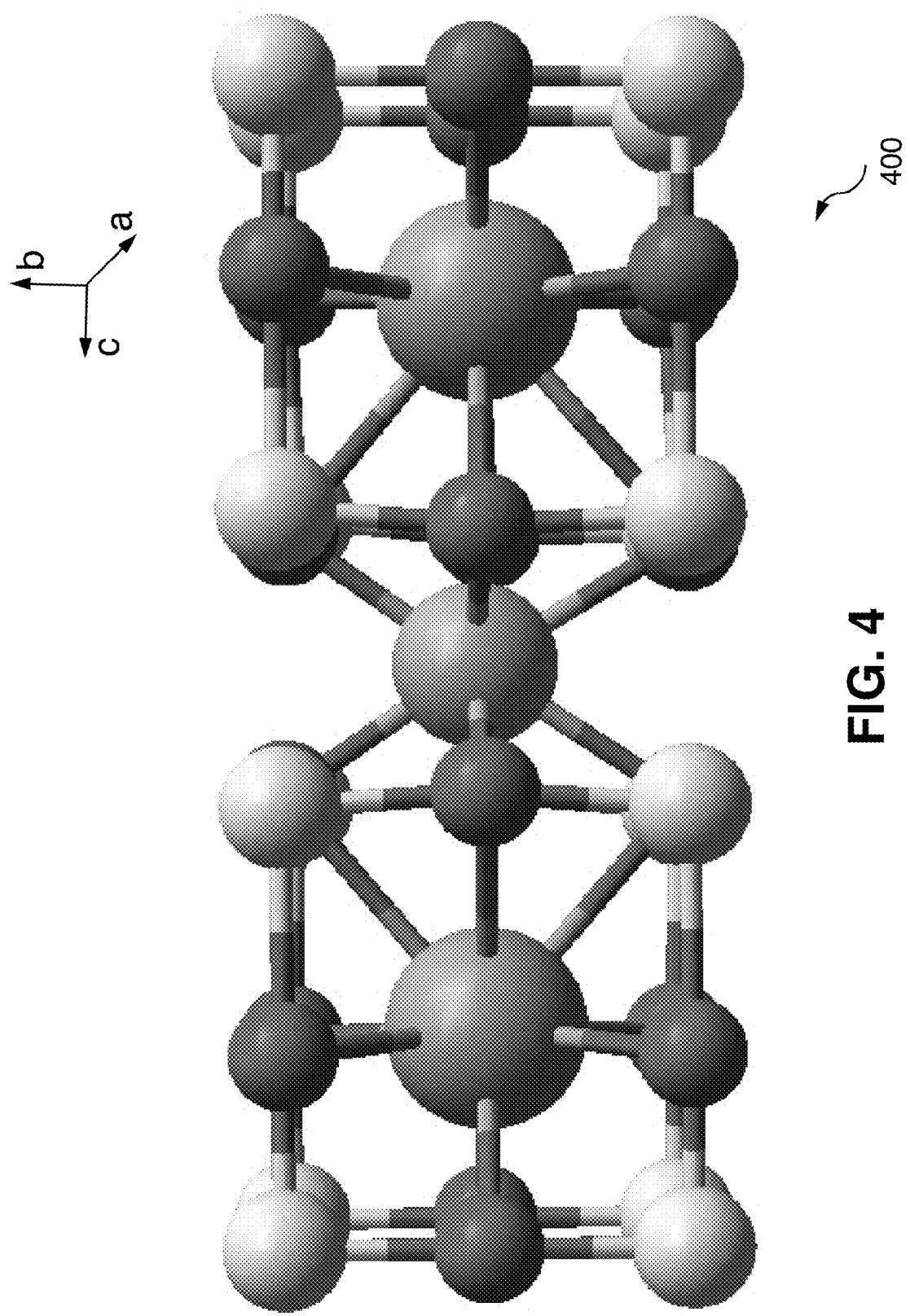
FIG. 4 illustrates a single unit cell of an exemplary ELR material.

Many ELR materials have a structure similar to (though not necessarily identical to) that of crystalline structure 100 with different atoms, combinations of atoms, and/or lattice arrangements as would be appreciated. As illustrated in FIG. 2, crystalline structure 100 is depicted with two complete unit cells of the exemplary ELR material, with one unit cell above reference line 110 and one unit cell below reference line 110. FIG. 4 illustrates a single unit cell 400 of the exemplary ELR material.

Generally speaking and as would be appreciated, a unit cell 400 of the exemplary ELR material includes six "faces": two "a-b" faces that are parallel to the c-plane; two "a-c" faces that are parallel to the b-plane; and two "b-c" faces that are parallel to the a-plane (see, e.g., FIG. 13). As would also be appreciated, a "surface" of ELR material in the macro sense may be comprised of multiple unit cells 400 (e.g., hundreds, thousands or more). Reference in this description to a "surface" or "face" of the ELR material being parallel to a particular plane (e.g., the a-plane, the b-plane or the c-plane) indicates that the surface is formed predominately (i.e., a vast majority) of faces of unit cell 400 that are substantially parallel to the particular plane. Furthermore, reference in this description to a "surface" or "face" of the ELR material being parallel to planes other than the a-plane, the b-plane, or the c-plane (e.g., an ab-plane as described below, etc.) indicates that the surface is formed from some mixture of faces of unit cell 400 that, in the aggregate macro sense, form a surface substantially parallel to such other planes.

Studies indicate that some ELR materials demonstrate an anisotropic (i.e., directional) dependence of the resistance phenomenon. In other words, resistance at a given temperature and current density depends upon a direction in relation to crystalline structure 100. For example, in their ELR state, some ELR materials can carry significantly more current, at extremely low resistance, in the direction of the a-axis and/or in the direction of the b-axis than such materials do in the direction of the c-axis. As would be appreciated, various ELR materials exhibit anisotropy in various performance phenomenon, including the resistance phenomenon, in directions other than, in addition to, or as combinations of those described above. For purposes of this description, reference to a material that tends to exhibit the resistance phenomenon (and similar language) in a first direction indicates that the material supports such phenomenon in the first direction; and reference to a material that tends not to exhibit the resistance phenomenon (and similar language) in a second direction indicates that the material does not support such phenomenon in the second direction or does so in a reduced manner from other directions.

With reference to FIG. 2, conventional understanding of known ELR materials has thus far failed to appreciate an aperture 210 formed within crystalline structure 100 by a plurality of aperture atoms 250 as being responsible for the resistance phenomenon. (See e.g., FIG. 4, where an aperture is not readily apparent in a depiction of single unit cell 400.) In some sense, aperture atoms 250 may be viewed as forming a discrete atomic "boundary" or "perimeter" around aperture 210. In some implementations of the invention and as illustrated in FIG. 2, aperture 210 appears between a first portion 220 and a second portion 230 of crystalline structure 100 although in some implementations of the invention, aperture 210 may appear in other portions of various other crystalline structures. Aperture 210 is illustrated in FIG. 2 based on depictions of atoms as simple "spheres;" it would be appreciated that such apertures are related to and shaped by, among other things, electrons and their associated electron densities (not otherwise illustrated) of various atoms in crystalline structure 100, including aperture atoms 250.

According to various aspects of the invention, aperture 210 facilitates propagation of electrical charge through crystalline structure 100 and when aperture 210 facilitates propagation of electrical charge through crystalline structure 100, ELR material operates in its ELR state. For purposes of this description, "propagates," "propagating," and/or "facilitating propagation" (along with their respective forms) generally refer to "conducts," "conducting" and/or "facilitating conduction" and their respective forms; "transports," "transporting" and/or "facilitating transport" and their respective forms; "guides," "guiding" and/or "facilitating guidance" and their respective forms; and/or "carry," "carrying" and/or "facilitating carrying" and their respective forms. For purposes of this description, electrical charge may include positive charge or negative charge, and/or pairs or other groupings of such charges; further, such charge may propagate through crystalline structure 100 in the form of one or more particles or in the form of one or more waves or wave packets.

In some implementations of the invention, propagation of electrical charge through crystalline structure 100 may be in a manner analogous to that of a waveguide. In some implementations of the invention, aperture 210 may be a waveguide with regard to propagating electrical charge through crystalline structure 100. Waveguides and their operation are generally well understood. In particular, walls surrounding an interior of the waveguide may correspond to the boundary or perimeter of aperture atoms 250 around aperture 210. One aspect relevant to an operation of a waveguide is its cross-section. At the atomic level, aperture 210 and/or its cross-section may change substantially with changes in temperature of the ELR material. For example, in some implementations of the invention, changes in temperature of the ELR material may cause changes in aperture 210, which in turn may cause the ELR material to transition between its ELR state to its non-ELR state. For example, as temperature of the ELR material increases, aperture 210 may restrict or impede propagation of electrical charge through crystalline structure 100 and the corresponding ELR material may transition from its ELR state to its non-ELR state. Likewise, for example, as temperature of the ELR material decreases, aperture 210 may facilitate (as opposed to restrict or impede) propagation of electrical charge through crystalline structure 100 and the corresponding ELR material may transition from its non-ELR state to its ELR state.

Apertures, such as aperture 210 in FIG. 2, exist in various ELR materials, such as, but not limited to, various ELR materials illustrated in FIG. 3 and FIGS. 5-9, etc., and described below. As illustrated, such apertures are intrinsic to the crystalline structure of some or all the ELR materials. Various forms, shapes, sizes, and numbers of apertures 210 exist in ELR materials depending on the precise configuration of the crystalline structure, composition of atoms, and arrangement of atoms within the crystalline structure of the ELR material as would be appreciated in light of this description.

Figure 3:
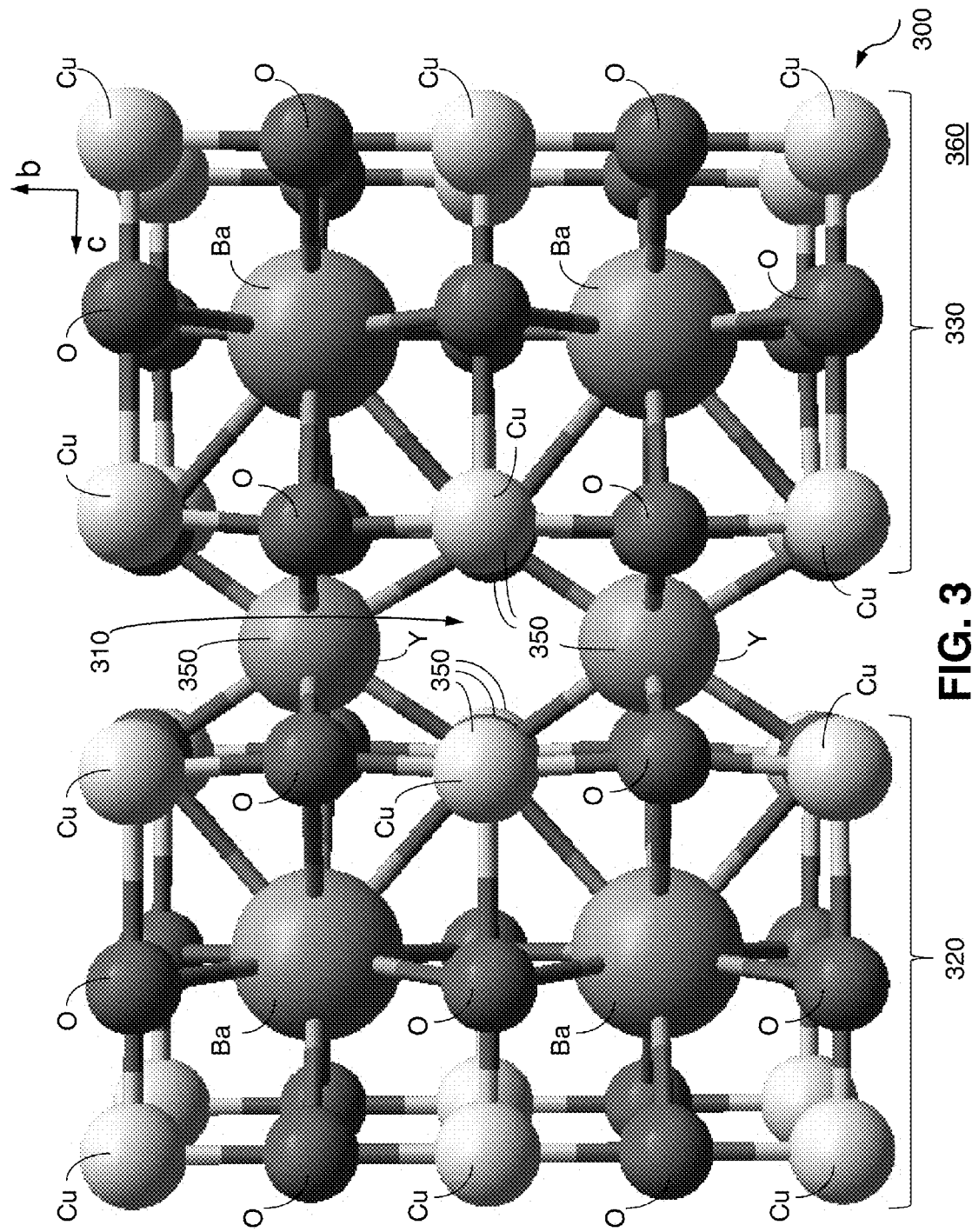
FIG. 3 illustrates a crystalline structure of an exemplary ELR material as viewed from a second perspective.
Figure 11:
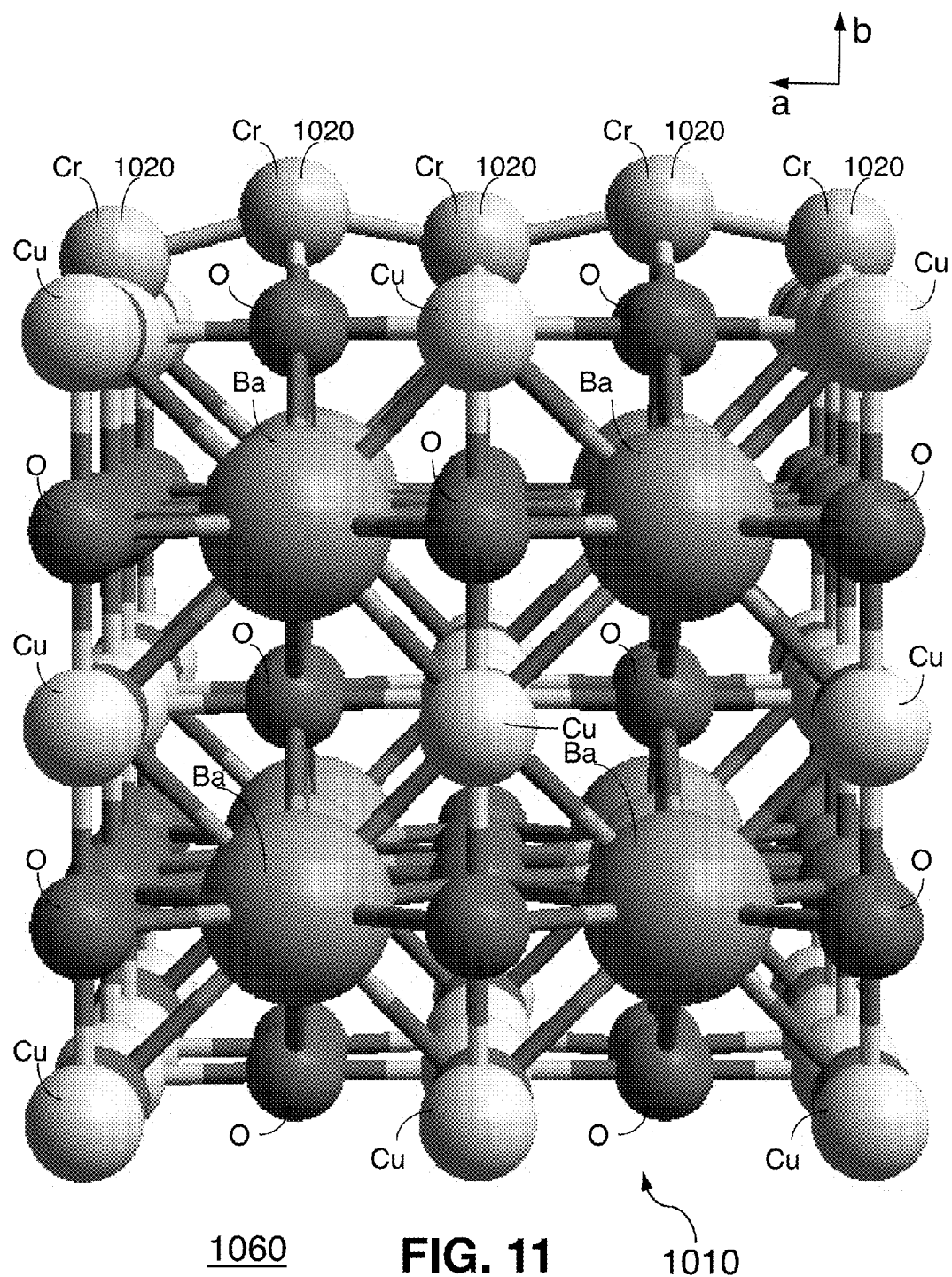
FIG. 11 illustrates a modified crystalline structure, according to various implementations of the invention, of an ELR material as viewed from a first perspective.
Figure 12:
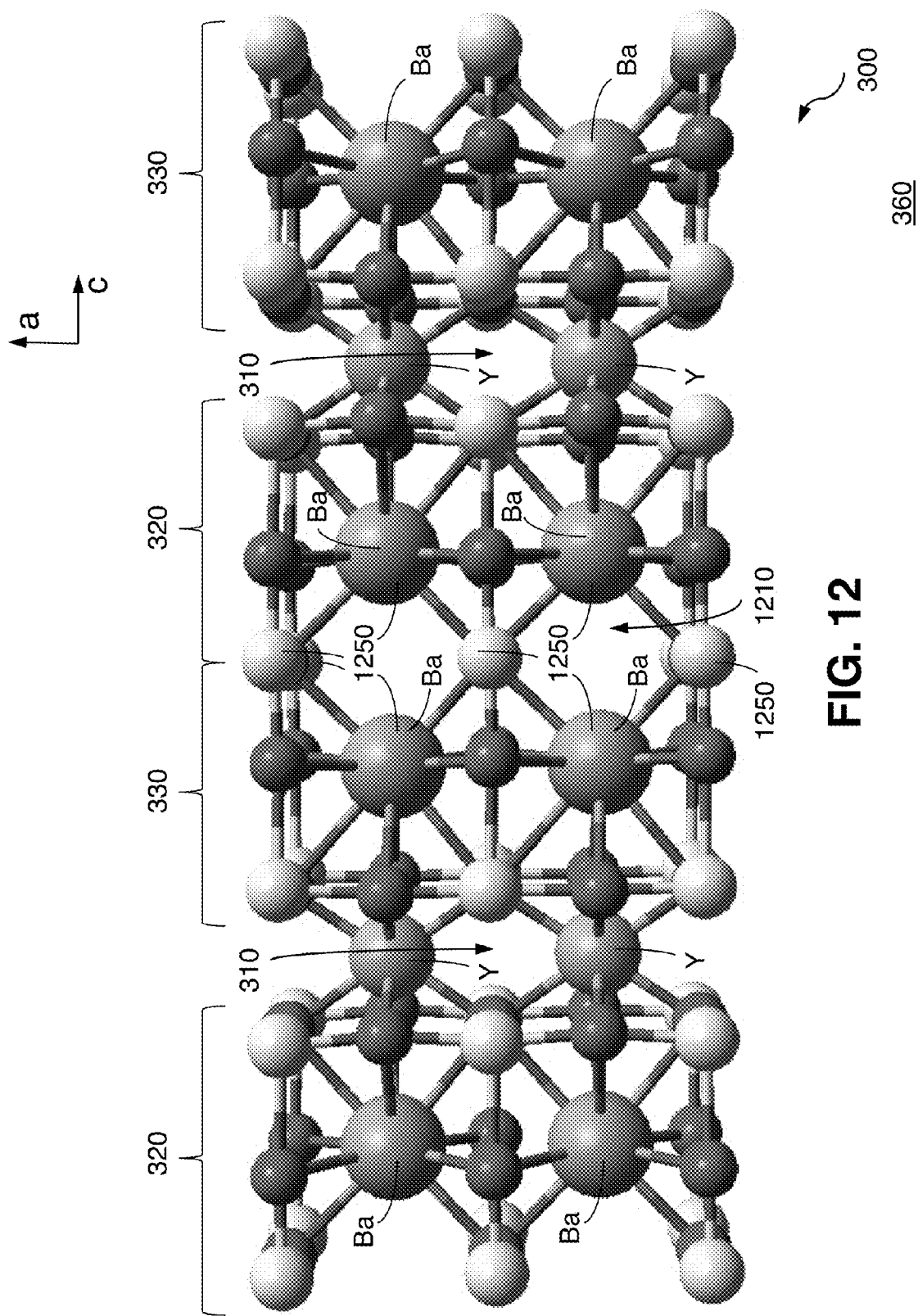
FIG. 12 illustrates a crystalline structure of an exemplary ELR material as viewed from a third perspective.

The presence and absence of apertures 210 that extend in the direction of various axes through the crystalline structures 100 of various ELR materials is consistent with the anisotropic dependence demonstrated by such ELR materials. For example, ELR material 360, which is illustrated in FIG. 3, FIG. 11, and FIG. 12, corresponds to YBCO-123, which exhibits the resistance phenomenon in the direction of the a-axis and the b-axis, but tends not to exhibit the resistance phenomenon in the direction of the c-axis. Consistent with the anisotropic dependence of the resistance phenomenon demonstrated by YBCO-123, FIG. 3 illustrates that apertures 310 extend through crystalline structure 300 in the direction of the a-axis; FIG. 12 illustrates that apertures 310 and apertures 1210 extend through crystalline structure 300 in the direction of the b-axis; and FIG. 11 illustrates that no suitable apertures extend through crystalline structure 300 in the direction of the c-axis.

Aperture 210 and/or its cross-section may be dependent upon various atomic characteristics of aperture atoms 250 and/or "non-aperture atoms" (i.e., atoms in crystalline structure 100 other than aperture atoms 250). Such atomic characteristics include, but are not limited to, atomic size, atomic weight, numbers of electrons, electron structure, number of bonds, types of bonds, differing bonds, multiple bonds, bond lengths, bond strengths, bond angles between aperture atoms, bond angles between aperture atoms and non-aperture atoms, and/or isotope number. Aperture atoms 250 and non-aperture atoms may be selected based on their corresponding atomic characteristics to optimize aperture 210 in terms of its size, shape, rigidity, and modes of vibration (in terms of amplitude, frequency, and direction) in relation to crystalline structure and/or atoms therein.

According to various implementations of the invention, changes in a physical structure of aperture 210, including changes to a shape and/or size of its cross-section and/or changes to the shape or size of aperture atoms 205, may have an impact on the resistance phenomenon. For example, as temperature of crystalline structure 100 increases, the cross-section of aperture 210 may be changed due to vibration of various atoms within crystalline structure 100 as well as changes in energy states, or occupancy thereof, of the atoms in crystalline structure 100. Physical flexure, tension or compression of crystalline structure 100 may also affect the positions of various atoms within crystalline structure 100 and therefore the cross-section of aperture 210. Magnetic fields imposed on crystalline structure 100 may also affect the positions of various atoms within crystalline structure 100 and therefore the cross-section of aperture 210.

Phonons correspond to various modes of vibration within crystalline structure 100. Phonons in crystalline structure 100 may interact with electrical charge propagated through crystalline structure 100. More particularly, phonons in crystalline structure 100 may cause atoms in crystalline structure 100 (e.g., aperture atoms 250, non-aperture atoms, etc.) to interact with electrical charge propagated through crystalline structure 100. Higher temperatures result in higher phonon amplitude and may result in increased interaction among phonons, atoms in crystalline structure 100, and such electrical charge. Various implementations of the invention may minimize, reduce, or otherwise modify such interaction among phonons, atoms in crystalline structure 100, and such electrical charge within crystalline structure 100.

FIG. 3 illustrates a crystalline structure 300 of an exemplary ELR material 360 from a second perspective. Exemplary ELR material 360 is a superconducting material commonly referred to as "YBCO" which, in certain formulations, has a transition temperature of approximately 90K. In particular, exemplary ELR material 360 depicted in FIG. 3 is YBCO-123. Crystalline structure 300 of exemplary ELR material 360 includes various atoms of yttrium ("Y"), barium ("Ba"), copper ("Cu") and oxygen ("O"). As illustrated in FIG. 3, an aperture 310 is formed within crystalline structure 300 by aperture atoms 350, namely atoms of yttrium, copper, and oxygen. A cross-sectional distance between the yttrium aperture atoms in aperture 310 is approximately 0.389 nm, a cross-sectional distance between the oxygen aperture atoms in aperture 310 is approximately 0.285 nm, and a cross-sectional distance between the copper aperture atoms in aperture 310 is approximately 0.339 nm.

FIG. 12 illustrates crystalline structure 300 of exemplary ELR material 360 from a third perspective. Similar to that described above with regard to FIG. 3, exemplary ELR material 360 is YBCO-123, and aperture 310 is formed within crystalline structure 300 by aperture atoms 350, namely atoms of yttrium, copper, and oxygen. In this orientation, a cross-sectional distance between the yttrium aperture atoms in aperture 310 is approximately 0.382 nm, a cross-sectional distance between the oxygen aperture atoms in aperture 310 is approximately 0.288 nm, and a cross-sectional distance between the copper aperture atoms in aperture 310 is approximately 0.339 nm. In this orientation, in addition to aperture 310, crystalline structure 300 of exemplary ELR material 360 includes an aperture 1210. Aperture 1210 occurs in the direction of the b-axis of crystalline structure 300. More particularly, aperture 1210 occurs between individual unit cells of exemplary ELR material 360 in crystalline structure 300. Aperture 1210 is formed within crystalline structure 300 by aperture atoms 1250, namely atoms of barium, copper and oxygen. A cross-sectional distance between the barium aperture atoms 1250 in aperture 1210 is approximately 0.430 nm, a cross-sectional distance between the oxygen aperture atoms 1250 in aperture 1210 is approximately 0.382 nm, and a cross-sectional distance between the copper aperture atoms 1250 in aperture 1210 is approximately 0.382 nm. In some implementations of the invention, aperture 1210 operates in a manner similar to that described herein with regard to aperture 310. For purposes of this description, aperture 310 in YBCO may be referred to as an "yttrium aperture," whereas aperture 1210 in YBCO may be referred to as a "barium aperture," based on the compositions of their respective aperture atoms 350, 1250.

Figure 5:
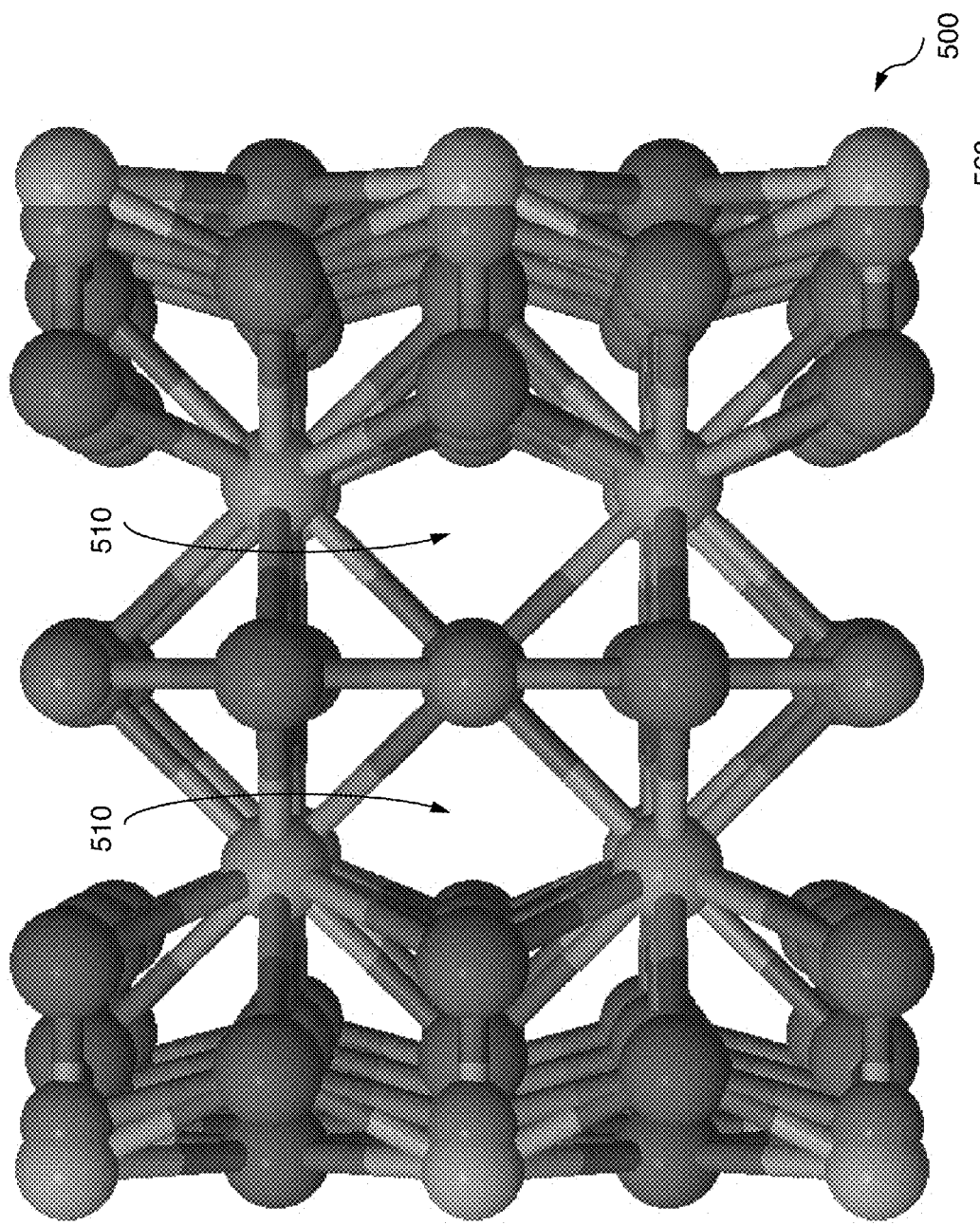
FIG. 5 illustrates a crystalline structure of an exemplary ELR material as viewed from a second perspective.

FIG. 5 illustrates a crystalline structure 500 of an exemplary ELR material 560 as viewed from the second perspective. Exemplary ELR material 560 is an HTS material commonly referred to as "HgBa$_2$CuO$_4$," which has a transition temperature of approximately 94K. Crystalline structure 500 of exemplary ELR material 560 includes various atoms of mercury ("Hg"), barium ("Ba"), copper ("Cu"), and oxygen ("O"). As illustrated in FIG. 5, an aperture 510 is formed within crystalline structure 500 by aperture atoms which comprise atoms of barium, copper, and oxygen.

Figure 6:
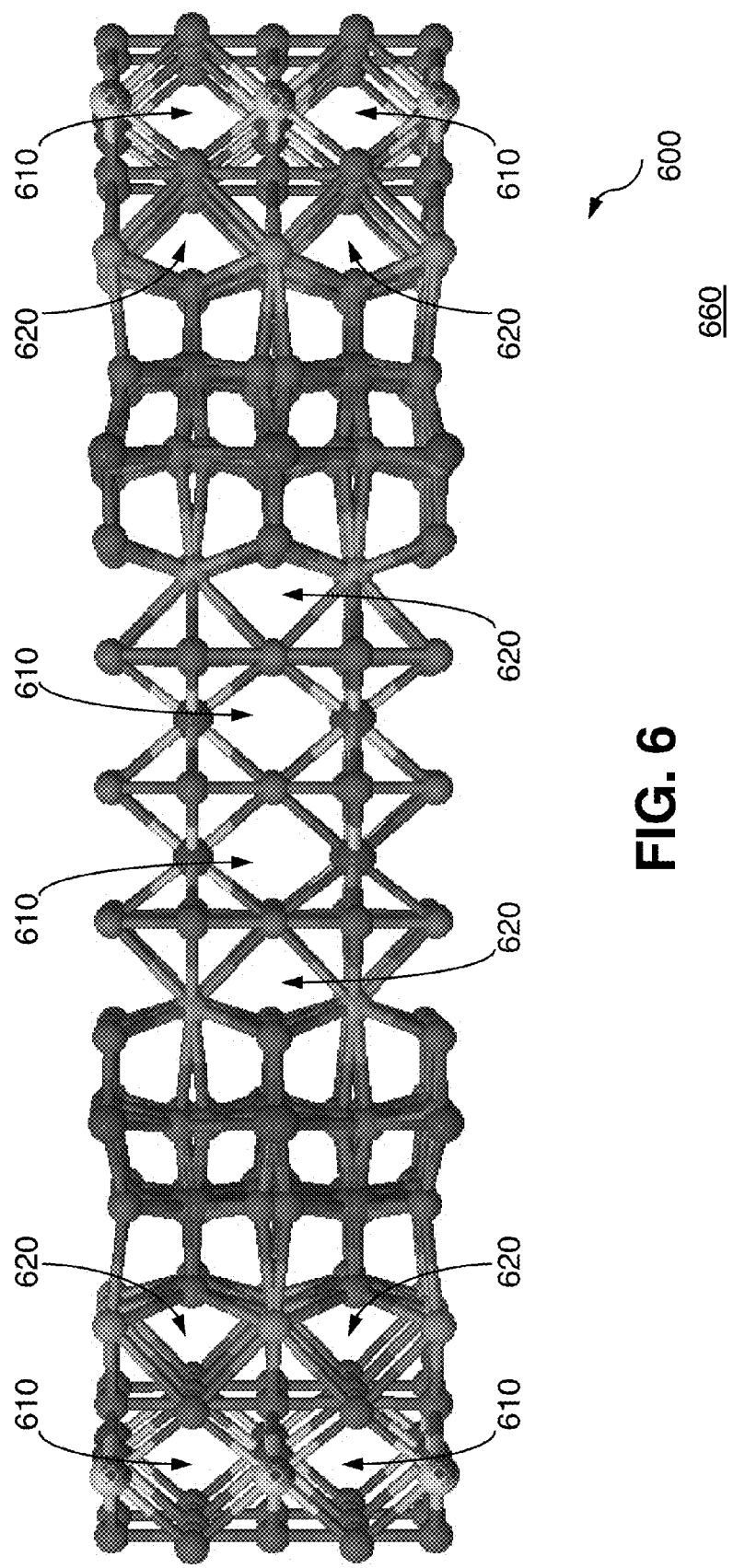
FIG. 6 illustrates a crystalline structure of an exemplary ELR material as viewed from a second perspective.

FIG. 6 illustrates a crystalline structure 600 of an exemplary ELR material 660 as viewed from the second perspective. Exemplary ELR material 660 is an HTS material commonly referred to as "Tl$_2$Ca$_2$Ba$_2$Cu$_3$O$_{10}$" which has a transition temperature of approximately 128K. Crystalline structure 600 of exemplary ELR material 660 includes various atoms of thallium ("Tl"), calcium ("Ca"), barium ("Ba"), copper ("Cu"), and oxygen ("O"). As illustrated in FIG. 6, an aperture 610 is formed within crystalline structure 600 by aperture atoms which comprise atoms of calcium, barium, copper and oxygen. As also illustrated in FIG. 6, a secondary aperture 620 may also be formed within crystalline structure 600 by secondary aperture atoms which comprise atoms of calcium, copper and oxygen. Secondary apertures 620 may operate in a manner similar to that of apertures 610.

Figure 7:
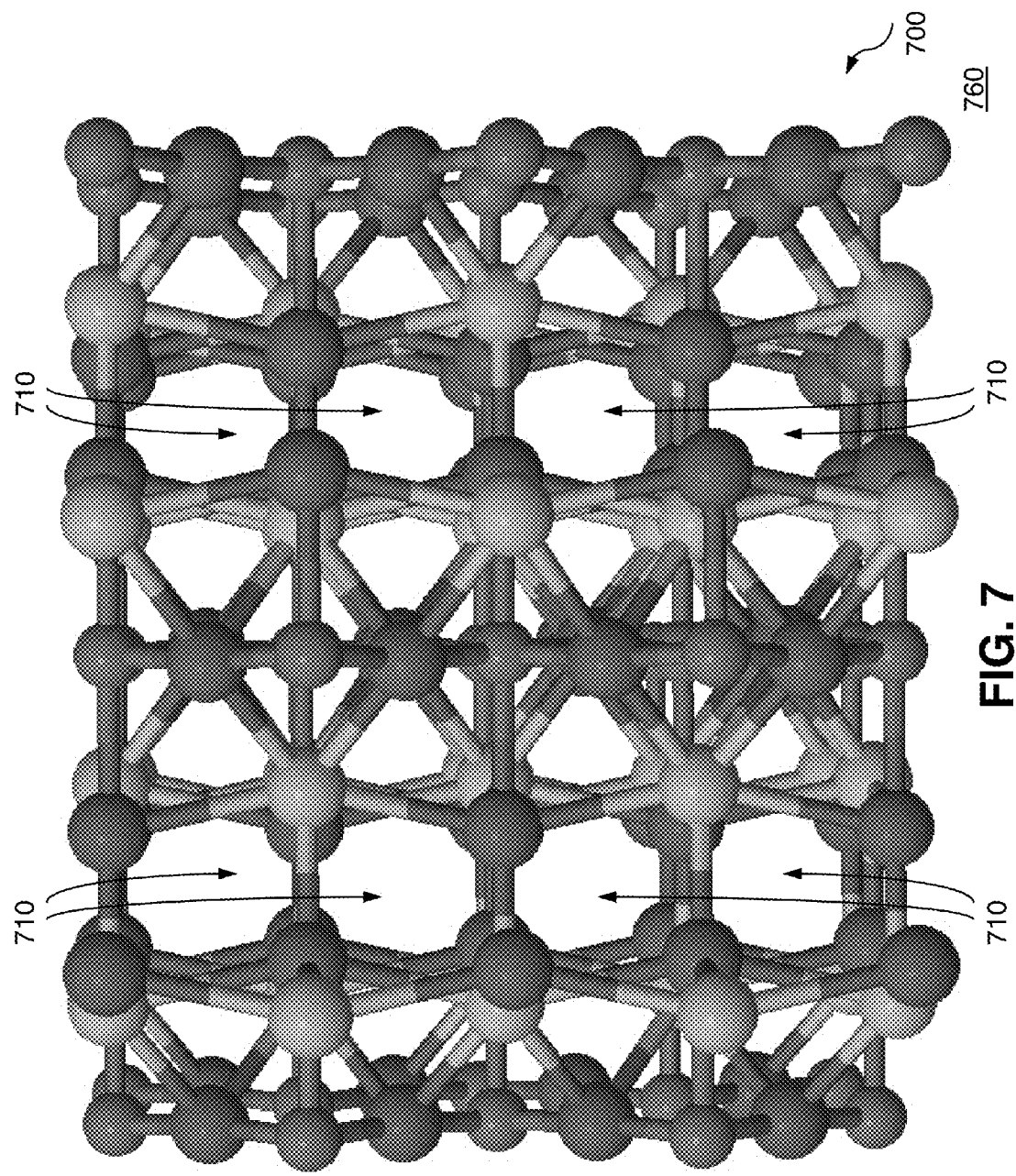
FIG. 7 illustrates a crystalline structure of an exemplary ELR material as viewed from a second perspective.

FIG. 7 illustrates a crystalline structure 700 of an exemplary ELR material 760 as viewed from the second perspective. Exemplary ELR material 760 is an HTS material commonly referred to as "La$_2$CuO$_4$" which has a transition temperature of approximately 39K. Crystalline structure 700 of exemplary ELR material 760 includes various atoms of lanthanum ("La"), copper ("Cu"), and oxygen ("O"). As illustrated in FIG. 7, an aperture 710 is formed within crystalline structure 700 by aperture atoms which comprise atoms of lanthanum and oxygen.

Figure 8:
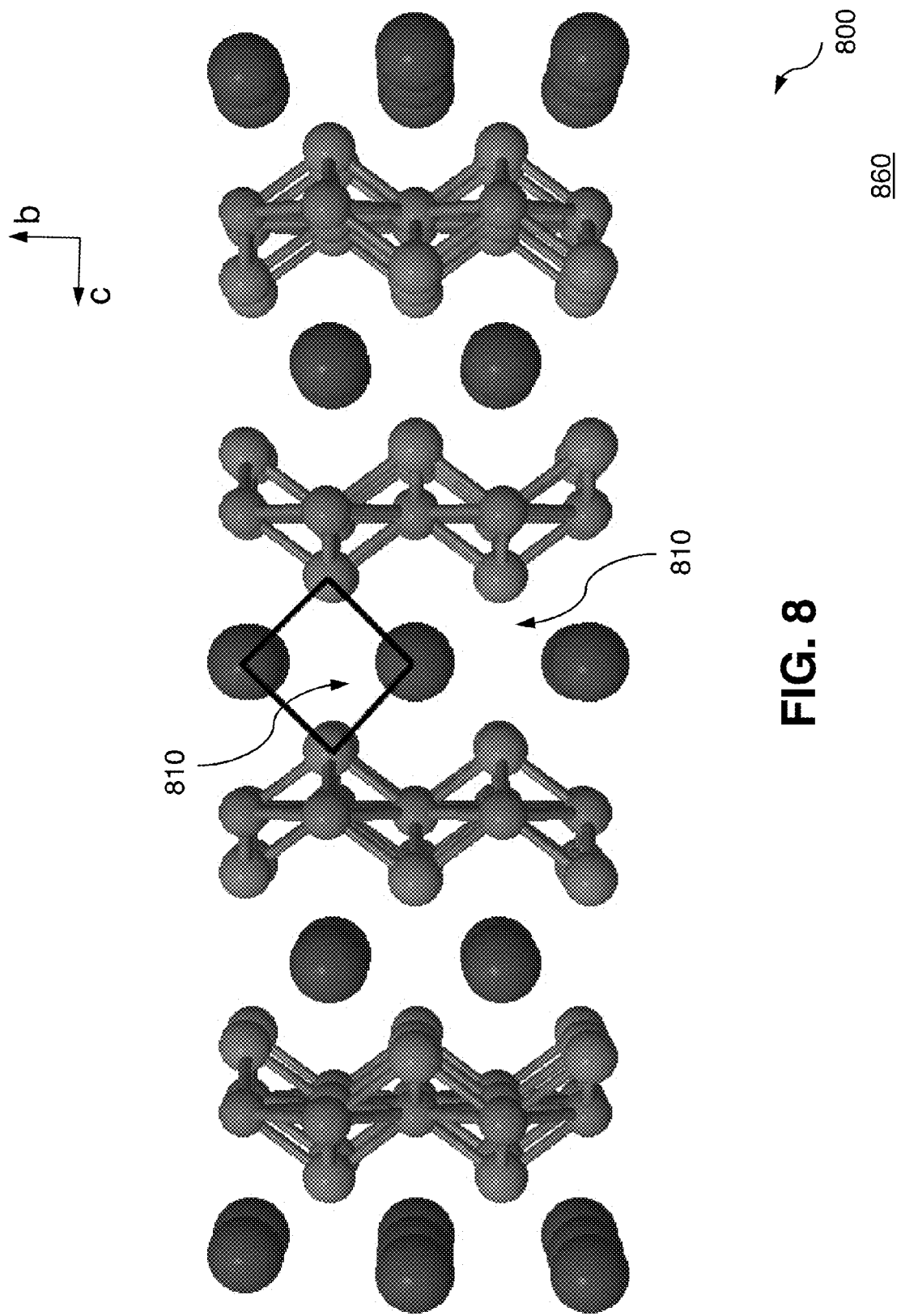
FIG. 8 illustrates a crystalline structure of an exemplary ELR material as viewed from a second perspective.

FIG. 8 illustrates a crystalline structure 800 of an exemplary ELR material 860 as viewed from the second perspective. Exemplary ELR material 860 is an HTS material commonly referred to as "As$_2$Ba$_{0.34}$Fe$_2$K$_{0.66}$" which has a transition temperature of approximately 38K. Exemplary ELR material 860 is representative of a family of ELR materials sometimes referred to as "iron pnictides." Crystalline structure 800 of exemplary ELR material 860 includes various atoms of arsenic ("As"), barium ("Ba"), iron ("Fe"), and potassium ("K"). As illustrated in FIG. 8, an aperture 810 is formed within crystalline structure 800 by aperture atoms which comprise atoms of potassium and arsenic.

Figure 9:
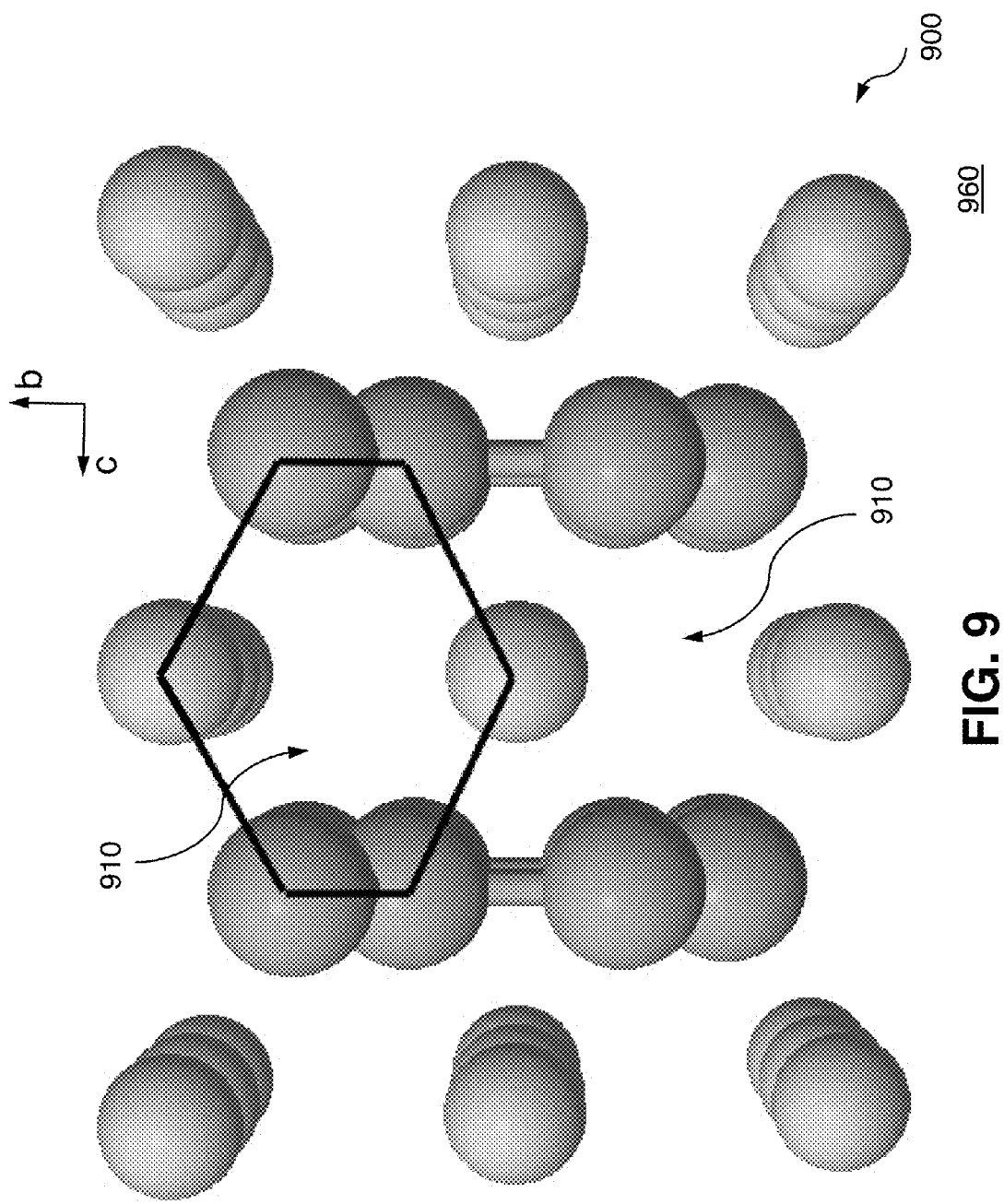
FIG. 9 illustrates a crystalline structure of an exemplary ELR material as viewed from a second perspective.

FIG. 9 illustrates a crystalline structure 900 of an exemplary ELR material 960 as viewed from the second perspective. Exemplary ELR material 960 is an HTS material commonly referred to as "MgB$_2$" which has a transition temperature of approximately 39K. Crystalline structure 900 of exemplary ELR material 960 includes various atoms of magnesium ("Mg") and boron ("B"). As illustrated in FIG. 9, an aperture 910 is formed within crystalline structure 900 by aperture atoms which comprise atoms of magnesium and boron.

The foregoing exemplary ELR materials illustrated in FIG. 3, FIGS. 5-9, and FIG. 12 each demonstrate the presence of various apertures within such materials. Various other ELR materials have similar apertures. Once attributed to the resistance phenomenon, apertures and their corresponding crystalline structures may be exploited to improve operating characteristics of existing ELR materials, to derive improved ELR materials from existing ELR materials, and/or to design and formulate new ELR materials. For convenience of description, ELR material 360 (and its attendant characteristics and structures) henceforth generally refers to various ELR materials, including, but not limited to, ELR material 560, ELR material 660, ELR material 760, and other ELR materials illustrated in the drawings, not just that ELR material illustrated and described with reference to FIG. 3.

According to various implementations of the invention, the crystalline structure of various known ELR materials may be modified such that the modified ELR material operates with improved operating characteristics over the known ELR material. In some implementations of the invention, this may also be accomplished, for example, by layering a material over crystalline structure 100 such that atoms of the material span aperture 210 by forming one or more bonds between first portion 220 and second portion 230 as would be appreciated. This particular modification of layering a material over crystalline structure 100 is described in further detail below in connection with various experimental test results.

Figure 10:
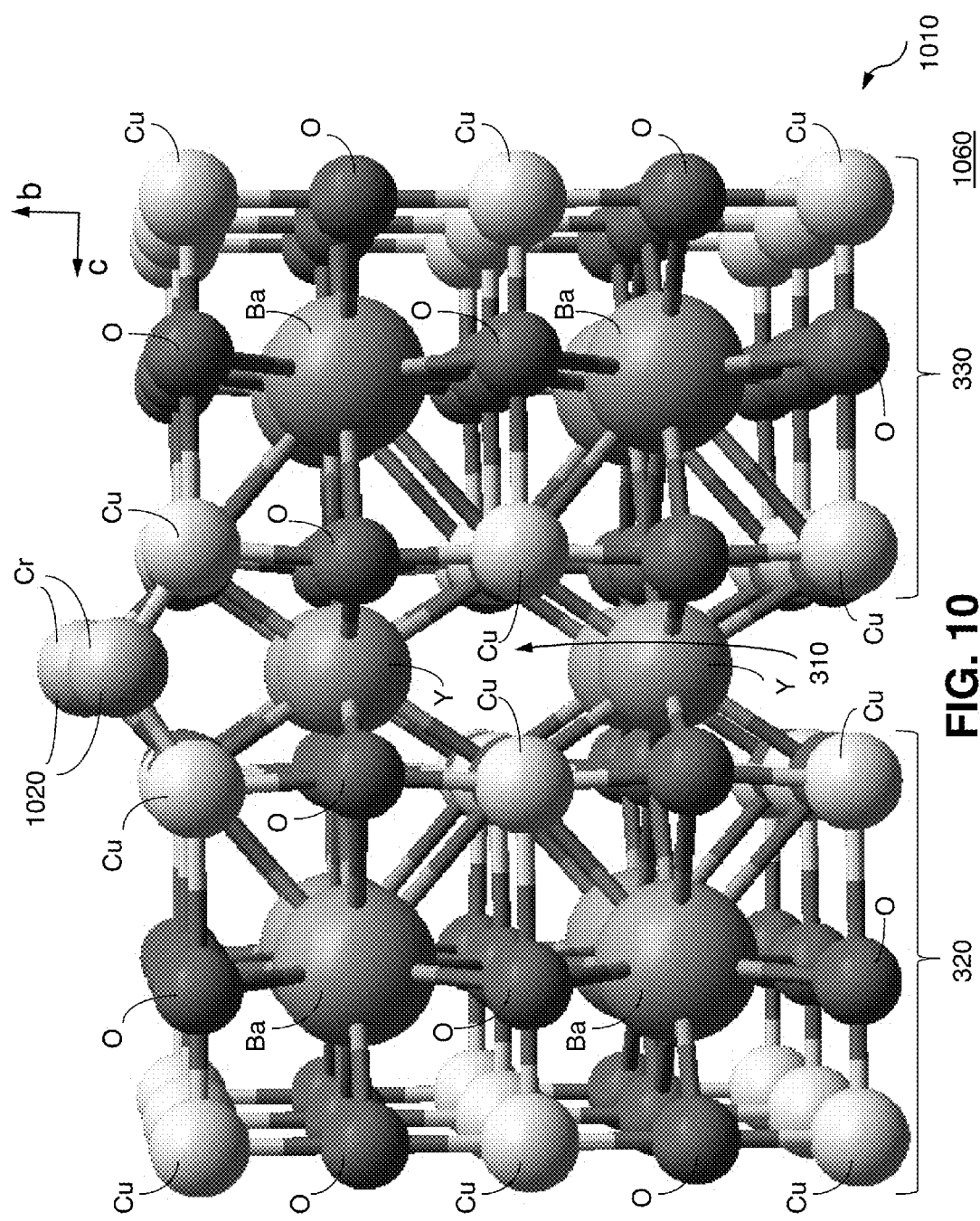
FIG. 10 illustrates a modified crystalline structure, according to various implementations of the invention, of an ELR material as viewed from a second perspective.

FIG. 10 illustrates a modified crystalline structure 1010 of a modified ELR material 1060 as viewed from the second perspective in accordance with various implementations of the invention. FIG. 11 illustrates modified crystalline structure 1010 of modified ELR material 1060 as viewed from the first perspective in accordance with various implementations of the invention. ELR material 360 (e.g., for example, as illustrated in FIG. 3 and elsewhere) is modified to form modified ELR material 1060. Modifying material 1020 forms bonds with atoms of crystalline structure 300 (of FIG. 3) of ELR material 360 to form modified crystalline structure 1010 of modified ELR material 1060 as illustrated in FIG. 11. As illustrated, modifying material 1020 bridges a gap between first portion 320 and second portion 330 thereby changing, among other things, vibration characteristics of modified crystalline structure 1010, particularly in the region of aperture 310. In doing so, modifying material 1020 maintains aperture 310 at higher temperatures. Accordingly, in some implementations of the invention, modifying material 1020 is specifically selected to fit in and bond with appropriate atoms in crystalline structure 300.

In some implementations of the invention and as illustrated in FIG. 10, modifying material 1020 is bonded to a face of crystalline structure 300 that is parallel to the b-plane (e.g., an "a-c" face). In such implementations where modifying material 1020 is bonded to the "a-c" face, apertures 310 extending in the direction of the a-axis and with cross-sections lying in the a-plane are maintained. In such implementations, charge carriers flow through aperture 310 in the direction of the a-axis.

In some implementations of the invention, modifying material 1020 is bonded to a face of crystalline structure 300 that is parallel to the a-plane (e.g., a "b-c" face). In such implementations where modifying material 1020 is bonded to the "b-c" face, apertures 310 extending in the direction of the b-axis and with cross-sections lying in the b-plane are maintained. In such implementations, charge carriers flow through aperture 310 in the direction of the b-axis.

Various implementations of the invention include layering a particular surface of ELR material 360 with modifying material 1020 (i.e., modifying the particular surface of ELR material 360 with the modifying material 1020). As would be recognized from this description, reference to "modifying a surface" of ELR material 360, ultimately includes modifying a face (and in some cases more that one face) of one or more unit cells 400 of ELR material 360. In other words, modifying material 1020 actually bonds to atoms in unit cell 400 of ELR material 360.

For example, modifying a surface of ELR material 360 parallel to the a-plane includes modifying "b-c" faces of unit cells 400. Likewise, modifying a surface of ELR material 360 parallel to the b-plane includes modifying "a-c" faces of unit cells 400. In some implementations of the invention, modifying material 1020 is bonded to a surface of ELR material 360 that is substantially parallel to any plane that is parallel to the c-axis. For purposes of this description, planes that are parallel to the c-axis are referred to generally as ab-planes, and as would be appreciated, include the a-plane and the b-plane. As would be appreciated, a surface of ELR material 360 parallel to the ab-plane is formed from some mixture of "a-c" faces and "b-c" faces of unit cells 400. In such implementations where modifying material 1020 is bonded to a surface parallel to an ab-plane, apertures 310 extending in the direction of the a-axis and apertures 310 extending in the direction of the b-axis are maintained.

In some implementations of the invention, modifying material 1020 may be a conductive material. In some implementations of the invention, modifying material 1020 may a material with high oxygen affinity (i.e., a material that bonds easily with oxygen) ("oxygen bonding material"). In some implementations of the invention, modifying material 1020 may be a conductive material that bonds easily with oxygen ("oxygen bonding conductive materials"). Such oxygen bonding conductive materials may include, but are not limited to: chromium, copper, bismuth, cobalt, vanadium, and titanium. Such oxygen bonding conductive materials may also include, but are not limited to: rhodium or beryllium. Other modifying materials may include gallium or selenium. Other modifying materials may include silver. Still other modifying materials may be used.

In some implementations of the invention, oxides of modifying material 1020 may form during various operations associated with modifying ELR material 360 with modifying material 1020. Accordingly, in some implementations of the invention, modifying material 1020 may include a substantially pure form of modifying material 1020 and/or various oxides of modifying material 1020. In other words, in some implementations of the invention, ELR material 360 is modified with modifying material 1020 and/or various oxides of modifying material 1020. By way of example, but not limitation, in some implementations of the invention, modifying material 1020 may comprise chromium and/or chromium oxide ($Cr_xO_y$).

In some implementations of the invention, ELR material 360 may be YBCO and modifying material 1020 may be an oxygen bonding conductive material. In some implementations of the invention, ELR material 360 may be YBCO and modifying material 1020 may be selected from the group including, but not limited to: chromium, copper, bismuth, cobalt, vanadium, titanium, rhodium, or beryllium. In some implementations of the invention, ELR material 360 may be YBCO and modifying material 1020 may be selected from the group consisting of: chromium, copper, bismuth, cobalt, vanadium, titanium, rhodium, and beryllium. In some implementations of the invention, ELR material 360 may be YBCO and modifying material 1020 may be another modifying material.

In some implementations of the invention, various other combinations of mixed-valence copper-oxide perovskite materials and oxygen bonding conductive materials may be used. For example, in some implementations of the invention, ELR material 360 corresponds to a mixed-valence copper-oxide perovskite material commonly referred to as "BSCCO." BSCCO includes various atoms of bismuth ("Bi"), strontium ("Sr"), calcium ("Ca"), copper ("Cu") and oxygen ("O"). By itself, BSCCO has a transition temperature of approximately 100K. In some implementations of the invention, ELR material 360 may be BSCCO and modifying material 1020 may be an oxygen bonding conductive material. In some implementations of the invention, ELR material 360 may be BSCCO and modifying material 1020 may be selected from the group including, but not limited to: chromium, copper, bismuth, cobalt, vanadium, titanium, rhodium, or beryllium. In some implementations of the invention, ELR material 360 may be BSCCO and modifying material 1020 may be selected from the group consisting of:

chromium, copper, bismuth, cobalt, vanadium, titanium, rhodium, and beryllium. In some implementations of the invention, ELR material 360 may be BSCCO and modifying material 1020 may be another modifying material.

In some implementations of the invention, various combinations of other ELR materials and modifying materials may be used. For example, in some implementations of the invention, ELR material 360 corresponds to an iron pnictide material. Iron pnictides, by themselves, have transition temperatures that range from approximately 25-60K. In some implementations of the invention, ELR material 360 may be an iron pnictide and modifying material 1020 may be an oxygen bonding conductive material. In some implementations of the invention, ELR material 360 may be an iron pnictide and modifying material 1020 may be selected from the group including, but not limited to: chromium, copper, bismuth, cobalt, vanadium, titanium, rhodium, or beryllium. In some implementations of the invention, ELR material 360 may be an iron pnictide and modifying material 1020 may be selected from the group consisting of: chromium, copper, bismuth, cobalt, vanadium, titanium, rhodium, and beryllium. In some implementations of the invention, ELR material 360 may be an iron pnictide and modifying material 1020 may be another modifying material.

In some implementations of the invention, various combinations of other ELR materials and modifying materials may be used. For example, in some implementations of the invention, ELR material 360 may be magnesium diboride ("MgB$_2$"). By itself, magnesium diboride has a transition temperature of approximately 39K. In some implementations of the invention, ELR material 360 may be magnesium diboride and modifying material 1020 may be an oxygen bonding conductive material. In some implementations of the invention, ELR material 360 may be magnesium diboride and modifying material 1020 may be selected from the group including, but not limited to: chromium, copper, bismuth, cobalt, vanadium, titanium, rhodium, or beryllium. In some implementations of the invention, ELR material 360 may be magnesium diboride and modifying material 1020 may be selected from the group consisting of: chromium, copper, bismuth, cobalt, vanadium, titanium, rhodium, and beryllium. In some implementations of the invention, ELR material 360 may be magnesium diboride and modifying material 1020 may be another modifying material.

In some implementations of the invention, modifying material 1020 may be layered onto a sample of ELR material 360 using various techniques for layering one composition onto another composition as would be appreciated. For example, such layering techniques include, but are not limited to, pulsed laser deposition, evaporation including coevaporation, e-beam evaporation and activated reactive evaporation, sputtering including magnetron sputtering, ion beam sputtering and ion assisted sputtering, cathodic arc deposition, CVD, organometallic CVD, plasma enhanced CVD, molecular beam epitaxy, a sol-gel process, liquid phase epitaxy and/or other layering techniques. In some implementations of the invention, ELR material 360 may be layered onto a sample of modifying material 1020 using various techniques for layering one composition onto another composition. In some implementations of the invention, a single atomic layer of modifying material 1020 (i.e., a layer of modifying material 1020 having a thickness substantially equal to a single atom or molecule of modifying material 1020) may be layered onto a sample of ELR material 360. In some implementations of the invention, a single unit layer of the modifying material (i.e., a layer of the modifying material having a thickness substantially equal to a single unit (e.g., atom, molecule, crystal, or other unit) of the modifying material) may be layered onto a sample of the ELR material. In some implementations of the invention, the ELR material may be layered onto a single unit layer of the modifying material. In some implementations of the invention, two or more unit layers of the modifying material may be layered onto the ELR material. In some implementations of the invention, the ELR material may be layered onto two or more unit layers of the modifying material.

In some implementations of the invention, modifying ELR material 360 with modifying material 1020 maintains aperture 310 within modified ELR material 1060 at temperatures at, about, or above that of the boiling point of nitrogen. In some implementations of the invention, aperture 310 is maintained at temperatures at, about, or above that the boiling point of carbon dioxide. In some implementations of the invention, aperture 310 is maintained at temperatures at, about, or above that of the boiling point of ammonia. In some implementations of the invention, aperture 310 is maintained at temperatures at, about, or above that of the boiling point of various formulations of Freon. In some implementations of the invention, aperture 310 is maintained at temperatures at, about, or above that of the melting point of water. In some implementations of the invention, aperture 310 is maintained at temperatures at, about, or above that of the melting point of a solution of water and antifreeze. In some implementations of the invention, aperture 310 is maintained at temperatures at, about, or above that of room temperature (e.g., 21° C.). In some implementations of the invention, aperture 310 is maintained at temperatures at, about, or above a temperature selected from one of the following set of temperatures: 150K, 160K, 170K, 180K, 190K, 200K, 210K, 220K, 230K, 240K, 250K, 260K, 270K, 280K, 290K, 300K, 310K. In some implementations of the invention, aperture 310 is maintained at temperatures within the range of 150K to 315K.

Figure 14A:
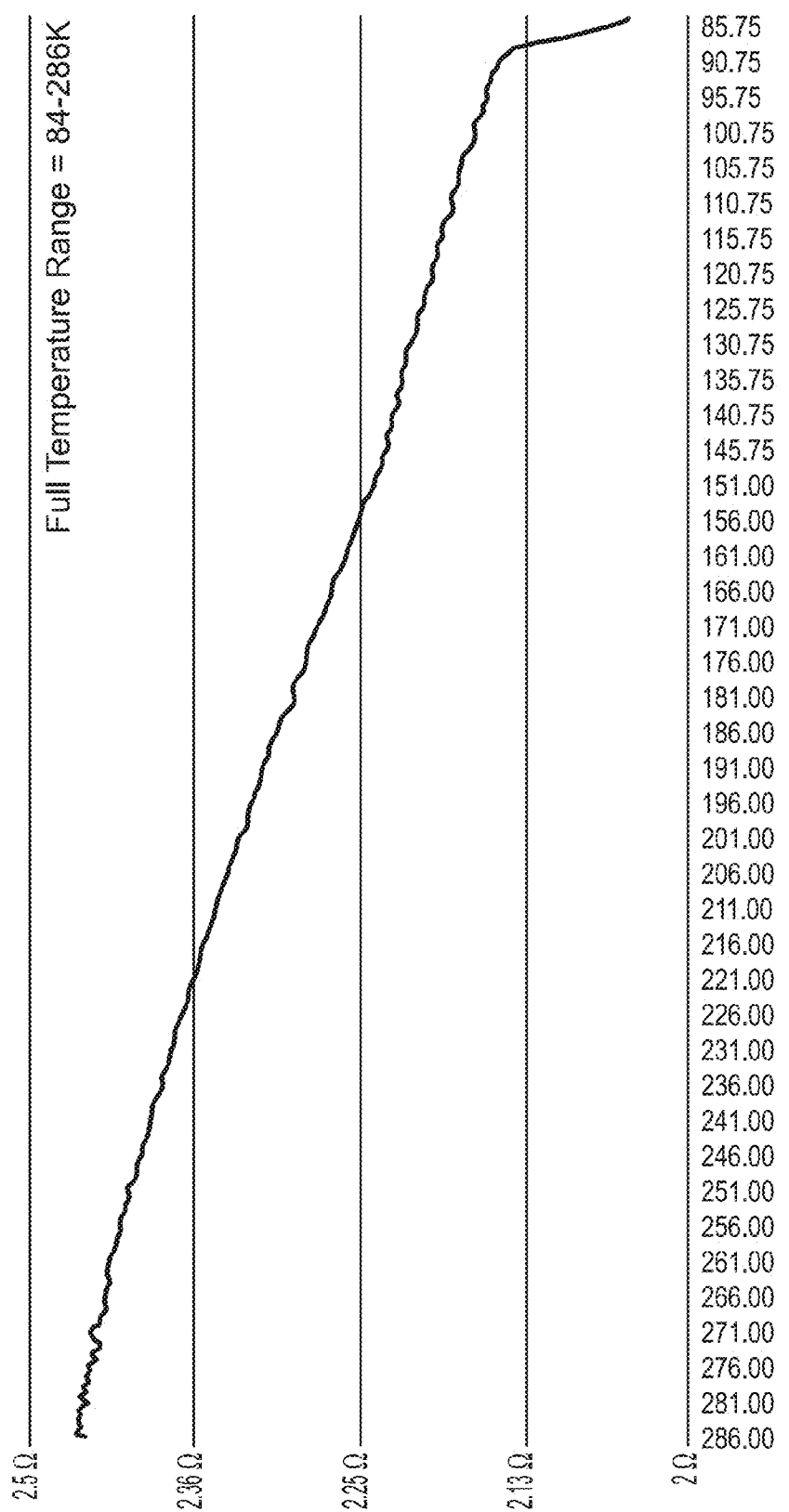
FIGS. 14A-14G illustrate test results demonstrating various operational characteristics of a modified ELR material.
Figure 14B:
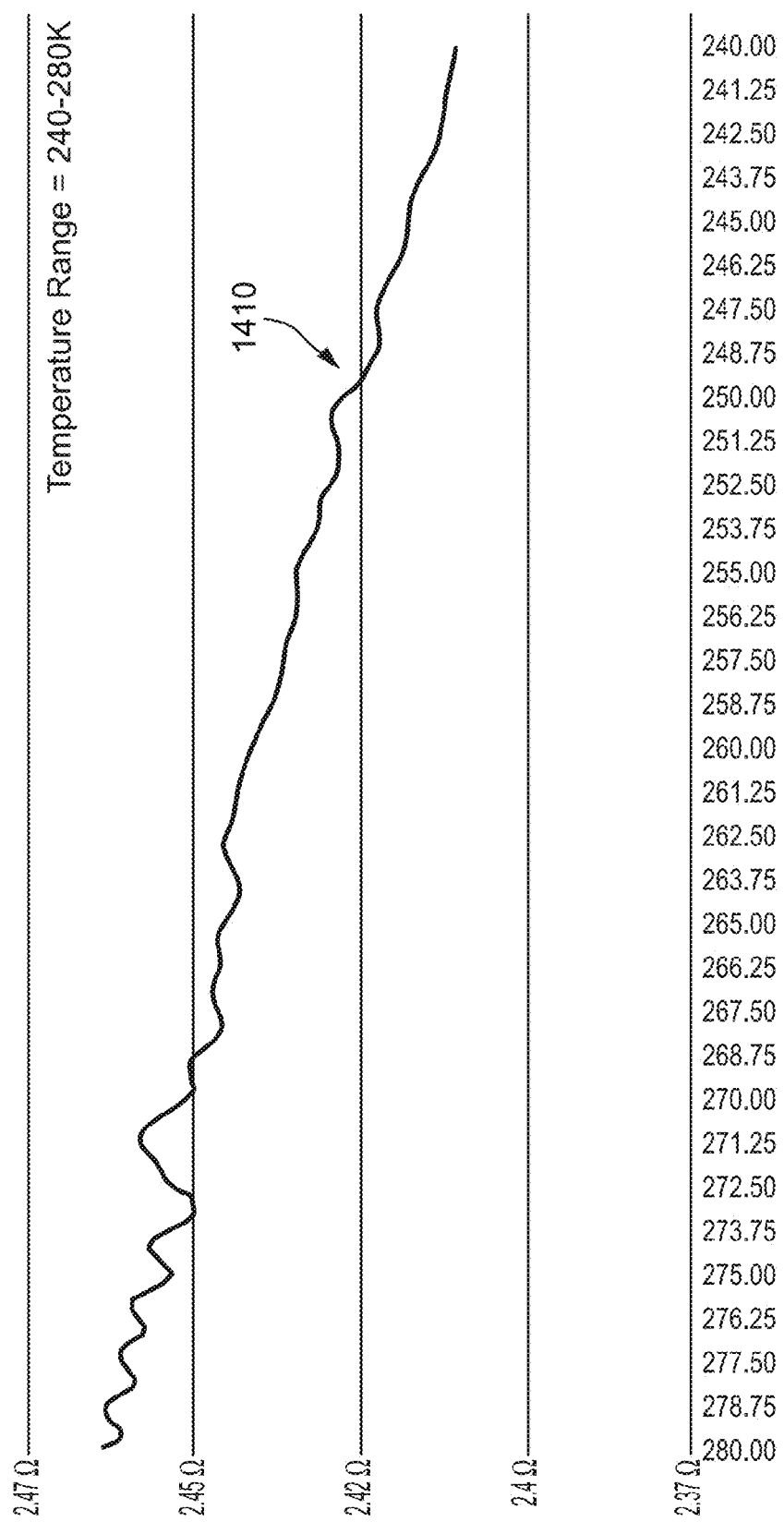
Figure 14C:
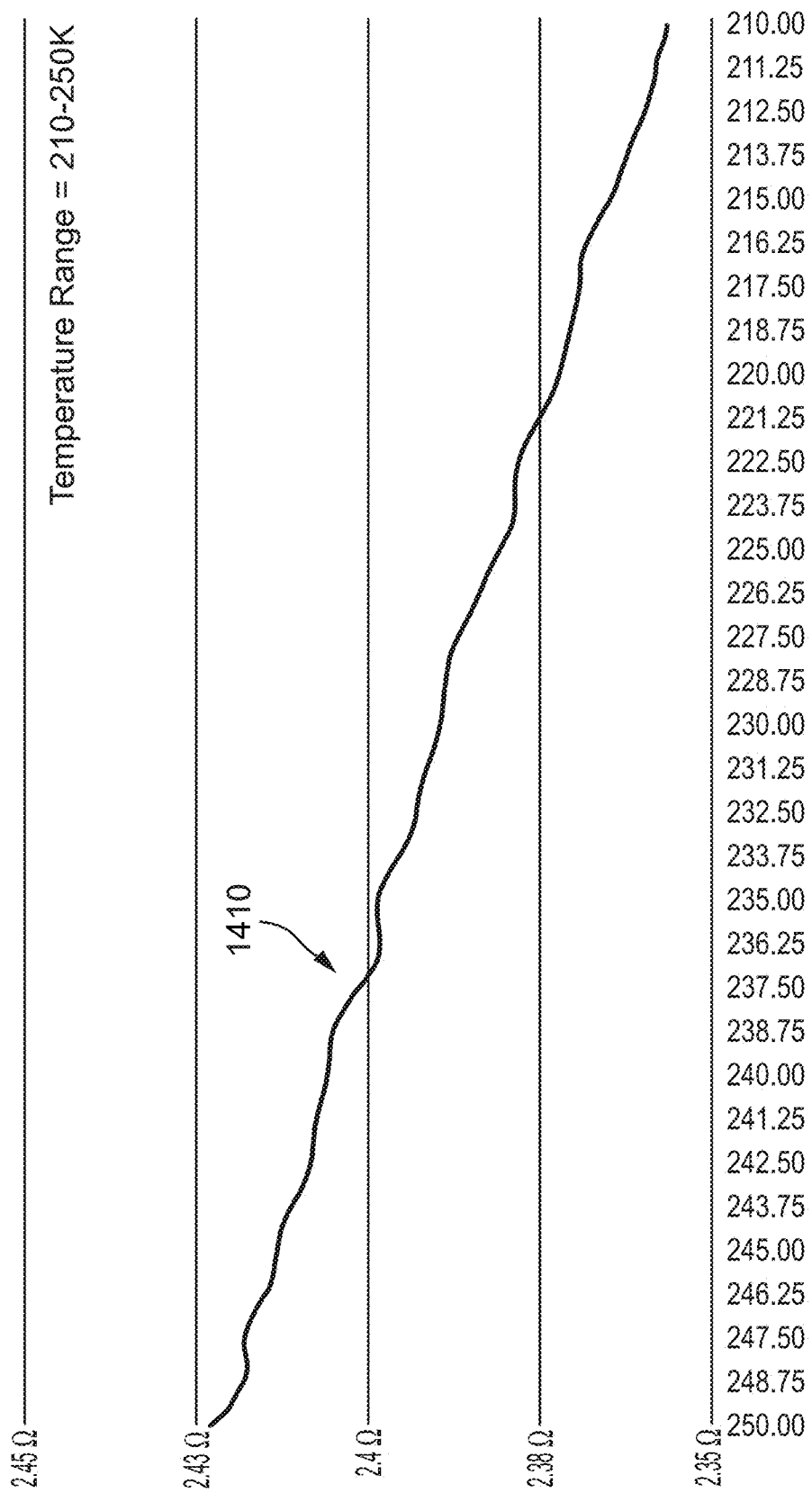
Figure 14D:
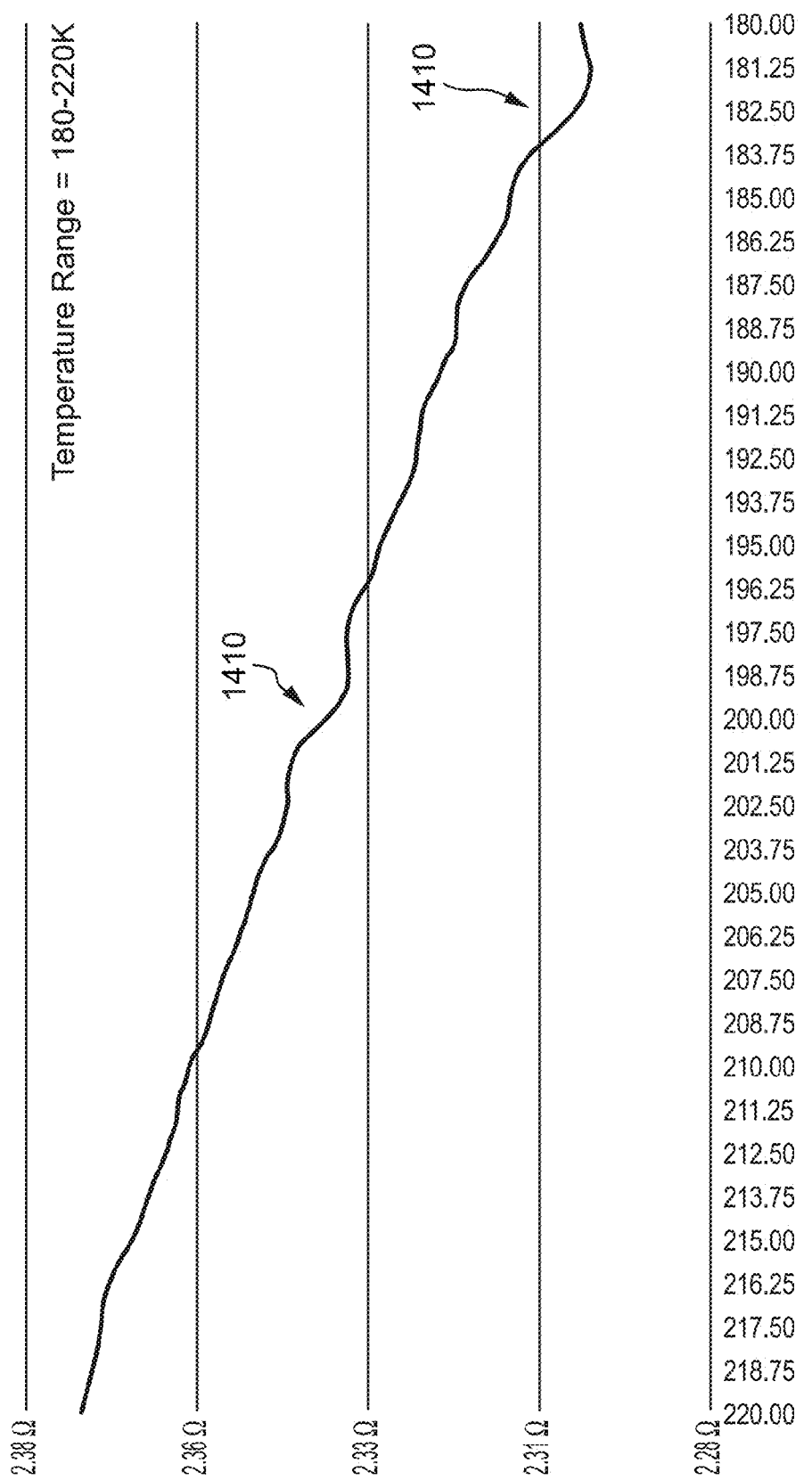
Figure 14E:
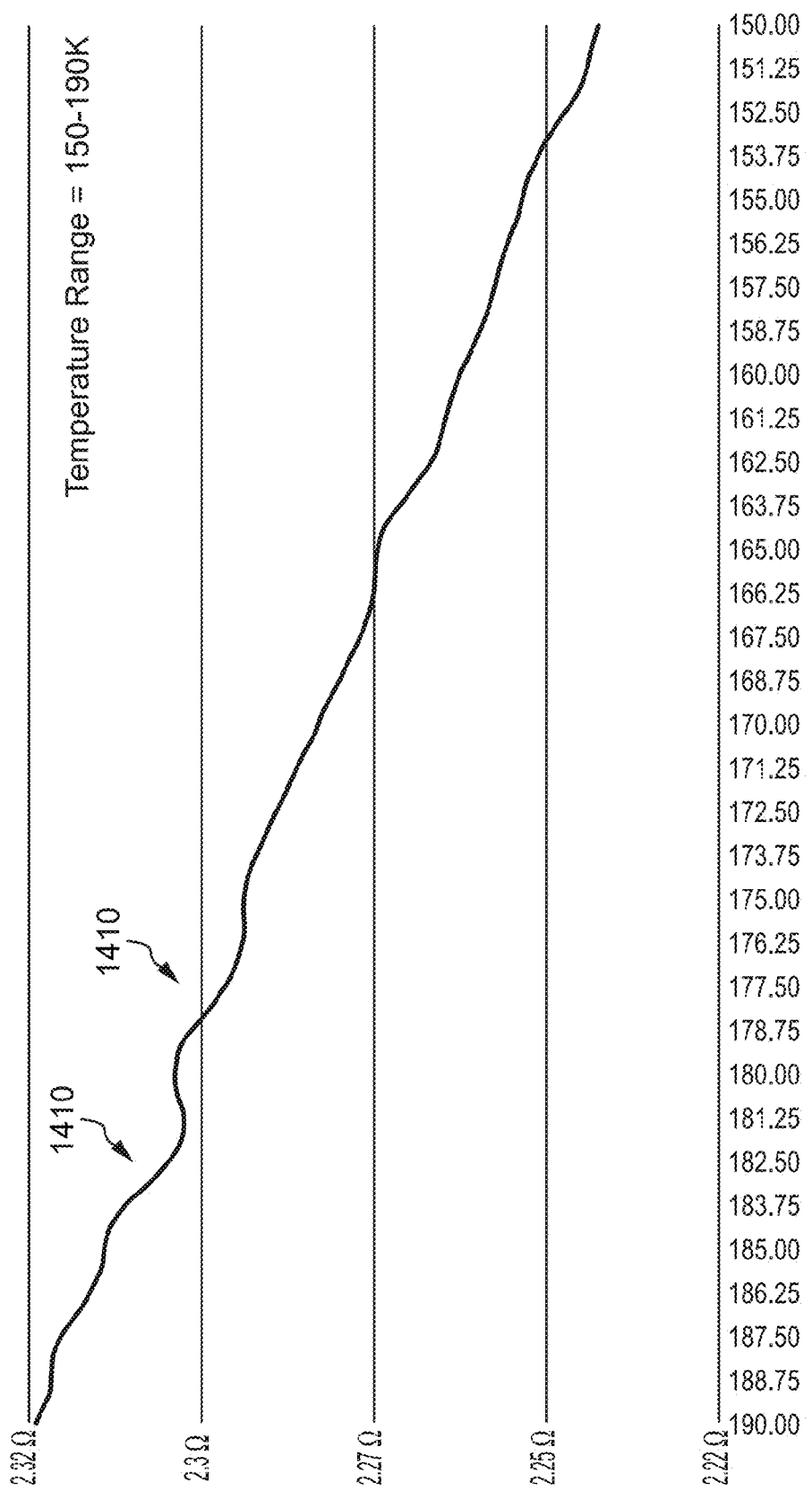
Figure 14F:
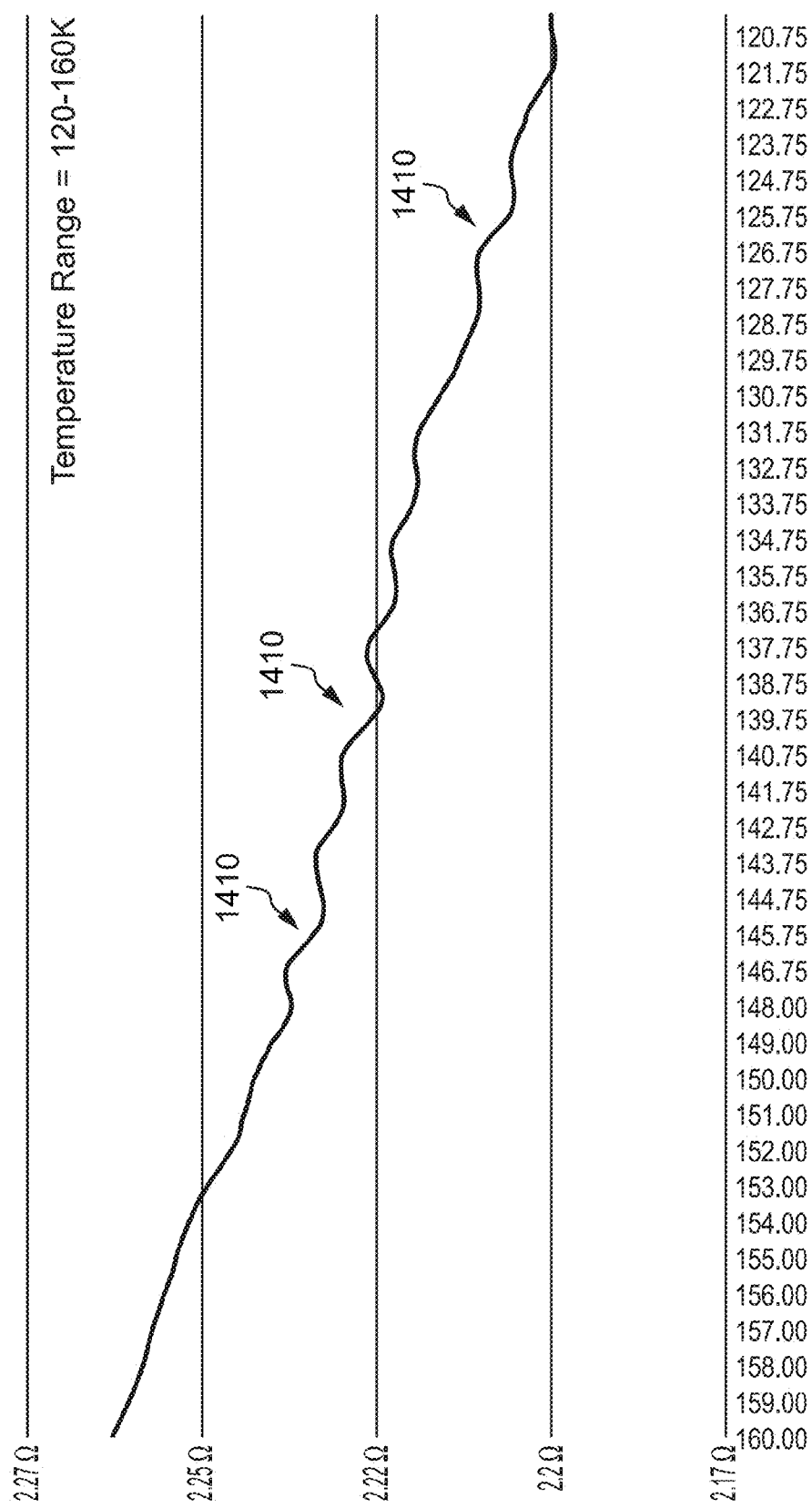
Figure 14G:
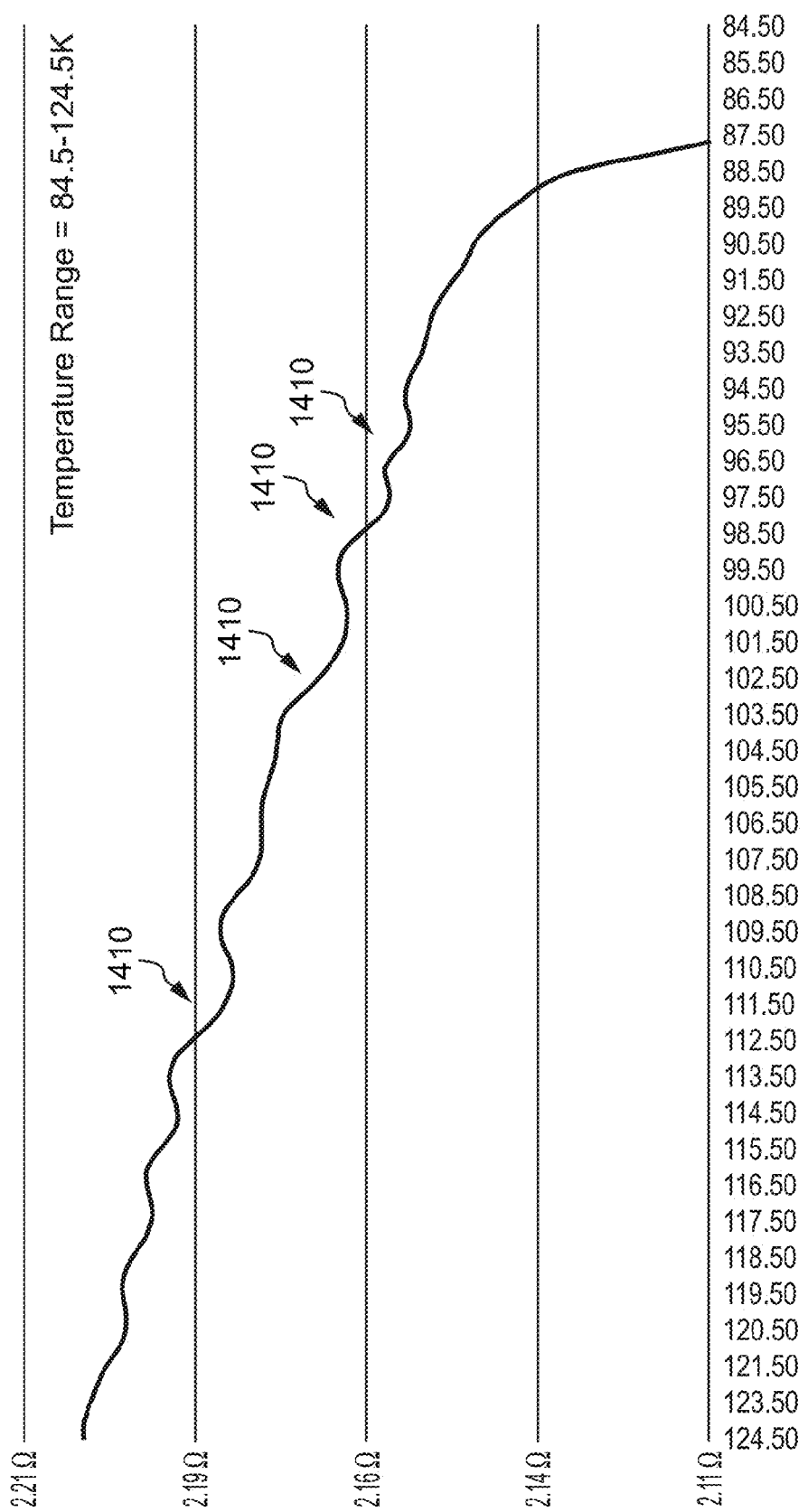

FIGS. 14A-14G illustrate test results 1400 obtained as described above. Test results 1400 include a plot of resistance of modified ELR material 1060 as a function of temperature (in K). More particularly, test results 1400 correspond to modified ELR material 1060 where modifying material 1020 corresponds to chromium and where ELR material 360 corresponds to YBCO. FIG. 14A includes test results 1400 over a full range of temperature over which resistance of modified ELR material 1060 was measured, namely 84K to 286K. In order to provide further detail, test results 1400 were broken into various temperature ranges and illustrated. In particular, FIG. 14B illustrates those test results 1400 within a temperature range from 240K to 280K; FIG. 14C illustrates those test results 1400 within a temperature range from 210K to 250K; FIG. 14D illustrates those test results 1400 within a temperature range from 180K to 220K; FIG. 14E illustrates those test results 1400 within a temperature range from 150K to 190K; FIG. 14F illustrates those test results 1400 within a temperature range from 120K to 160K; and FIG. 14G illustrates those test results 1400 within a temperature range from 84.5K to 124.5K.

Test results 1400 demonstrate that various portions of modified ELR material 1060 operate in an ELR state at higher temperatures relative to ELR material 360. Six sample analysis test runs were made. For each sample analysis test run, modified ELR material 1060 was slowly cooled from approximately 286K to 83K. While being cooled, the current source applied +60 nA and −60 nA of current in a delta mode configuration in order to reduce impact of any DC offsets and/or thermocouple effects. At regular time intervals, the voltage across modified ELR material 1060 was measured by the voltmeter. For each sample analysis test run, the time series of voltage measurements were filtered using a 512-point fast Fourier transform ("FFT"). All but the lowest 44 frequencies from the FFT were eliminated from the data and the filtered data was returned to the time domain. The filtered data from each sample analysis test run were then merged together to produce test results 1400. More particularly, all the resistance measurements from the six sample analysis test runs were organized into a series of temperature ranges (e.g., 80K-80.25K, 80.25K to 80.50, 80.5K to 80.75K, etc.) in a manner referred to as "binning." Then the resistance measurements in each temperature range were averaged together to provide an average resistance measurement for each temperature range. These average resistance measurements form test results 1400.

Test results 1400 include various discrete steps 1410 in the resistance versus temperature plot, each of such discrete steps 1410 representing a relatively rapid change in resistance over a relatively narrow range of temperatures. At each of these discrete steps 1410, discrete portions of modified ELR material 1060 begin propagating electrical charge up to such portions' charge propagating capacity at the respective temperatures. At very small scales, the surface of ELR material 360 being modified is not perfectly smooth, and thus apertures 310 exposed within the surface of ELR material 360 typically do not extend across the entire width or length of the sample of modified ELR material 1060. Accordingly, in some implementations of the invention, modifying material 1020 covers an entire surface of ELR material 360 and may act as a conductor that carries electrical charge between apertures 310.

Before discussing test results 1400 in further detail, various characteristics of ELR material 360 and modifying material 1020 are discussed. Resistance versus temperature ("R-T") profiles of these materials individually are generally well known. The individual R-T profiles of these materials are not believed to include features similar to discrete steps 1410 found in test results 1400. In fact, unmodified samples of ELR material 360 and samples of modifying material 1020 alone have been tested under similar and often identical testing and measurement configurations. In each instance, the R-T profile of the unmodified samples of ELR material 360 and the R-T profile of the modifying material alone did not include any features similar to discrete steps 1410. Accordingly, discrete steps 1410 are the result of modifying ELR material 360 with modifying material 1020 to maintain aperture 310 at increased temperatures thereby allowing modified material 1060 to remain in an ELR state at such increased temperatures in accordance with various implementations of the invention.

At each of discrete steps 1410, various ones of apertures 310 within modified ELR material 1060 start propagating electrical charge up to each aperture's 310 charge propagating capacity. As measured by the voltmeter, each charge propagating aperture 310 appears as a short-circuit, dropping the apparent voltage across the sample of modified ELR material 1060 by a small amount. The apparent voltage continues to drop as additional ones of apertures 310 start propagating electrical charge until the temperature of the sample of modified ELR material 1060 reaches the transition temperature of ELR material 360 (i.e., the transition temperature of the unmodified ELR material which in the case of YBCO is approximately 90K).

Test results 1400 indicate that certain apertures 310 within modified ELR material 1060 propagate electrical charge at approximately 97K, 100K, 103K, 113K, 126K, 140K, 146K, 179K, 183.5K, 200.5K, 237.5K, and 250K. Certain apertures 310 within modified ELR material 1060 may propagate electrical charge at other temperatures within the full temperature range as would be appreciated.

Test results 1400 include various other relatively rapid changes in resistance over a relatively narrow range of temperatures not otherwise identified as a discrete step 1410. Some of these other changes may correspond to artifacts from data processing techniques used on the measurements obtained during the test runs (e.g., FFTs, filtering, etc.). Some of these other changes may correspond to changes in resistance due to resonant frequencies in modified crystalline structure 1010 affecting aperture 310 at various temperatures. Some of these other changes may correspond to additional discrete steps 1410. In addition, changes in resistance in the temperature range of 270-274K are likely to be associated with water present in modified ELR material 1060, some of which may have been introduced during preparation of the sample of modified ELR material 1060.

In addition to discrete steps 1410, test results 1400 differ from the R-T profile of ELR material 360 in that modifying material 1020 conducts well at temperatures above the transition temperature of ELR material 360 whereas ELR material 360 typically does not.

Figure 15:
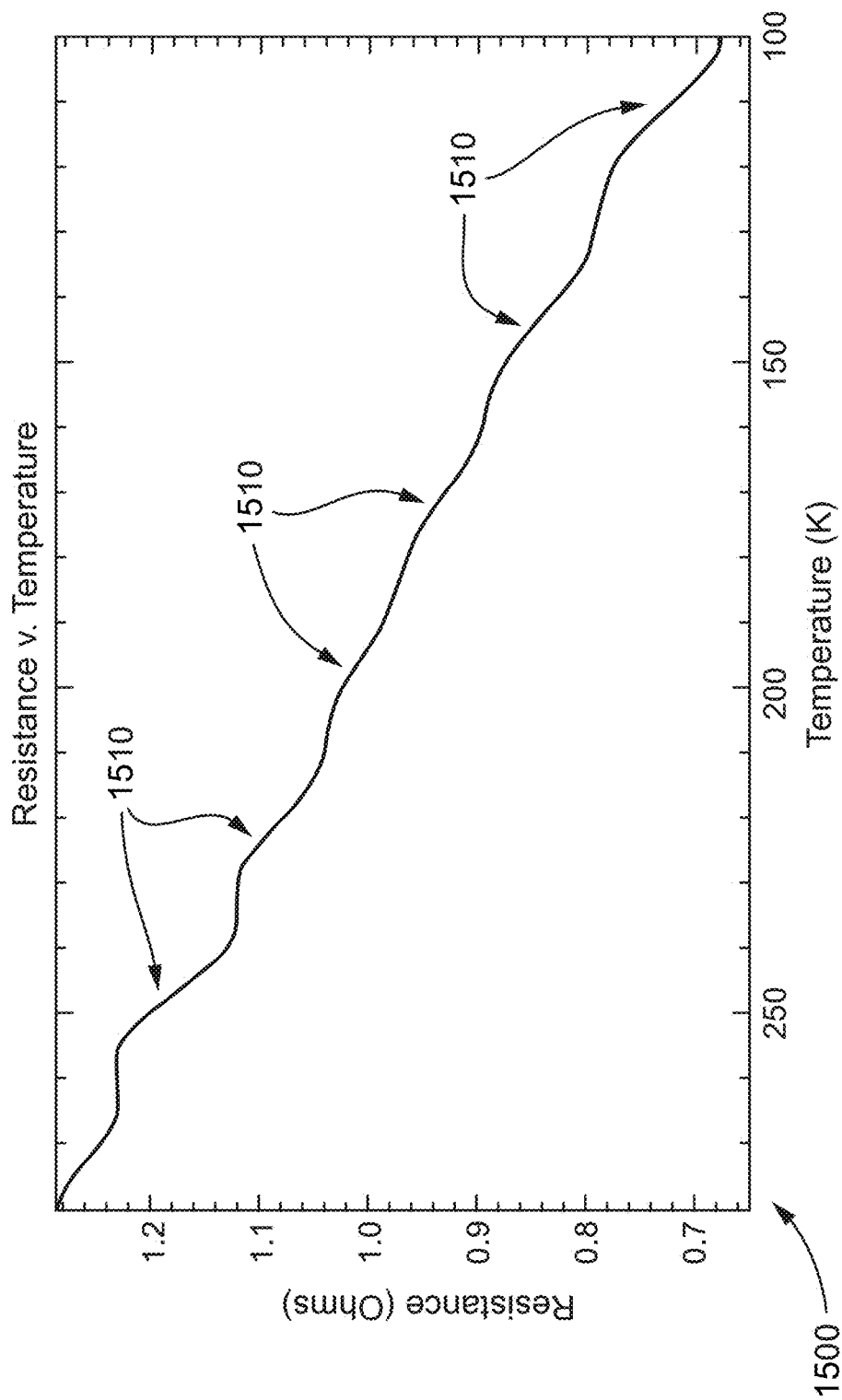
FIG. 15 illustrates test results for a modified ELR material, namely with chromium as a modifying material and YBCO as an ELR material.

FIG. 15 illustrates additional test results 1500 for samples of ELR material 360 and modifying material 1020. More particularly, for test results 1500, modifying material 1020 corresponds to chromium and ELR material 360 corresponds to YBCO. For test results 1500, samples of ELR material 360 were prepared, using various techniques discussed above, to expose a face of crystalline structure 300 parallel to the a-plane or the b-plane. Test results 1500 were gathered using a lock-in amplifier and a K6221 current source, which applied a 10 nA current at 24.0, Hz to modified ELR material 1060. Test results 1500 include a plot of resistance of modified ELR material 1060 as a function of temperature (in K). FIG. 15 includes test results 1500 over a full range of temperature over which resistance of modified ELR material 1060 was measured, namely 80K to 275K. Test results 1500 demonstrate that various portions of modified ELR material 1060 operate in an ELR state at higher temperatures relative to ELR material 360. Five sample analysis test runs were made with a sample of modified ELR material 1060. For each sample analysis test run, the sample of modified ELR material 1060 was slowly warmed from 80K to 275K. While being warmed, the voltage across the sample of modified ELR material 1060 was measured at regular time intervals and the resistance was calculated based on the source current. For each sample analysis test run, the time series of resistance measurements were filtered using a 1024-point FFT. All but the lowest 15 frequencies from the FFT were eliminated from the data and the filtered resistance measurements were returned to the time domain. The filtered resistance measurements from each sample analysis test run were then merged together using the binning process referred to above to produce test results 1500. Then the resistance measurements in each temperature range were averaged together to provide an average resistance measurement for each temperature range. These average resistance measurements form test results 1500.

Test results 1500 include various discrete steps 1510 in the resistance versus temperature plot, each of such discrete steps 1510 representing a relatively rapid change in resistance over a relatively narrow range of temperatures, similar to discrete steps 1410 discussed above with respect to FIGS. 14A-14G. At each of these discrete steps 1510, discrete portions of modified ELR material 1060 propagate electrical charge up to such portions' charge propagating capacity at the respective temperatures.

Test results 1500 indicate that certain apertures 310 within modified ELR material 1060 propagate electrical charge at approximately 120K, 145K, 175K, 225K, and 250K. Certain apertures 310 within modified ELR material 1060 may propagate electrical charge at other temperatures within the full temperature range as would be appreciated.

FIGS. 16-20 illustrate additional test results for samples of ELR material 360 and various modifying materials 1020. For these additional test results, samples of ELR material 360 were prepared, using various techniques discussed above, to expose a face of crystalline structure 300 substantially parallel to the a-plane or the b-plane or some combination of the a-plane or the b-plane and the modifying material was layered onto these exposed faces. Each of these modified samples was slowly cooled from approximately 300K to 80K. While being warmed, a current source applied a current in a delta mode configuration through the modified sample as described below. At regular time intervals, the voltage across the modified sample was measured. For each sample analysis test run, the time series of voltage measurements were filtered in the frequency domain using an FFT by removing all but the lowest frequencies, and the filtered measurements were returned to the time domain. The number of frequencies kept is in general different for each data set. The filtered data from each of test runs were then binned and averaged together to produce the test results illustrated in FIGS. 16-21.

Figure 16:
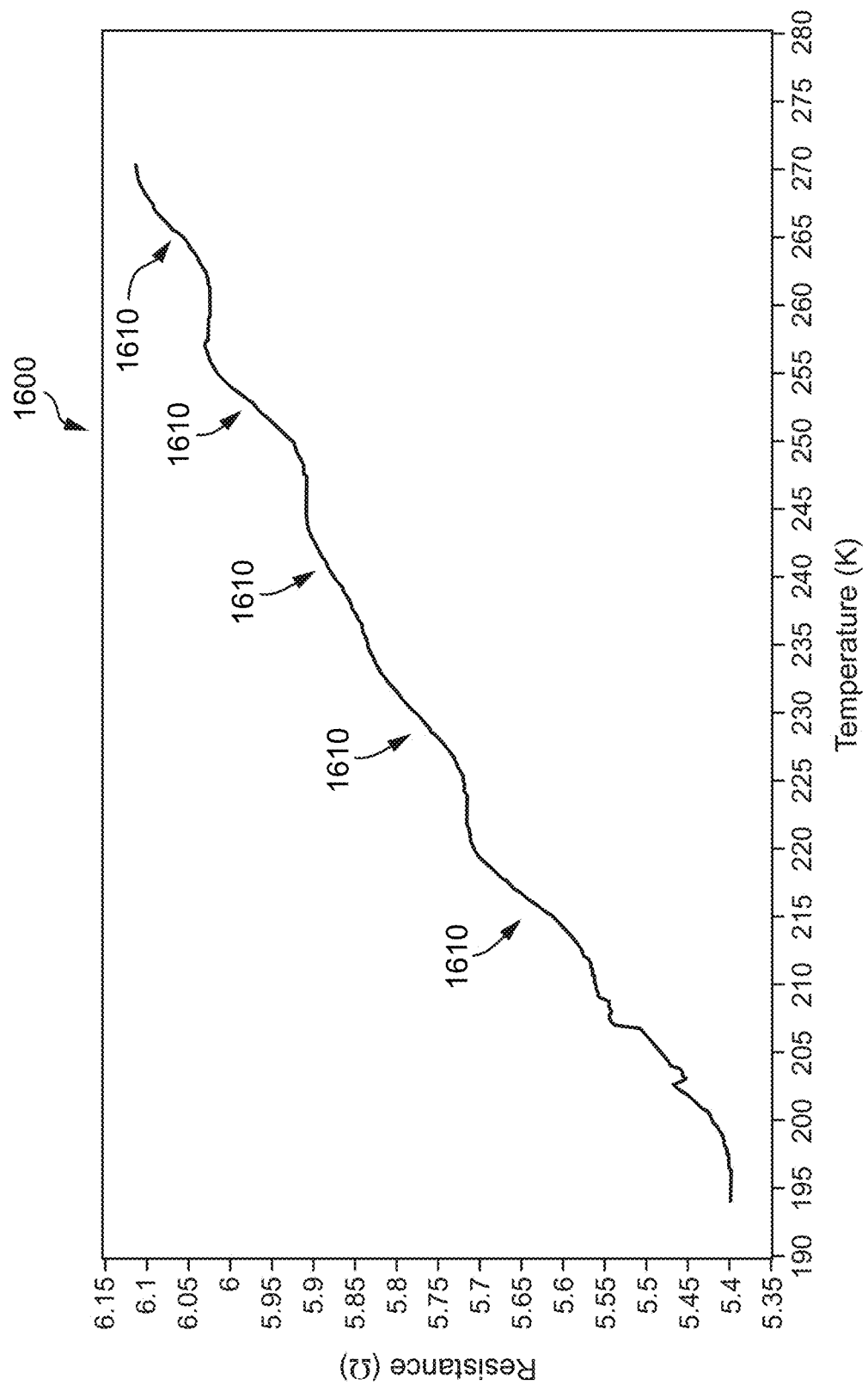
FIG. 16 illustrates test results for a modified ELR material, namely with vanadium as a modifying material and YBCO as an ELR material.

FIG. 16 illustrates test results 1600 including a plot of resistance of modified ELR material 1060 as a function of temperature (in K). For test results 1600, modifying material 1020 corresponds to vanadium and ELR material 360 corresponds to YBCO. Test results 1600 were produced over 11 test runs using a 20 nA current source, a 1024-point FFT was performed, and information from all but the lowest 12 frequencies were eliminated. Test results 1600 demonstrate that various portions of modified ELR material 1060 operate in an ELR state at higher temperatures relative to ELR material 360. Test results 1600 include various discrete steps 1610 in the resistance versus temperature plot, similar to those discussed above with regard to FIGS. 14A-14G. Test results 1600 indicate that certain apertures 310 within modified ELR material 1060 propagate electrical charge at approximately 267K, 257K, 243K, 232K, and 219K. Certain apertures 310 within modified ELR material 1060 may propagate electrical charge at other temperatures.

Figure 17:
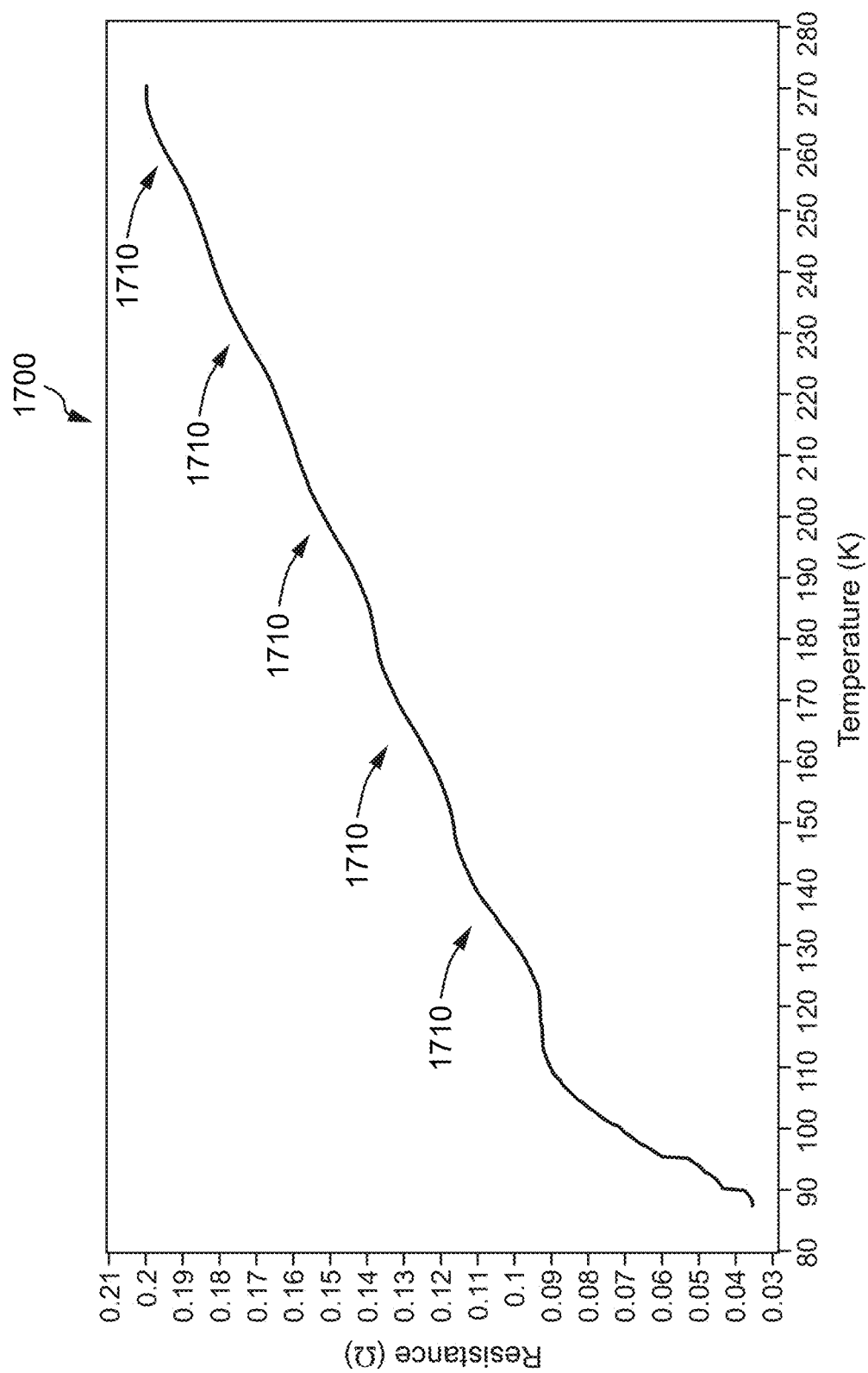
FIG. 17 illustrates test results for a modified ELR material, namely with bismuth as a modifying material and YBCO as an ELR material.

FIG. 17 illustrates test results 1700 including a plot of resistance of modified ELR material 1060 as a function of temperature (in K). For test results 1700, modifying material 1020 corresponds to bismuth and ELR material 360 corresponds to YBCO. Test results 1700 were produced over 5 test runs using a 400 nA current source, a 1024-point FFT was performed, and information from all but the lowest 12 frequencies were eliminated. Test results 1700 demonstrate that various portions of modified ELR material 1060 operate in an ELR state at higher temperatures relative to ELR material 360. Test results 1700 include various discrete steps 1710 in the resistance versus temperature plot, similar to those discussed above with regard to FIGS. 14A-14G. Test results 1700 indicate that certain apertures 310 within modified ELR material 1060 propagate electrical charge at approximately 262K, 235K, 200K, 172K, and 141K. Certain apertures 310 within modified ELR material 1060 may propagate electrical charge at other temperatures.

Figure 18:
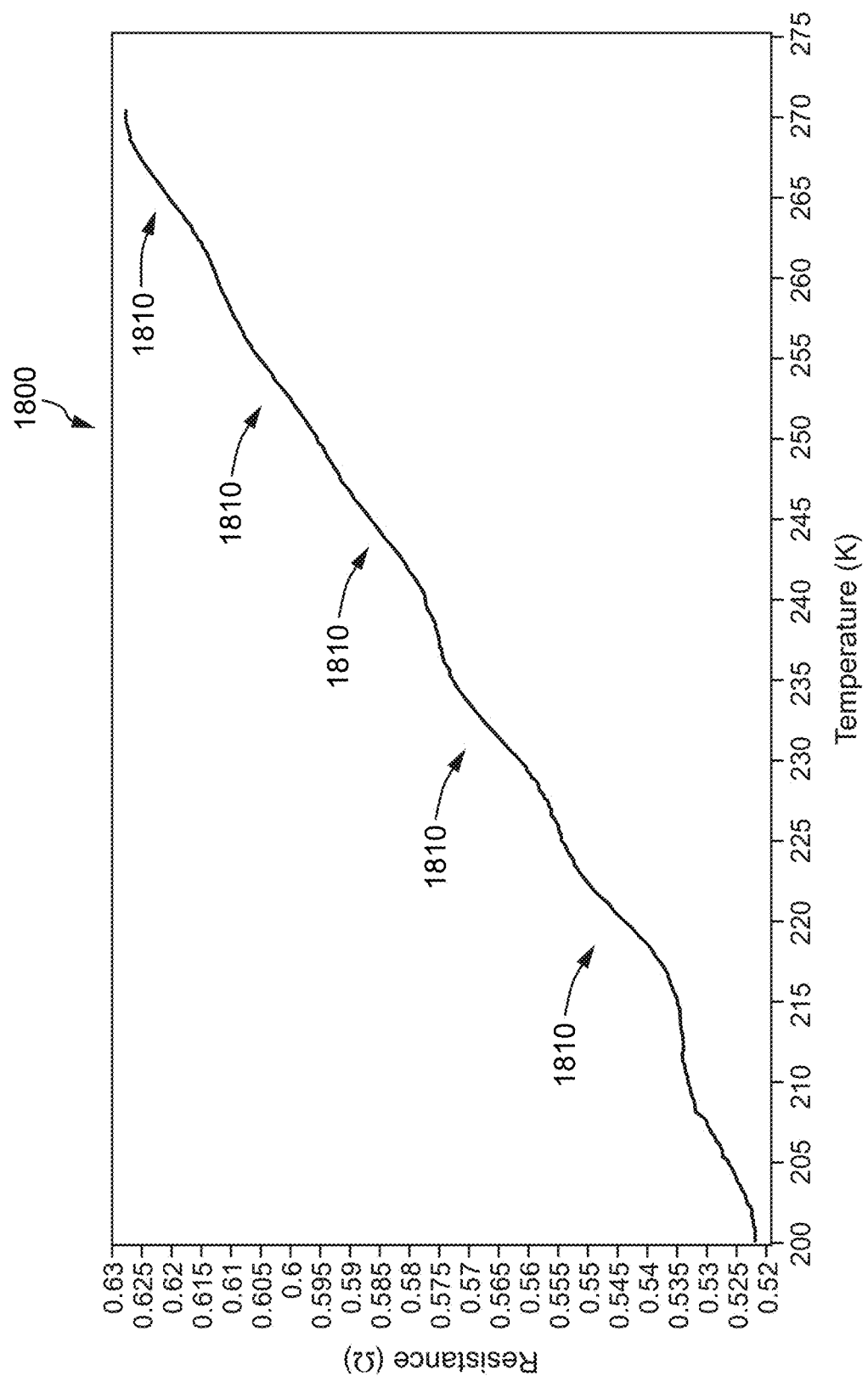
FIG. 18 illustrates test results for a modified ELR material, namely with copper as a modifying material and YBCO as an ELR material.

FIG. 18 illustrates test results 1800 including a plot of resistance of modified ELR material 1060 as a function of temperature (in K). For test results 1800, modifying material 1020 corresponds to copper and ELR material 360 corresponds to YBCO. Test results 1800 were produced over 6 test runs using a 200 nA current source, a 1024-point FFT was performed, and information from all but the lowest 12 frequencies were eliminated. Test results 1800 demonstrate that various portions of modified ELR material 1060 operate in an ELR state at higher temperatures relative to ELR material 360. Test results 1800 include various discrete steps 1810 in the resistance versus temperature plot, similar to those discussed above with regard to FIGS. 14A-14G. Test results 1800 indicate that certain apertures 310 within modified ELR material 1060 propagate electrical charge at approximately 268K, 256K, 247K, 235K, and 223K. Certain apertures 310 within modified ELR material 1060 may propagate electrical charge at other temperatures.

Figure 19:
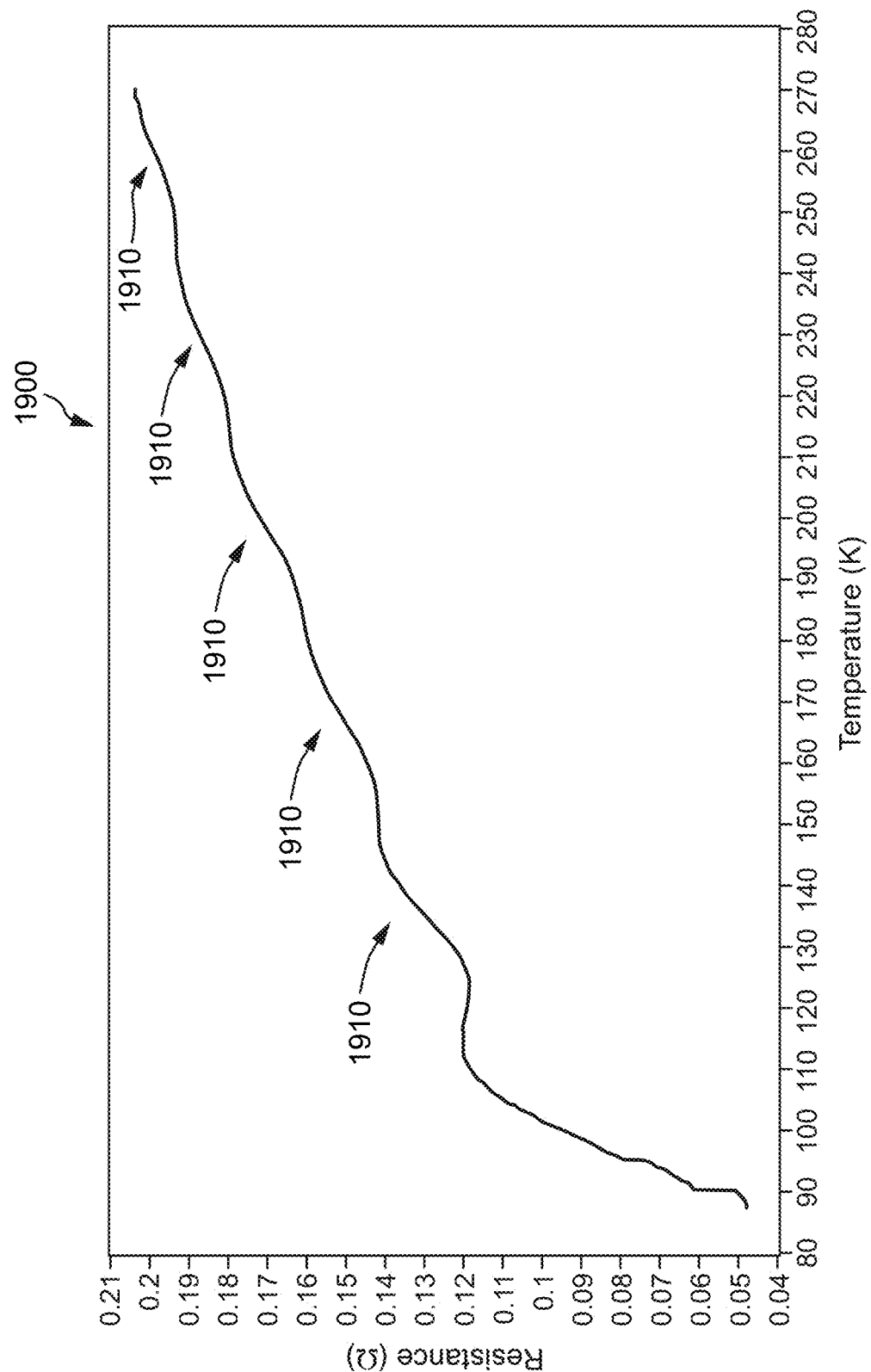
FIG. 19 illustrates test results for a modified ELR material, namely with cobalt as a modifying material and YBCO as an ELR material.

FIG. 19 illustrates test results 1900 including a plot of resistance of modified ELR material 1060 as a function of temperature (in K). For test results 1900, modifying material 1020 corresponds to cobalt and ELR material 360 corresponds to YBCO. Test results 1900 were produced over 11 test runs using a 400 nA current source, a 1024-point FFT was performed, and information from all but the lowest 12 frequencies were eliminated. Test results 1900 demonstrate that various portions of modified ELR material 1060 operate in an ELR state at higher temperatures relative to ELR material 360. Test results 1900 include various discrete steps 1910 in the resistance versus temperature plot, similar to those discussed above with regard to FIGS. 14A-14G. Test results 1900 indicate that certain apertures 310 within modified ELR material 1060 propagate electrical charge at approximately 265K, 236K, 205K, 174K, and 143K. Certain apertures 310 within modified ELR material 1060 may propagate electrical charge at other temperatures.

Figure 20:
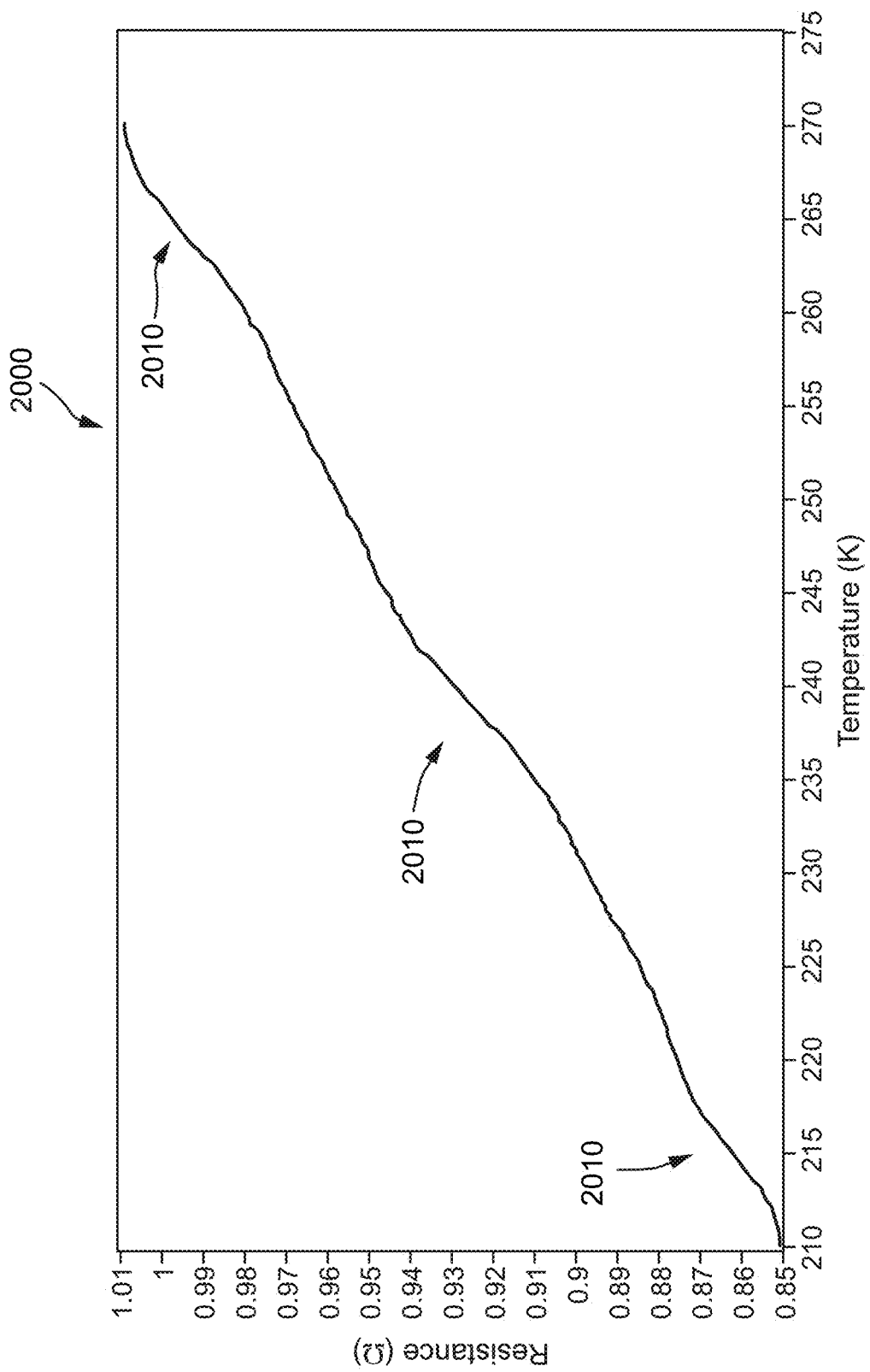
FIG. 20 illustrates test results for a modified ELR material, namely with titanium as a modifying material and YBCO as an ELR material.

FIG. 20 illustrates test results 2000 including a plot of resistance of modified ELR material 1060 as a function of temperature (in K). For test results 2000, modifying material 1020 corresponds to titanium and ELR material 360 corresponds to YBCO. Test results 2000 were produced over 25 test runs using a 100 nA current source, a 512-point FFT was performed, and information from all but the lowest 11 frequencies were eliminated. Test results 2000 demonstrate that various portions of modified ELR material 1060 operate in an ELR state at higher temperatures relative to ELR material 360. Test results 2000 include various discrete steps 2010 in the resistance versus temperature plot, similar to those discussed above with regard to FIGS. 14A-14G. Test results 2000 indicate that certain apertures 310 within modified ELR material 1060 propagate electrical charge at approximately 266K, 242K, and 217K. Certain apertures 310 within modified ELR material 1060 may propagate electrical charge at other temperatures.

Figure 21A:
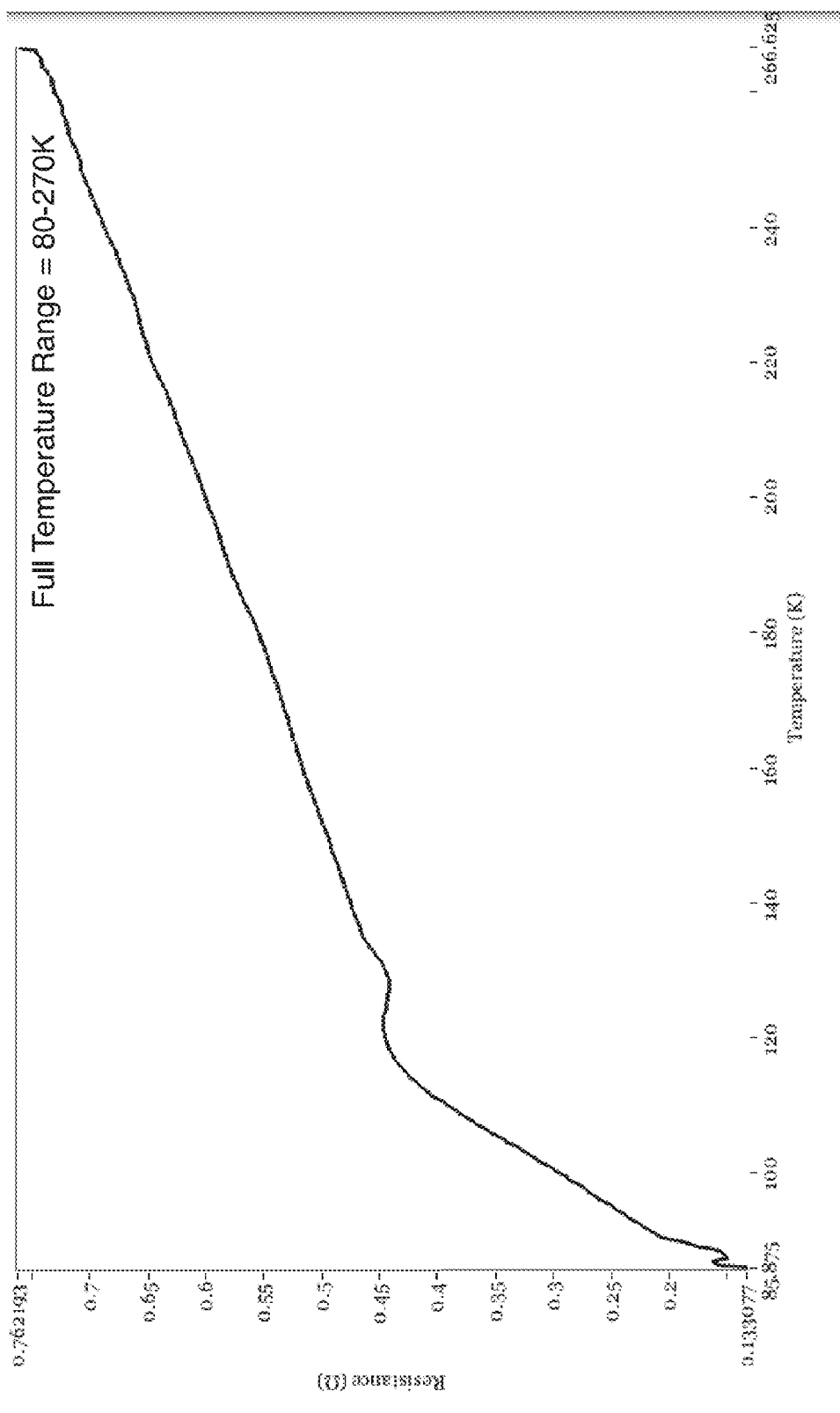
FIGS. 21A-21B illustrate test results for a modified ELR material, namely with chromium as a modifying material and BSCCO as an ELR material.
Figure 21B:
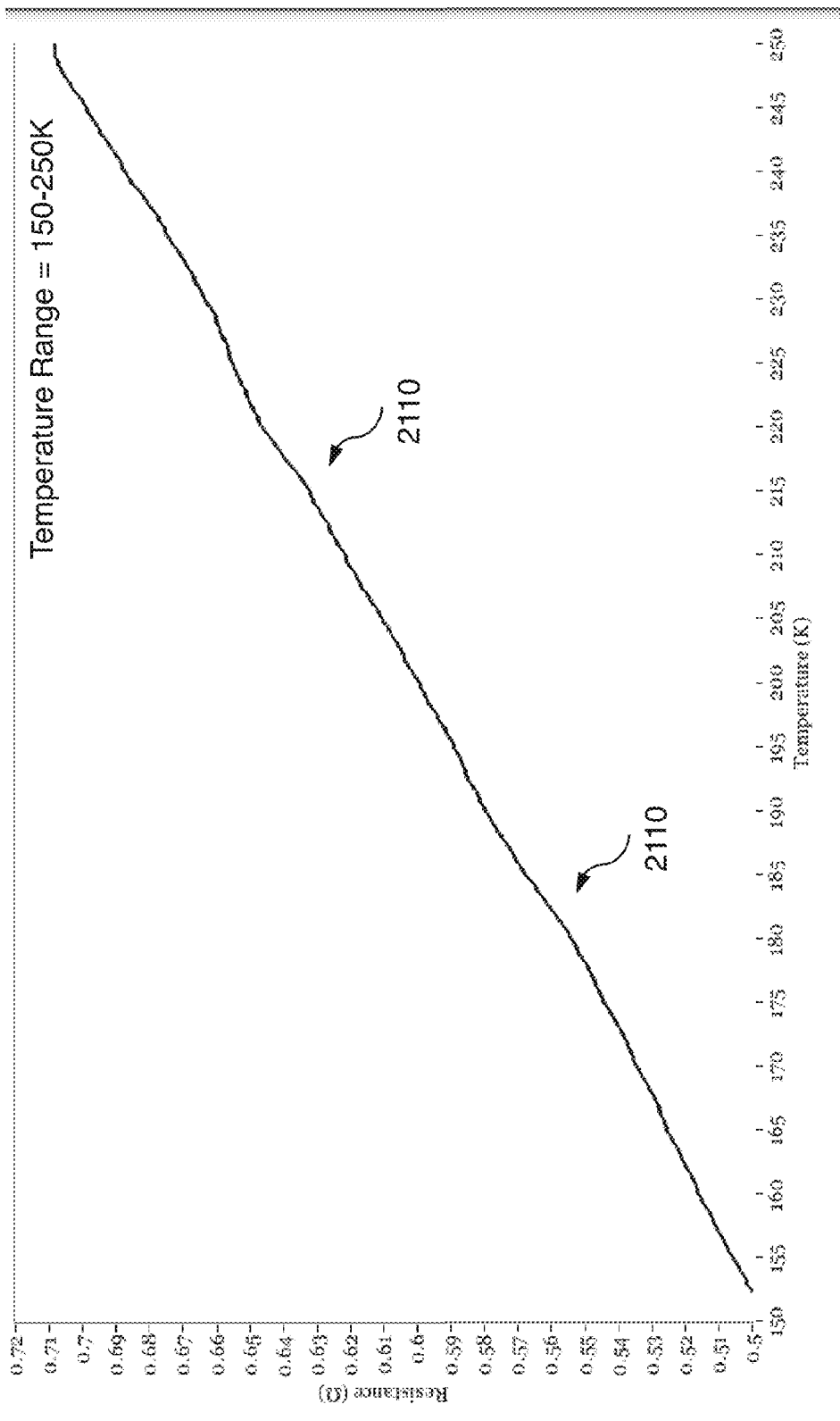

FIG. 21A-21B illustrates test results 2100 including a plot of resistance of modified ELR material 1060 as a function of temperature (in K). For test results 2100, modifying material 1020 corresponds to chromium and ELR material 360 corresponds to BSCCO. FIG. 21A includes test results 2100 over a full range of temperature over which resistance of modified ELR material 1060 was measured, namely 80K to 270K. In order to provide further detail, test results 2100 were expanded over a temperature range of 150K-250K as illustrated in FIG. 21B. Test results 2100 were gathered in a manner similar to those discussed above with regard to FIG.

16-20. In particular, test results 2100 were produced over 25 test runs using a 300 nA current source. The data from these test runs was Savitzy-Golay smoothed, using 64 side points and $4^{th}$ order polynomials. Test results 2100 demonstrate that various portions of modified ELR material 1060 operate in an ELR state at higher temperatures relative to ELR material 360 (here, BSCCO). Test results 2100 include various discrete steps 2110 in the resistance versus temperature plot, similar to those discussed above with regard to FIGS. 14A-14G. Test results 2100 indicate that certain apertures within modified ELR material 1060 propagate electrical charge at approximately 184K and 214K. Certain apertures 310 within modified ELR material 1060 may propagate electrical charge at other temperatures.

In other experiments, modifying material 1020 was layered onto a surface of ELR material 360 substantially parallel to the c-plane of crystalline structure 300. These tests results (not otherwise illustrated) demonstrate that layering a surface of ELR material 360 parallel to the c-plane with modifying material 1020 did not produce any discrete steps such as those described above (e.g., discrete steps 1410). These test results indicate that modifying a surface of ELR material 360 that is perpendicular to a direction in which ELR material 360 does not (or tends to not) exhibit the resistance phenomenon does not improve the operating characteristics of the unmodified ELR material. In other words, modifying such surfaces of ELR material 360 may not maintain aperture 310. In accordance with various principles of the invention, modifying material should be layered with surfaces of the ELR material that are parallel to the direction in which ELR material does not (or tends to not) exhibit the resistance phenomenon. More particularly, and for example, with regard to ELR material 360 (illustrated in FIG. 3), modifying material 1020 should be bonded to an "a-c" face or a "b-c" face of crystalline structure 300 (both of which faces are parallel to the c-axis) in ELR material 360 (which tends not to exhibit the resistance phenomenon in the direction of the c-axis) in order to maintain aperture 310.

Figure 22:
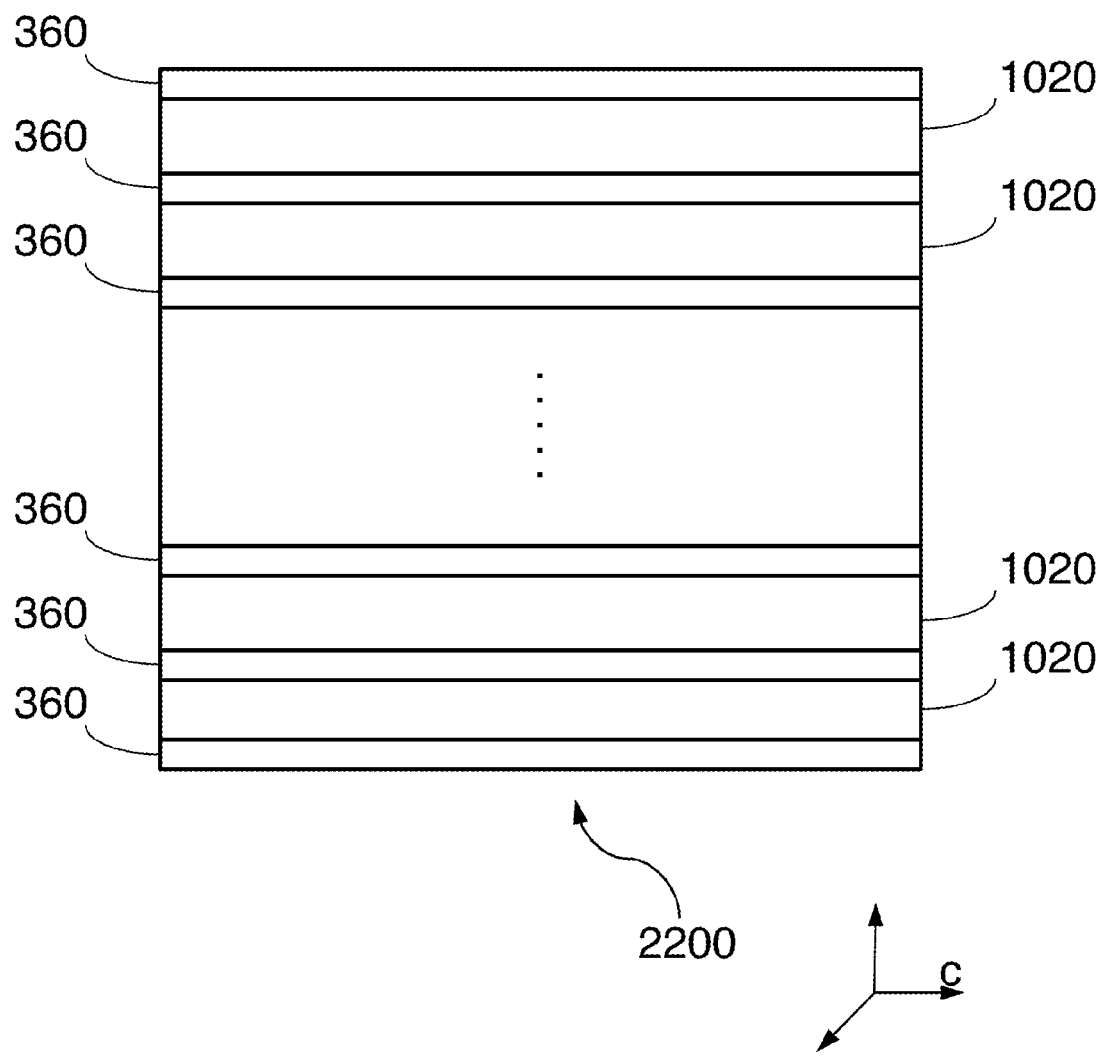
FIG. 22 illustrates an arrangement of an ELR material and a modifying material useful for propagating electrical charge according to various implementations of the invention.

FIG. 22 illustrates an arrangement 2200 including alternating layers of ELR material 360 and a modifying material 1020 useful for propagating additional electrical charge according to various implementations of the invention. Such layers may be deposited onto one another using various deposition techniques. Various techniques may be used to improve alignment of crystalline structures 300 within layers of ELR material 360. Improved alignment of crystalline structures 300 may result in apertures 310 of increased length through crystalline structure 300 which in turn may provide for operation at higher temperatures and/or with increased charge propagating capacity. Arrangement 2200 provides increased numbers of apertures 310 within modified ELR material 1060 at each interface between adjacent layers of modifying material 1020 and ELR material 360. Increased numbers of apertures 310 may increase a charge propagating capacity of arrangement 2200.

In some implementations of the invention, any number of layers may be used. In some implementations of the invention, other ELR materials and/or other modifying materials may be used. In some implementations of the invention, additional layers of other material (e.g., insulators, conductors, or other materials) may be used between paired layers of ELR material 360 and modifying material 1020 to mitigate various effects (e.g., magnetic effects, migration of materials, or other effects) or to enhance the characteristics of the modified ELR material 1060 formed within such paired layers. In some implementations of the invention, not all layers are paired. In other words, arrangement 2200 may have one or more extra (i.e., unpaired) layers of ELR material 360 or one or more extra layers of modifying material 1020.

Figure 23:
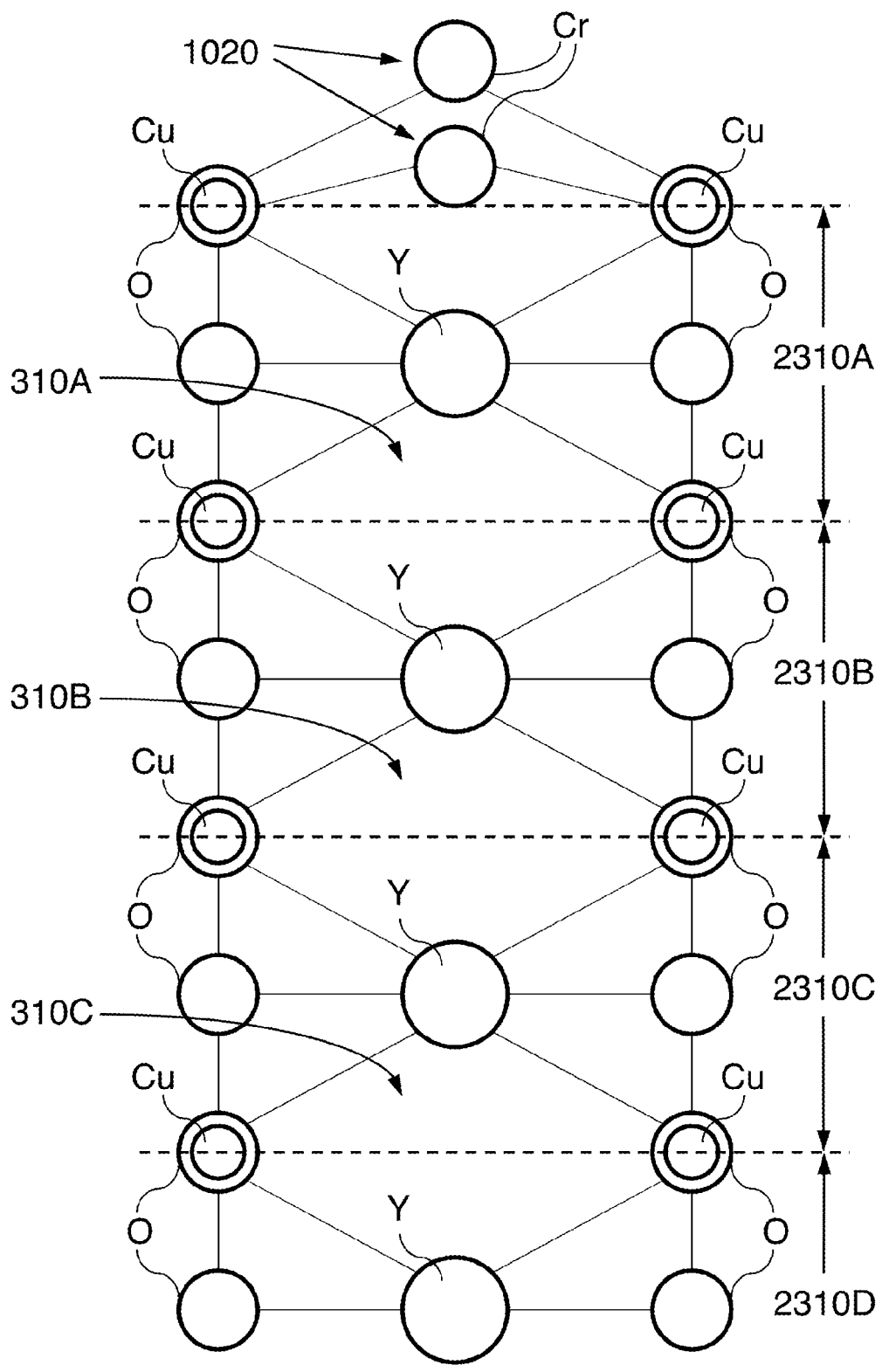
FIG. 23 illustrates multiple layers of crystalline structures of an exemplary surface-modified ELR material according to various implementations of the invention.

FIG. 23 illustrates additional layers 2310 (illustrated as a layer 2310A, a layer 2310B, a layer 2310C, and a layer 2310D) of modified crystalline structure 1010 in modified ELR material 1060 according to various implementations of the invention. As illustrated, modified ELR material 1060 includes various apertures 310 (illustrated as an aperture 310A, an aperture 310B, and an aperture 310C) at different distances into material 1060 from modifying material 1020 that form bonds with atoms of crystalline structure 300 (of FIG. 3). Aperture 310A is nearest modifying material 1020, followed by aperture 310B, which in turn is followed by aperture 310C, etc. In accordance with various implementations of the invention, an impact of modifying material 1020 is greatest with respect to aperture 310A, followed by a lesser impact with respect to aperture 310B, which in turn is followed by a lesser impact with respect to aperture 310C, etc. According to some implementations of the invention, modifying material 1020 should better maintain aperture 310A than either aperture 310B or aperture 310C due to aperture 310A's proximity to modifying material 1020; likewise, modifying material 1020 should better maintain aperture 310B than aperture 310C due to aperture 310B's proximity to modifying material 1020, etc. According to some implementations of the invention, modifying material 1020 should better maintain the cross-section of aperture 310A than the cross-sections of either aperture 310B or aperture 310C due to aperture 310A's proximity to modifying material 1020; likewise, modifying material 1020 should better maintain the cross-section of aperture 310B than the cross-section of aperture 310C due to aperture 310B's proximity to modifying material 1020, etc. According to some implementations of the invention, modifying material 1020 should have a greater impact on a charge propagating capacity of aperture 310A at a particular temperature than on a charge propagating capacity of either aperture 310B or aperture 310C at that particular temperature due to aperture 310A's proximity to modifying material 1020; likewise, modifying material 1020 should have a greater impact on the charge propagating capacity of aperture 310B at a particular temperature than on the charge propagating capacity of aperture 310C at that particular temperature due to aperture 310B's proximity to modifying material 1020, etc. According to some implementations of the invention, modifying material 1020 should enhance the propagation of electrical charge through aperture 310A more than the propagation of electrical charge through either aperture 310B or aperture 310C due to aperture 310A's proximity to modifying material 1020; likewise, modifying material 1020 should enhance the propagation of electrical charge through aperture 310B more than the propagation of electrical charge through aperture 310C due to aperture 310B's proximity to modifying material 1020, etc.

Various test results described above, for example, test results 1400 of FIG. 14, among others, support these aspects of various implementations of the invention, i.e., generally, that the impact of modifying material 1020 on apertures 310 varies in relation to their proximity to one another. In particular, each discrete step 1410 in test results 1400 may correspond to a change in electrical charge carried by modified ELR material 1060 as those apertures 310 in a particular layer 2310 (or more appropriately, those apertures 310 formed between adjacent layers 2310 as illustrated) propagate electrical charge up to such apertures' 310 charge propagating capacity. Those apertures 310 in layers 2310 closer in proximity to modifying material 1020 correspond to discrete steps 1410 at higher temperatures whereas those apertures 310 in layers 2310 further from modifying material 1020 correspond to discrete steps 1410 at lower temperatures. Discrete steps 1410 are "discrete" in the sense that apertures 310 at a given relative distance to modifying material 1020 (i.e., apertures 310A between layers 2310A and 2310B) propagate electrical charge at a particular temperature and quickly reach their maximum charge propagating capacity. Another discrete step 1410 is reached when apertures 310 at an increased distance from modifying material 1020 (i.e., apertures 310B between layers 2310B and 2310C) propagate electrical charge at a lower temperature as a result of the increased distance and hence the lessened impact of modifying material 1020 on those apertures 310. Each discrete step 1410 corresponds to another set of apertures 310 beginning to carry electrical charge based on their distance from modifying material 1020. At some distance, however, modifying material 1020 may have insufficient impact on some apertures 310 to cause them to carry electrical charge at a higher temperature than they otherwise would; hence, such apertures 310 propagate electrical charge at a temperature consistent with that of ELR material 360.

In some implementations of the invention, a distance between modifying material 1020 and apertures 310 is reduced so as to increase impact of modifying material 1020 on more apertures 310. In effect, more apertures 310 should propagate electrical charge at discrete steps 1410 associated with higher temperatures. For example, in arrangement 2200 of FIG. 22 and in accordance with various implementations of the invention, layers of ELR material 360 may be made to be only a few unit cells thick in order to reduce the distance between apertures 310 in ELR material 360 and modifying material 1020. Reducing this distance should increase the number of apertures 310 impacted by modifying material 1020 at a given temperature. Reducing this distance also increases the number of alternating layers of ELR material 360 in a given overall thickness of arrangement 2200 thereby increasing an overall charge propagating capacity of arrangement 2200.

Figure 24:
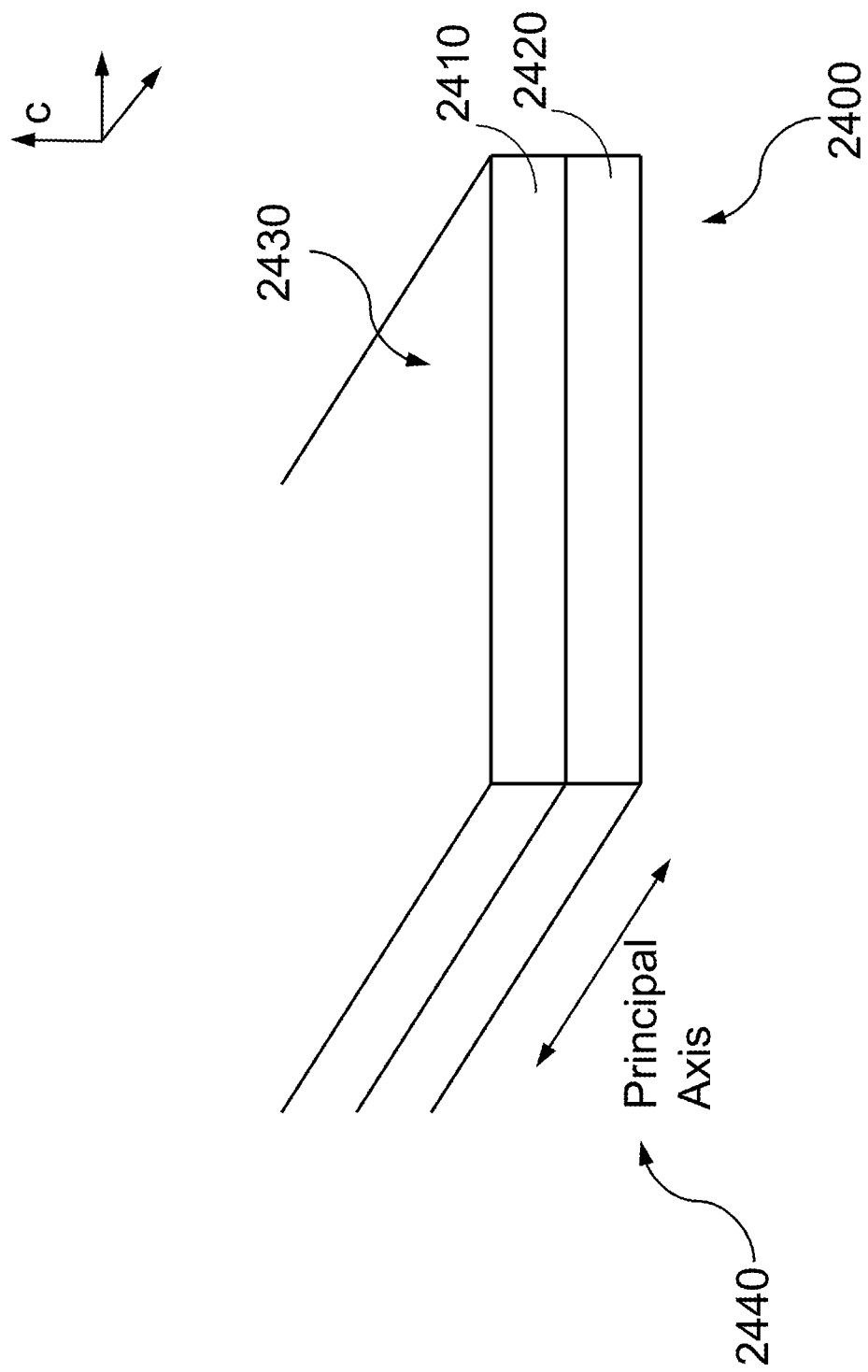
FIG. 24 illustrates a c-film of ELR material according to various implementations of the invention.

FIG. 24 illustrates a film 2400 of an ELR material 2410 formed on a substrate 2420, although, substrate 2420 may not be necessary in various implementations of the invention. In various implementations of the invention, film 2400 may be formed into a tape having a length, for example, greater than 10 cm, 1 m, 1 km or more. Such tapes may be useful, for example, as ELR conductors or ELR wires. As would be appreciated, while various implementations of the invention are described in reference to ELR films, such implementations apply to ELR tapes as well.

For purposes of this description and as illustrated in FIG. 24, film 2400 has a primary surface 2430 and a principal axis 2440. Principal axis 2440 corresponds to a axis extending along a length of film 2400 (as opposed to a width of film 2400 or a thickness of film 2400). Principal axis 2440 corresponds to a primary direction in which electrical charge flows through film 2400. Primary surface 2430 corresponds to the predominant surface of film 2400 as illustrated in FIG. 24, and corresponds to the surface bound by the width and the length of film 2400. It should be appreciated that films 2400 may have various lengths, widths, and/or thicknesses without departing from the scope of the invention.

In some implementations of the invention, during the fabrication of film 2400, the crystalline structures of ELR material 2410 may be oriented such that their c-axis is substantially perpendicular to primary surface 2430 of film 2400 and either the a-axis or the b-axis of their respective crystalline structures is substantially parallel to principal axis 2440. Hence, as illustrated in FIG. 24, the c-axis is referenced by name and the a-axis and the b-axis are not specifically labeled, reflecting their interchangeability for purposes of describing various implementations of the invention. In some fabrication processes of film 2400, the crystalline structures of ELR material may be oriented such that any given line within the c-plane may be substantially parallel with principal axis 2440.

For purposes of this description, films 2400 having the c-axis of their respective crystalline structures oriented substantially perpendicular to primary surface 2430 (including film 2400 depicted in FIG. 24) are referred to as "c-films" (i.e., c-film 2400). C-film 2400, with ELR material 2410 comprised of YBCO, is commercially available from, for example, American Superconductors™ (e.g., 344 Superconductor—Type 348C) or Theva Dünnschichttechnik GmbH (e.g., HTS coated conductors).

In some implementations of the invention, substrate 2420 may include a substrate material including, but not limited to, MgO, STO, LSGO, a polycrystalline material such as a metal or a ceramic, an inert oxide material, a cubic oxide material, a rare earth oxide material, or other substrate material as would be appreciated.

According to various implementations of the invention (and as described in further detail below), a modifying material 1020 is layered onto an appropriate surface of ELR material 2410, where the appropriate surface of ELR material 2410 corresponds to any surface not substantially perpendicular to the c-axis of the crystalline structure of ELR material 2410. In other words, the appropriate surface of ELR material 2410 may correspond to any surface that is not substantially parallel to the primary surface 2430. In some implementations of the invention, the appropriate surface of ELR material 2410 may correspond to any surface that is substantially parallel to the c-axis of the crystalline structure of ELR material 2410. In some implementations of the invention, the appropriate surface of ELR material 2410 may correspond to any surface that is not substantially perpendicular to the c-axis of the crystalline structure of ELR material 2410. In order to modify an appropriate surface of c-film 2400 (whose primary surface 2430 is substantially perpendicular to the c-axis of the crystalline structure of ELR material 2410), the appropriate surface of ELR material 2410 may be formed on or within c-film 2400. In some implementations of the invention, primary surface 2430 may be processed to expose appropriate surface(s) of ELR material 2410 on or within c-film 2400 on which to layer modifying material. In some implementations of the invention, primary surface 2430 may be processed to expose one or more apertures 210 of ELR material 2410 on or within c-film 2400 on which to layer modifying material. It should be appreciated, that in various implementations of the invention, modifying material may be layered onto primary surface 2430 in addition to the appropriate surfaces referenced above.

Processing of primary surface 2430 of c-film 2400 to expose appropriate surfaces and/or apertures 210 of ELR material 2410 may comprise various patterning techniques, including various wet processes or dry processes. Various wet processes may include lift-off, chemical etching, or other processes, any of which may involve the use of chemicals and which may expose various other surfaces within c-film 2400. Various dry processes may include ion or electron bream irradiation, laser direct-writing, laser ablation or laser reactive patterning or other processes which may expose various appropriate surfaces and/or apertures 210 of ELR material 2410 within c-film 2400.

Figure 25:
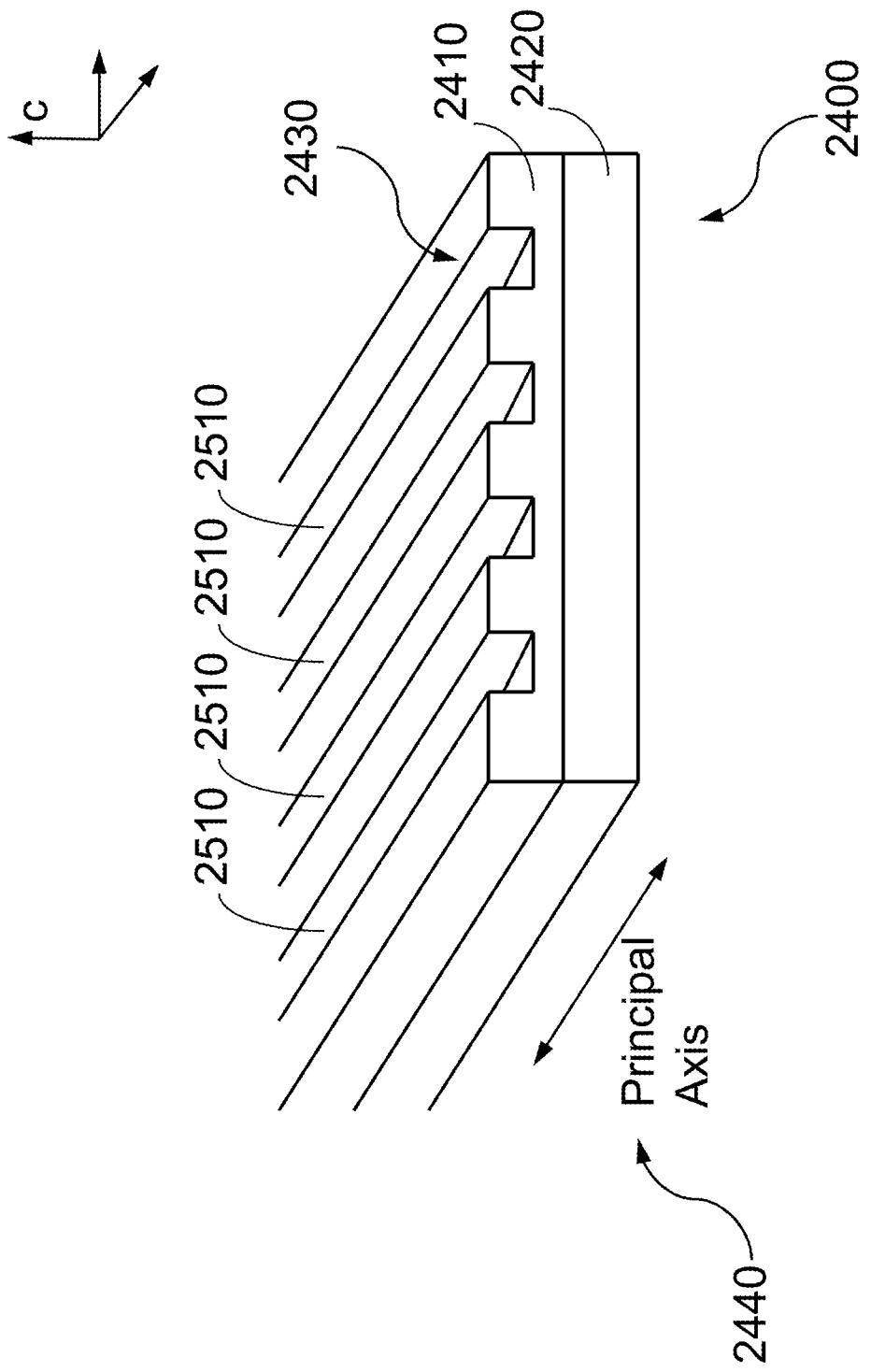
FIG. 25 illustrates a c-film with appropriate surfaces of ELR material according to various implementations of the invention.

As illustrated in FIG. 25, primary surface 2430 of c-film 2400 may be processed to expose an appropriate surface within c-film 2400. For example, c-film 2400 may be processed to expose a face within c-film 2400 substantially parallel to the b-plane of crystalline structure 100 or a face within c-film 2400 substantially parallel to the a-plane of crystalline structure 100. More generally, in some implementations of the invention, primary surface 2430 of c-film 2400 may be processed to expose an appropriate surface within c-film 2400 corresponding to an a/b-c face (i.e., a face substantially parallel to ab-plane). In some implementations of the invention, primary surface 2430 of c-film may be processed to expose any face within c-film 2400 that is not substantially parallel with primary surface 2430. In some implementations of the invention, primary surface 2430 of c-film may be processed to expose any face within c-film 2400 that is not substantially parallel with primary surface 2430 and also substantially parallel with principal axis 2440. Any of these faces, including combinations of these faces, may correspond to appropriate surfaces of ELR material 2410 on or within c-film 2400. According to various implementations of the invention, appropriate surfaces of ELR material 2410 provide access to or otherwise "expose" apertures 210 in ELR material 2410 for purposes of maintaining such apertures 210.

Figure 26:
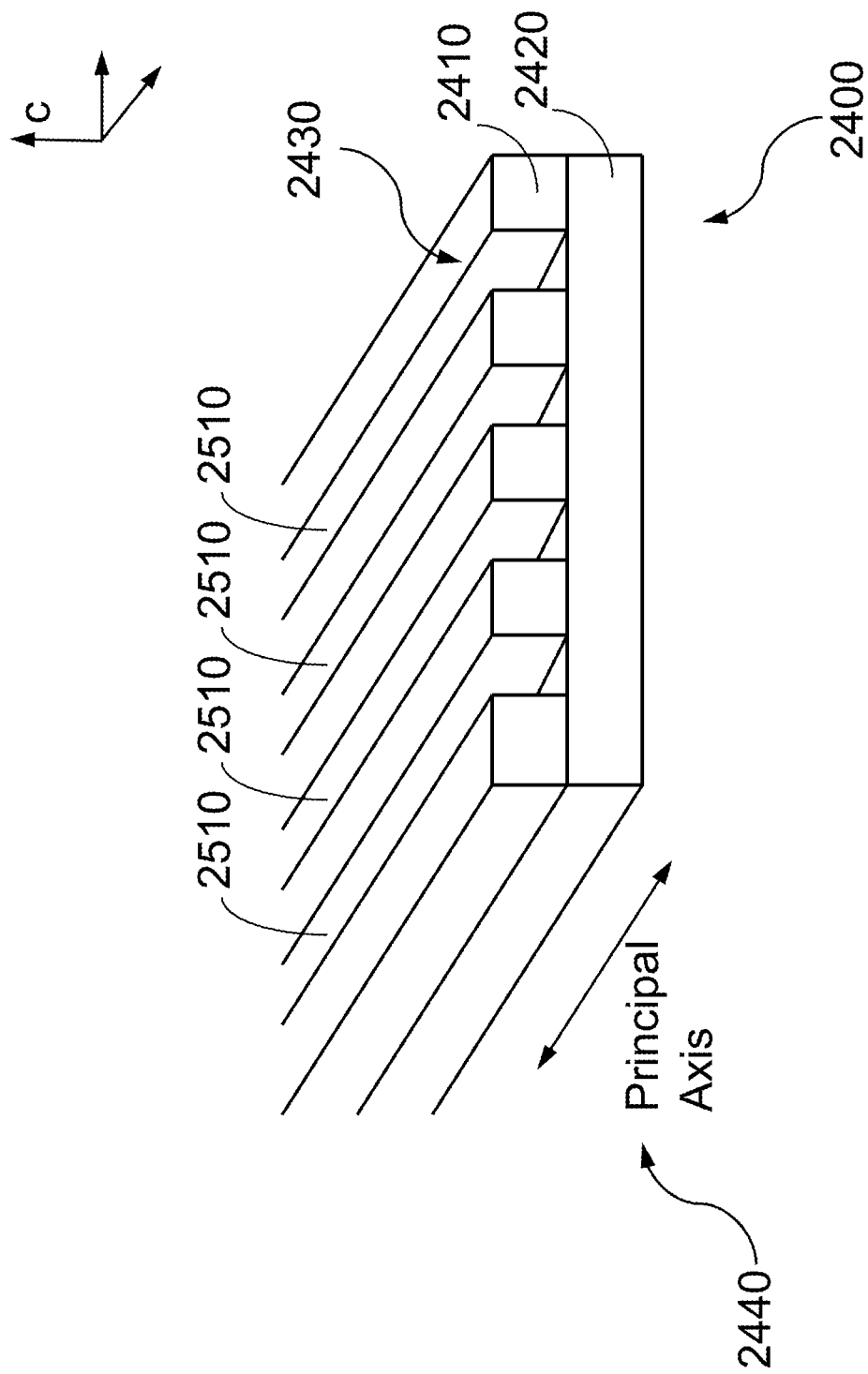
FIG. 26 illustrates a c-film with appropriate surfaces of ELR material according to various implementations of the invention.

In some implementations of the invention, as illustrated in FIG. 25, primary surface 2430 is processed to form one or more grooves 2510 in primary surface 2430. Grooves 2510 include one or more appropriate surfaces (i.e., surfaces other than one substantially parallel to primary surface 2430) on which to deposit modifying material. While grooves 2510 are illustrated in FIG. 25 as having a cross section substantially rectangular in shape, other shapes of cross sections may be used as would be appreciated. In some implementations of the invention, the width of grooves 2510 may be greater than 10 nm. In some implementations of the invention and as illustrated in FIG. 25, the depth of grooves 2510 may be less than a full thickness of ELR material 2410 of c-film 2400. In some implementations of the invention and as illustrated in FIG. 26, the depth of grooves 2510 may be substantially equal to the thickness of ELR material 2410 of c-film 2400. In some implementations of the invention, the depth of grooves 2510 may extend through ELR material 2410 of c-film 2400 and into substrate 2420 (not otherwise illustrated). In some implementations of the invention, the depth of grooves 2510 may correspond to a thickness of one or more units of ELR material 2410 (not otherwise illustrated). Grooves 2510 may be formed in primary surface 2430 using various techniques, such as, but not limited to, laser etching, or other techniques.

In some implementations of the invention, the length of grooves 2510 may correspond to the full length of c-film 2400. In some implementations of the inventions, grooves 2510 are substantially parallel to one another and to principal axis 2440. In some implementations of the invention, grooves 2510 may take on various configurations and/or arrangements in accordance with the various aspects of the invention. For example, grooves 2510 may extend in any manner and/or direction and may include lines, curves and/or other geometric shapes in cross-section with varying sizes and/or shapes along its extent.

While various aspects of the invention are described as forming grooves 2510 within primary surface 2430, it will be appreciated that bumps, angles, or protrusions that include appropriate surfaces of ELR material 2410 may be formed on substrate 2420 to accomplish similar geometries.

According to various implementations of the invention, c-film 2400 may be modified to form various modified c-films. For example, referring to FIG. 27, a modifying material 2720 (i.e., modifying material 1020, modifying material 1020) may be layered onto primary surface 2430 and into grooves 2510 formed within primary surface 2430 of an unmodified c-film (e.g., c-film 2400) and therefore onto various appropriate surfaces 2710 to form a modified c-film 2700. Appropriate surfaces 2710 may include any appropriate surfaces discussed above. While appropriate surfaces 2710 are illustrated in FIG. 27 as being perpendicular to primary surface 2430, this is not necessary as would be appreciated from this description.

Figure 27:
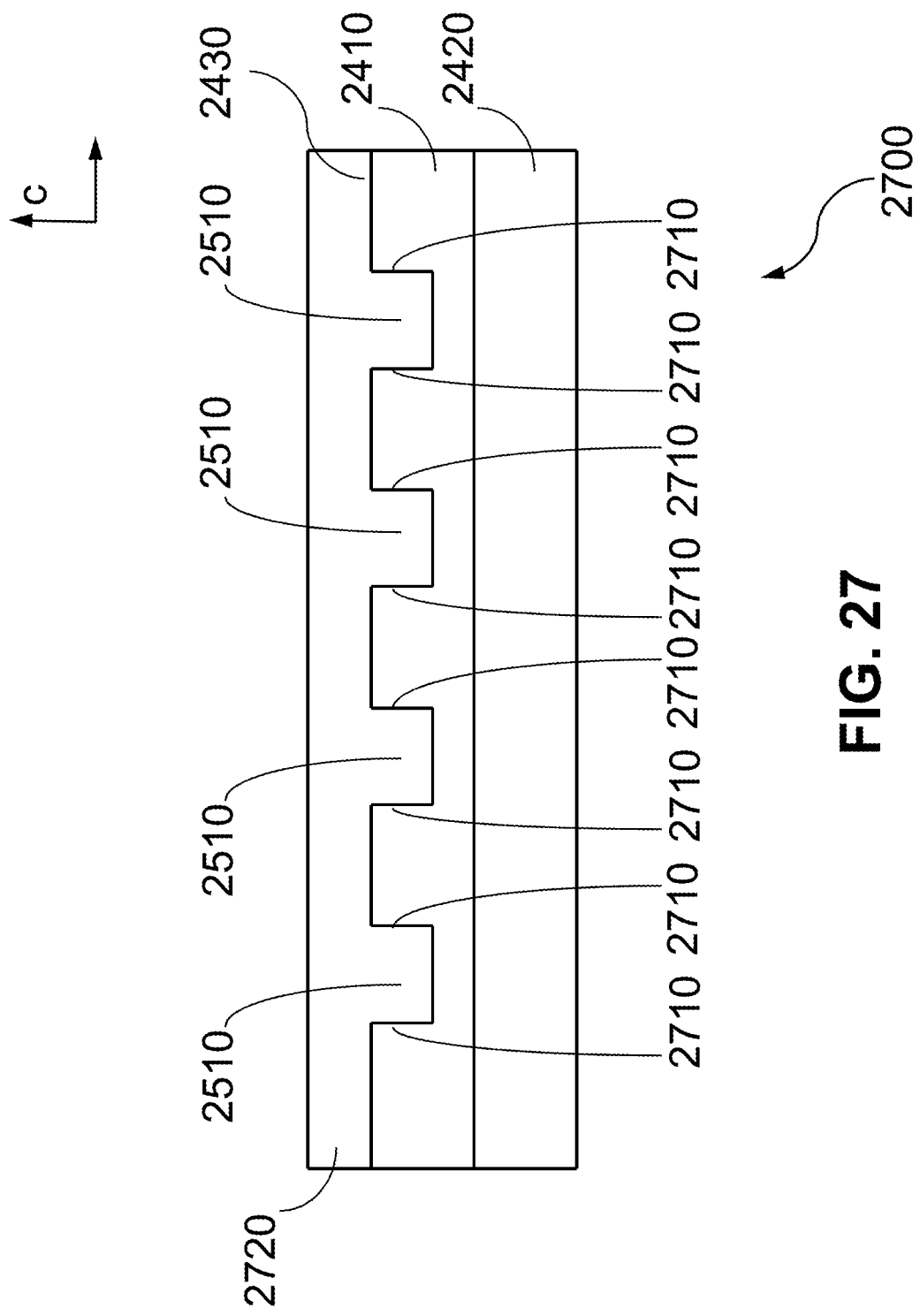
FIG. 27 illustrates a modifying material layered onto appropriate surfaces of ELR material according to various implementations of the invention.
Figure 28:
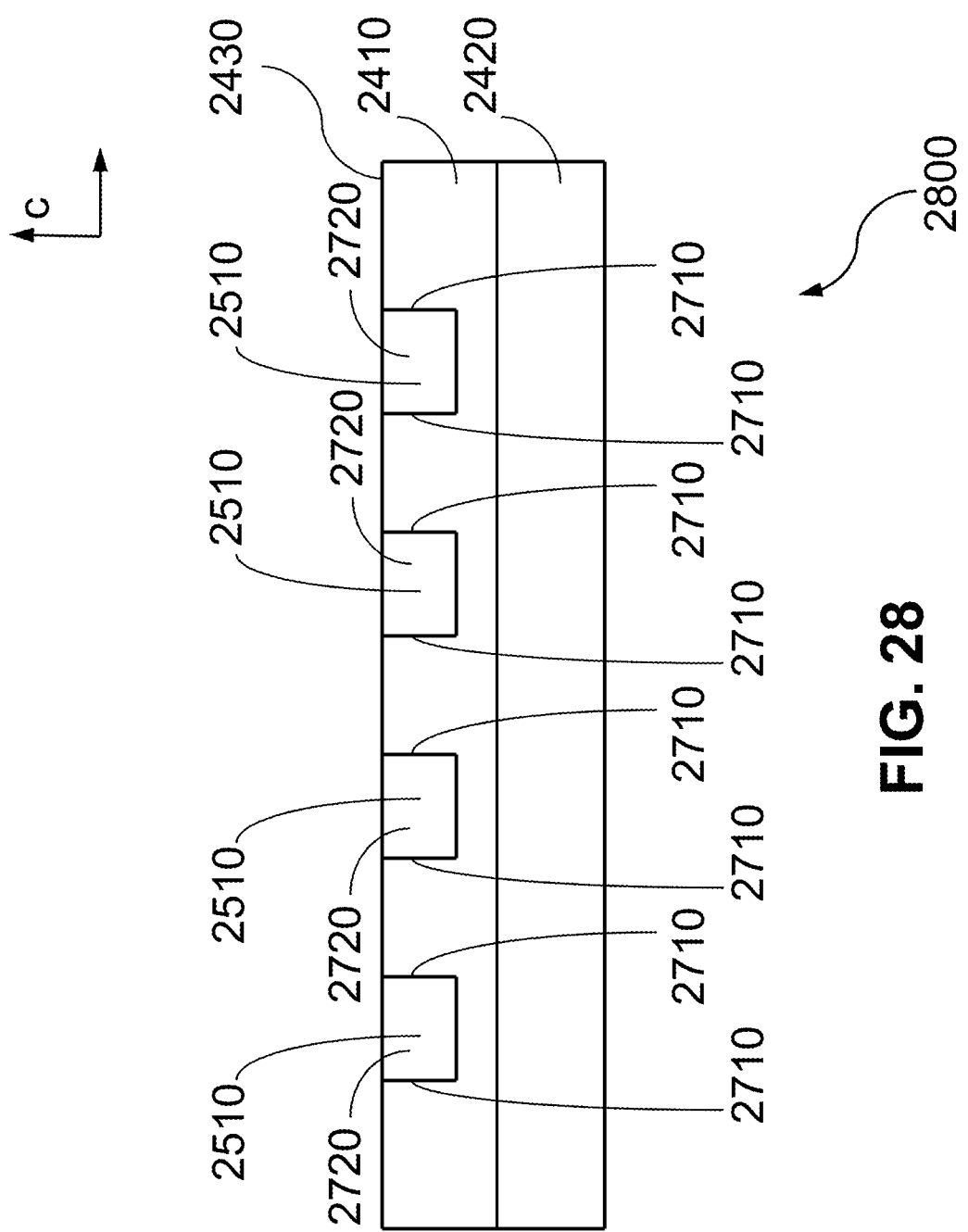
FIG. 28 illustrates a modifying material layered onto appropriate surfaces of ELR material according to various implementations of the invention.

In some implementations of the invention, modifying material 2720 may be layered onto primary surface 2430 and into grooves 2510 as illustrated in FIG. 27. In some implementations, such as illustrated in FIG. 28, modifying material 2720 may be removed from primary surface 2430 to form modified c-film 2800 using various techniques such that modifying material 2720 remains only in grooves 2510 (e.g., various polishing techniques). In some implementations, modified c-film 2800 may be accomplished by layering modifying material 2720 only in grooves 2510. In other words, in some implementations, modifying material 2720 may be layered only into grooves 2510 and/or onto appropriate surfaces 2710, without layering modifying material 2720 onto primary surface 2430 or may be layered such that modifying material 2720 does not bond or otherwise adhere to primary surface 2430 (e.g., using various masking techniques). In some implementations of the invention, various selective deposition techniques may be employed to layer modifying material 2720 directly onto appropriate surfaces 2710.

The thickness of modifying material 2720 in grooves 2510 and/or on primary surface 2430 may vary according to various implementations of the invention. In some implementations of the invention, a single unit layer of modifying material 2720 (i.e., a layer having a thickness substantially equal to a single unit of modifying material 2720) may be layered onto appropriate surfaces 2710 of grooves 2510 and/or on primary surface 2430. In some implementations of the invention, two or more unit layers of modifying material 2720 may be layered into onto appropriate surfaces 2710 of grooves 2510 and/or on primary surface 2430.

Modified c-films 2700, 2800 (i.e., c-film 2400 modified with modifying material 2720) in accordance with various implementations of the invention may be useful for achieving one or more improved operational characteristics over those of unmodified c-film 2400.

Figure 29:
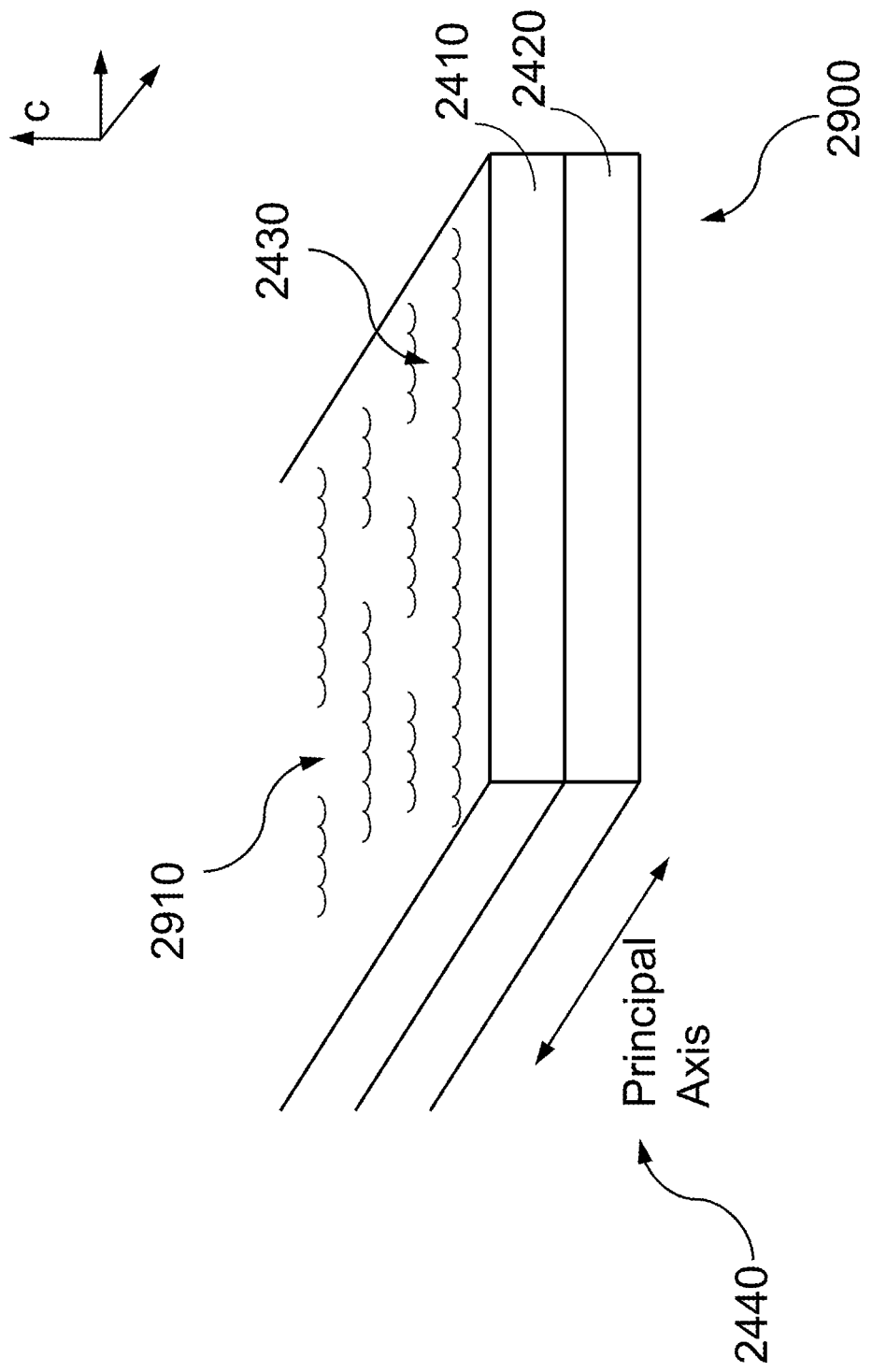
FIG. 29 illustrates a c-film with an etched surface including appropriate surfaces of ELR material according to various implementations of the invention.

As illustrated in FIG. 29, in some implementations of the invention, primary surface 2430 of unmodified c-film 2400 may be modified, via a chemical etch, to expose or otherwise increase an area of appropriate surfaces 2710 available on primary surface 2430. In some implementations of the invention, one manner of characterizing an increased area of appropriate surfaces 2710 within primary surface 2430 may be based on the root mean square (RMS) surface roughness of primary surface 2430 of c-film 2400. In some implementations of the invention, as a result of chemical etching, primary surface 2430 of c-film 2400 may include an etched surface 2910 having a surface roughness in a range of about 1 nm to about 50 nm. RMS surface roughness may be determined using, for example, Atomic Force Microscopy (AFM), Scanning Tunneling Microscopy (STM), or SEM and may be based on a statistical mean of an R-range, wherein the R-range may be a range of the radius (r) of a grain size as would be appreciated. After the chemical etch, an etched surface 2910 of c-film 2900 may correspond to appropriate surface 2710 of ELR material 2410.

Figure 30:
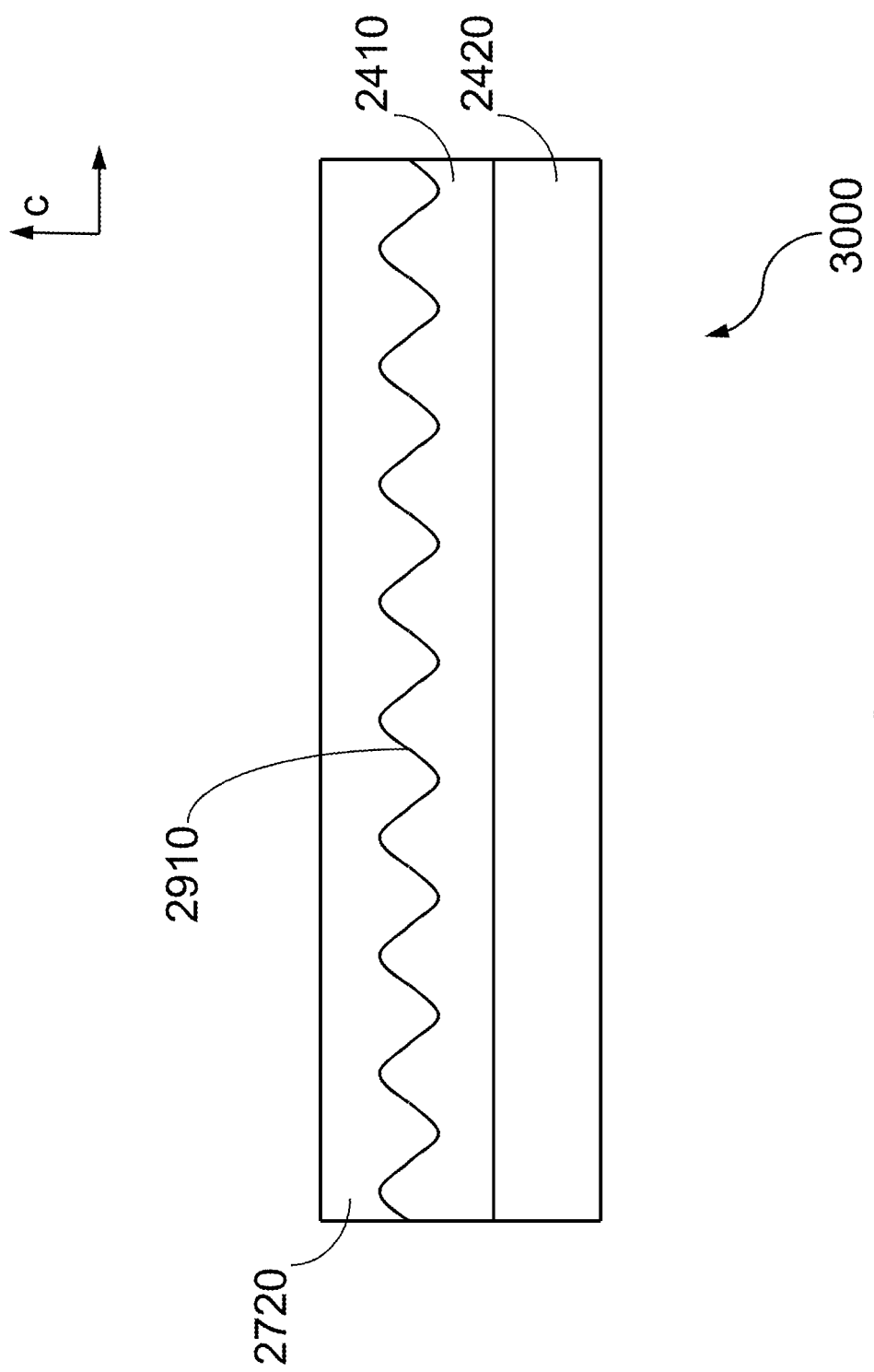
FIG. 30 illustrates a modifying material layered onto an etched surface of a c-film with appropriate surfaces of ELR material according to various implementations of the invention.

As illustrated in FIG. 30, after the chemical etch, modifying material 2720 may be layered on to etched surface 2910 of c-film 2900 to form a modified c-film 3000. Modifying material 2720 may cover substantially all of surface 2910 and the thickness of modifying material 2720 may vary in accordance with various implementations of the invention. In some implementations of the invention, a single unit layer of modifying material 2720 may be layered onto etched surface 2910. In some implementations of the invention, two or more unit layers of modifying material 2720 may be layered onto etched surface 2910.

Figure 31:
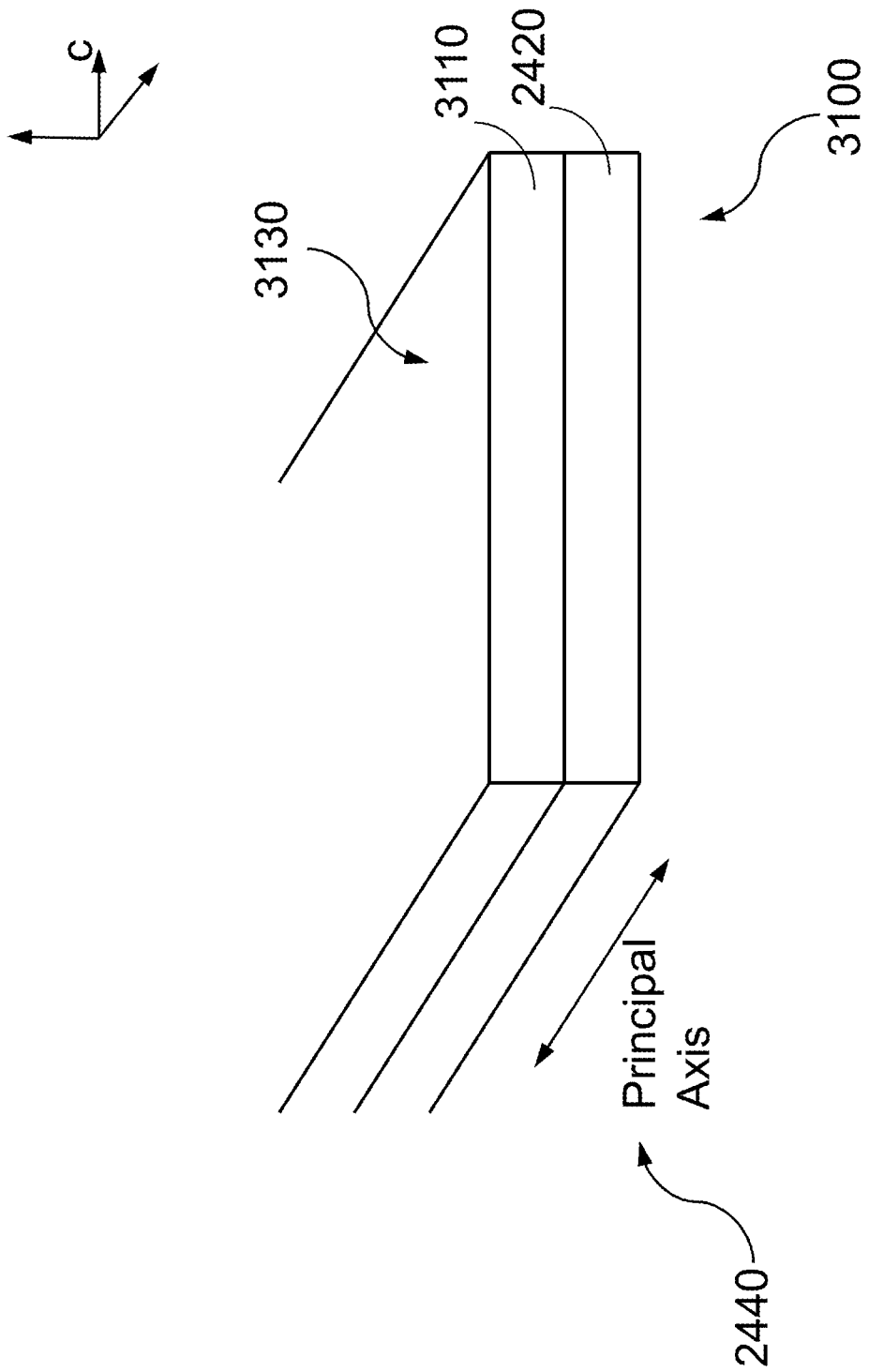
FIG. 31 illustrates an a-b film, including an optional substrate, with appropriate surfaces of ELR material according to various implementations of the invention.

In some implementations of the invention, films having orientations of crystalline structure of ELR material other than that of c-film 2400 may be used. For example, in reference to FIG. 31, and according to various implementations of the invention, instead of the c-axis oriented perpendicular to primary surface 2430 as with c-film 2400, a film 3100 may have the c-axis oriented perpendicular to the principal axis 2440 and a b-axis of ELR material 3110 oriented perpendicular to primary surface 2430. Similarly, a film 3100 may have the c-axis oriented perpendicular to the principal axis 2440 and an a-axis of ELR material 3110 oriented perpendicular to primary surface 2430. In some implementations of the invention, film 3100 may have the c-axis oriented perpendicular to the principal axis 2440 and any line parallel to the c-plane oriented along principal axis 2440. As illustrated in FIG. 31, in these implementations of the invention, film 3100 includes ELR material 3110 with the c-axis of its crystalline structure oriented perpendicular to principal axis 2440 and parallel to a primary surface 3130 and are generally referred to herein as a-b films 3100. While FIG. 31 illustrates the other two axes of the crystalline structure in a particular orientation, such orientation is not necessary as would be appreciated. As illustrated, a-b films 3100 may include an optional substrate 2420 (as with c-films 2400).

In some implementations of the invention, a-b film 3100 is an a-film, having the c-axis of the crystalline structure of ELR material 3110 oriented as illustrated in FIG. 31 and the a-axis perpendicular to primary surface 3130. Such a-films may be formed via various techniques including those described at Selvamanickam, V., et al., "High Current Y—Ba—Cu—O Coated Conductor using Metal Organic Chemical Vapor Deposition and Ion Beam Assisted Deposition," *Proceedings of the* 2000 *Applied Superconductivity Conference*, Virginia Beach, Va., Sep. 17-22, 2000, which is incorporated herein by reference in its entirety. In some implementations, a-films may be grown on substrates 2420 formed of the following materials: LGSO, LaSrAlO$_4$, NdCaAlO$_4$, Nd$_2$CuO$_4$, or CaNdAlO$_4$. Other substrate materials may be used as would be appreciated.

In some implementations of the invention, a-b film 3100 is a b-film, having the c-axis of the crystalline structure of ELR material 3110 oriented as illustrated in FIG. 31 and the b-axis perpendicular to primary surface 3130.

Figure 32:
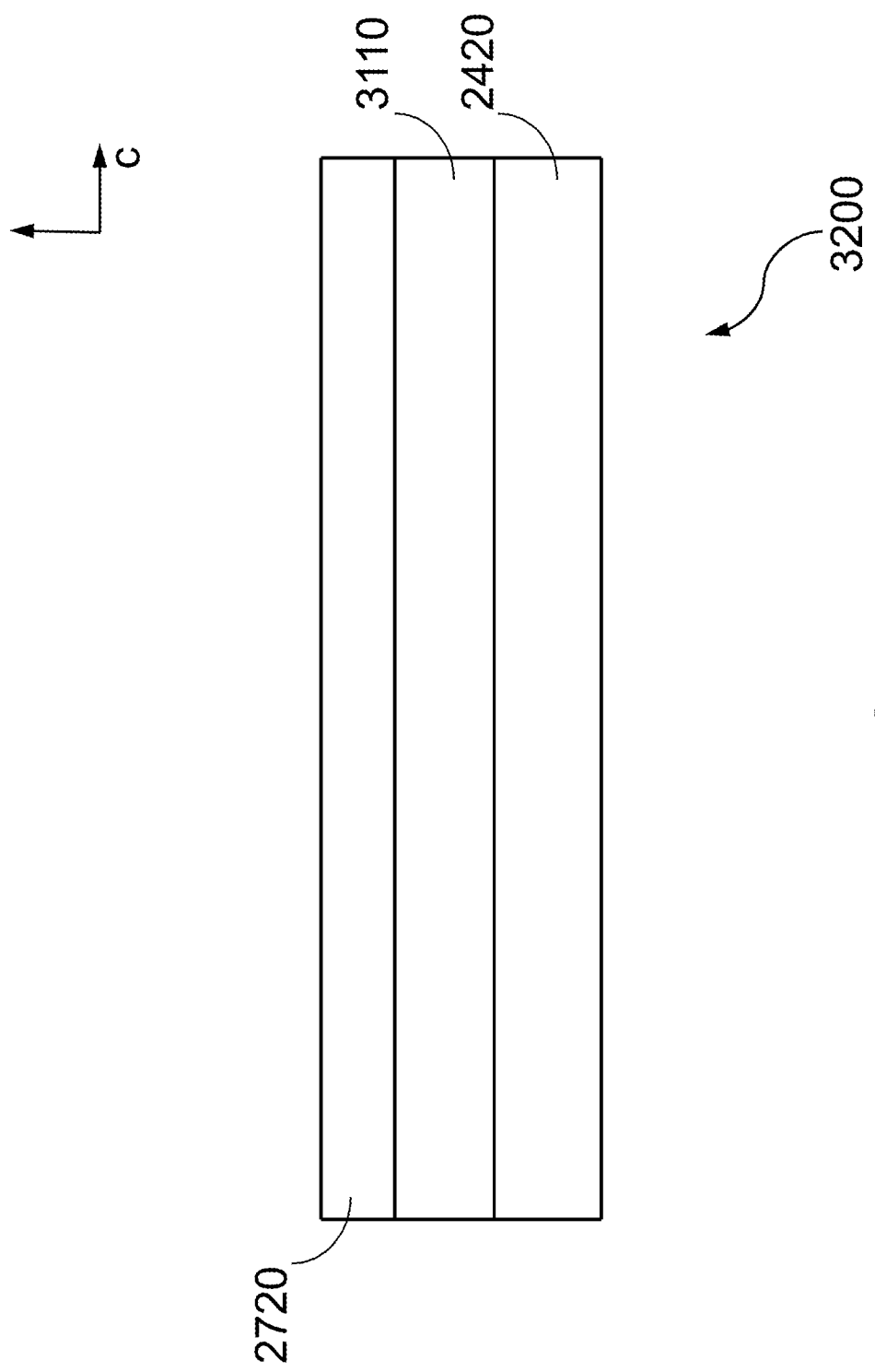
FIG. 32 illustrates a modifying material layered onto appropriate surfaces of ELR material of an a-b film according to various implementations of the invention.

According to various implementations of the invention, primary surface 3130 of a-b film 3100 corresponds to an appropriate surface 2710. In some implementations that employ a-b film 3100, forming an appropriate surface of ELR material 3110 may include forming a-b film 3100. Accordingly, for implementations of the invention that include a-b film 3100, modifying material 2720 may be layered onto primary surface 3130 of a-b film 3100 to create a modified a-b film 3200 as illustrated in FIG. 32. In some implementations of the invention, modifying material 2720 may cover primary surface 3130 of a-b film 3100 in whole or in part. In some implementations of the invention, the thickness of modifying material 2720 may vary as discussed above. More particularly, in some implementations of the invention, a single unit layer of modifying material 2720 may be layered onto primary surface 3130 of a-b film 3100; and in some implementations of the invention, two or more unit layers of modifying material 2720 may be layered onto primary surface 3130 of a-b film 3100. In some implementations of the invention, a-b film 3100 may be grooved or otherwise modified as discussed above with regard to c-film 2400, for example, to increase an overall area of appropriate surfaces 2710 of ELR material 3110 on which to layer modifying material 2720.

As would be appreciated, rather than utilizing a-b film 3100, some implementations of the invention may utilize a layer of ELR material 2410 having its crystalline structure oriented in a manner similar to that of a-b film 3100.

In some implementations of the invention (not otherwise illustrated) a buffer or insulating material may be subsequently layered onto modifying material 2720 of any of the aforementioned films. In these implementations, the buffer or insulating material and the substrate form a "sandwich" with ELR material 2410, 3110 and modifying material 2720 there between. The buffer or insulating material may be layered onto modifying material 2720 as would be appreciated.

Any of the aforementioned materials may be layered onto any other material. For example, ELR materials may be layered onto modifying materials. Likewise, modifying materials may be layered onto ELR materials. Further, layering may include combining, forming, or depositing one material onto the other material as would be appreciated. Layering may use any generally known layering technique, including, but not limited to, pulsed laser deposition, evaporation including coevaporation, e-beam evaporation and activated reactive evaporation, sputtering including magnetron sputtering, ion beam sputtering and ion assisted sputtering, cathodic arc deposition, CVD, organometallic CVD, plasma enhanced CVD, molecular beam epitaxy, a sol-gel process, liquid phase epitaxy and/or other layering technique.

Figure 33:
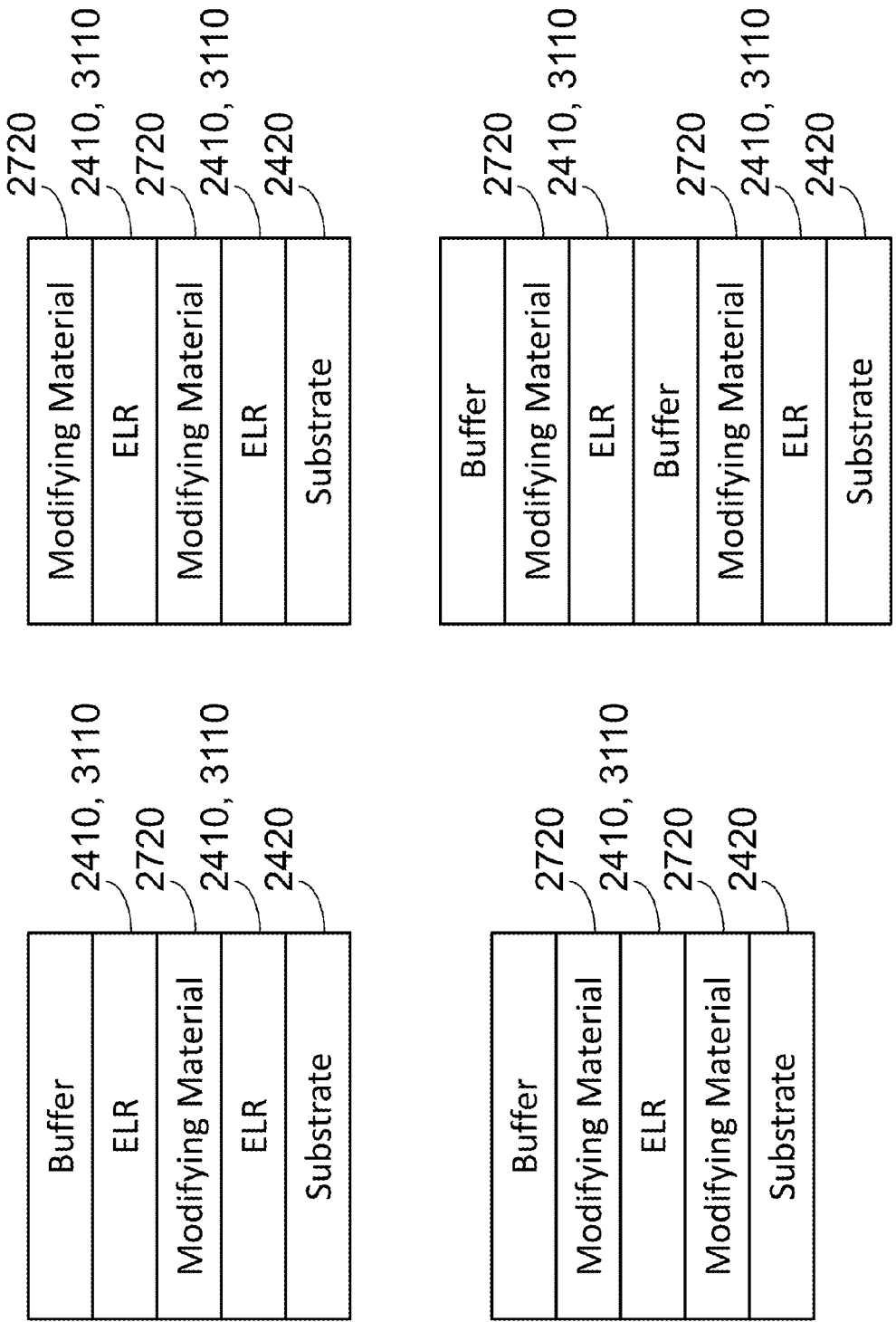
FIG. 33 illustrates various exemplary arrangements of layers of ELR material, modifying material, buffer or insulating layers, and/or substrates in accordance with various implementations of the invention.

Multiple layers of ELR material 2410, 3110, modifying material 2720, buffer or insulating layers, and/or substrates 1120 may be arranged in various implementations of the invention. FIG. 33 illustrates various exemplary arrangements of these layers in accordance with various implementations of the invention. In some implementations, a given layer may comprise a modifying material 2720 that also acts as a buffer or insulating layer or a substrate. Other arrangements or combinations of arrangements may be used as would be appreciated from reading this description. Furthermore, in some implementations of the invention, various layers of ELR material may have different orientations from one another in a given arrangement. For example, one layer of ELR material in an arrangement may have the a-axis of its crystalline structure oriented along the principal axis 2440 and another layer of the ELR material in the arrangement may have the b-axis of its crystalline structure oriented along the principal axis 2440. Other orientations may be used within a given arrangement in accordance with various implementations of the invention.

Figure 34:
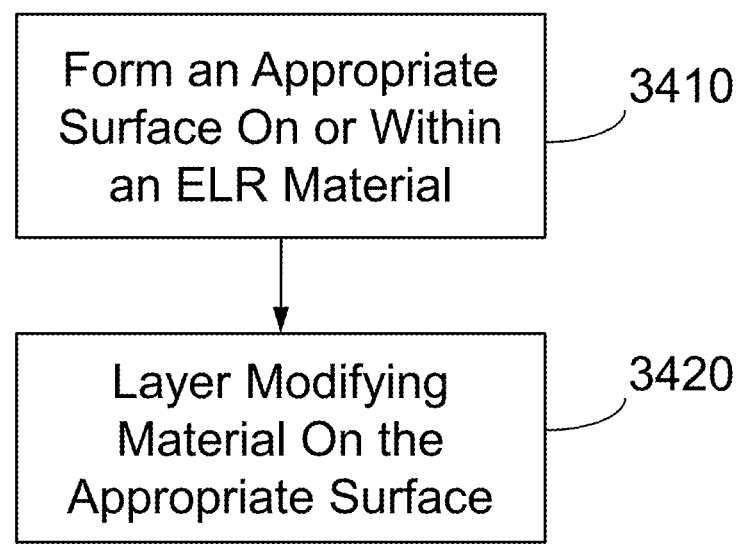
FIG. 34 illustrates a process for forming a modified ELR material according to various implementations of the invention.

FIG. 34 illustrates a process for creating a modified ELR material according to various implementations of the invention. In an operation 3410, an appropriate surface 2710 is formed on or within an ELR material. In some implementations of the invention where ELR material exists as ELR material 2410 of c-film 2400, appropriate surface 2710 is formed by exposing appropriate surface(s) 2710 on or within primary surface 2430 of a c-film 2400. In some implementations of the invention, appropriate surfaces of ELR material 2410 may be exposed by modifying primary surface 2430 using any of the wet or dry processing techniques, or combinations thereof, discussed above. In some implementations of the invention, primary surface 2430 may be modified by chemical etching as discussed above.

In some implementations of the invention where ELR material exists as ELR material 3110 of a-b film 3100 (with or without substrate 2420), appropriate surface 2710 is formed by layering ELR material 3110 (in a proper orientation as described above) onto a surface, which may or may not include substrate 2420.

In some implementations of the invention, appropriate surfaces 2710 include surfaces of ELR material parallel to the ab-plane. In some implementations of the invention, appropriate surfaces 2710 include faces of ELR material parallel to the b-plane. In some implementations of the invention, appropriate surfaces 2710 include faces of ELR material parallel to the a-plane. In some implementations of the invention, appropriate surfaces 2710 include one or more faces of ELR material parallel to different ab-planes. In some implementations of the invention, appropriate surfaces 2710 include one or more faces not substantially perpendicular to the c-axis of ELR material.

In some implementations of the invention, various optional operations may be performed. For example, in some implementations of the invention, appropriate surfaces 2710 or ELR material may be annealed. In some implementations of the invention, this annealing may be a furnace anneal or a rapid thermal processing (RTP) anneal process. In some implementations of the invention, such annealing may be performed in one or more annealing operations within predetermined time periods, temperature ranges, and other parameters. Further, as would be appreciated, annealing may be performed in the chemical vapor deposition (CVD) chamber and may include subjecting appropriate surfaces 2710 to any combination of temperature and pressure for a predetermined time which may enhance appropriate surfaces 2710. Such annealing may be performed in a gas atmosphere and with or without plasma enhancement.

In an operation 3420, modifying material 2720 may be layered onto one or more appropriate surfaces 2710. In some implementations of the invention, modifying material 2720 may be layered onto appropriate surfaces 2710 using various layering techniques, including various ones described above.

Figure 35:
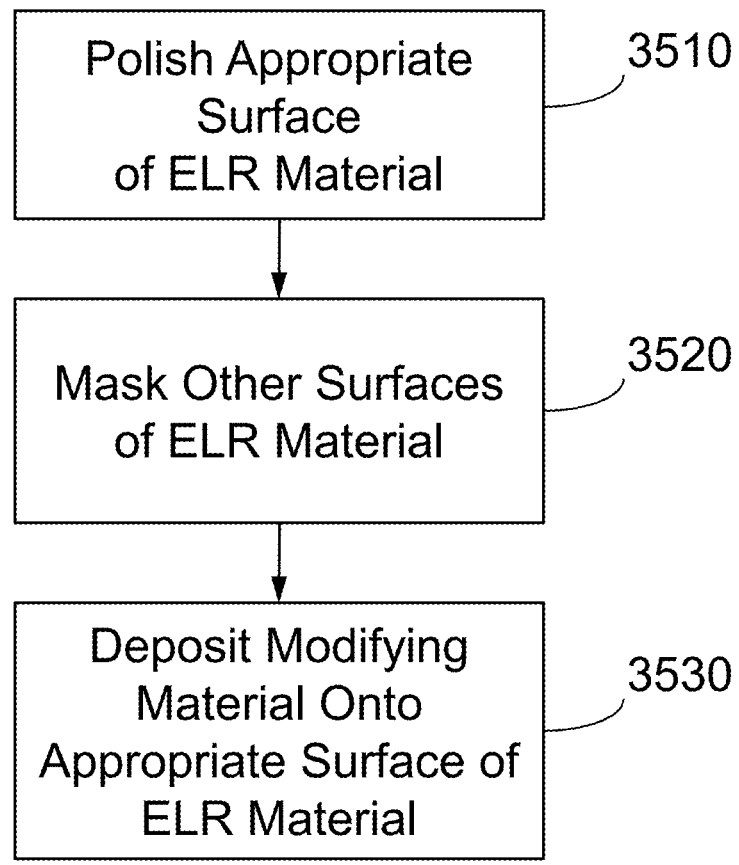
FIG. 35 illustrates an example of additional processing that may be performed according to various implementations of the invention.

FIG. 35 illustrates an example of additional processing that may be performed during operation 3420 according to various implementations of the invention. In an operation 3510, appropriate surfaces 2710 may be polished. In some implementations of the invention, one or more polishes may be used as discussed above.

In an operation 3520, various surfaces other than appropriate surfaces 2710 may be masked using any generally known masking techniques. In some implementations, all surfaces other than appropriate surfaces 2710 may be masked. In some implementations of the invention, one or more surfaces other than appropriate surfaces 2710 may be masked.

In an operation 3530, modifying material 2720 may be layered on to (or in some implementations and as illustrated in FIG. 35, deposited on to) appropriate surfaces 2710 using any generally known layering techniques discussed above. In some implementations of the invention, modifying material 2720 may be deposited on to appropriate surfaces 2710 using MBE. In some implementations of the invention, modifying material 2720 may be deposited on to appropriate surfaces 2710 using PLD. In some implementations of the invention, modifying material 2720 may be deposited on to appropriate surfaces 2710 using CVD. In some implementations of the invention, approximately 40 nm of modifying material 2720 may be deposited on to appropriate surfaces 2710, although as little as 1.7 nm of certain modifying materials 2720 (e.g., cobalt) has been tested. In various implementations of the invention, much smaller amounts of modifying materials 2450, for example, on the order of a few angstroms, may be used. In some implementation of the invention, modifying material 2720 may be deposited on to appropriate surfaces 2710 in a chamber under a vacuum, which may have a pressure of $5\times10^{-6}$ torr or less. Various chambers may be used including those used to process semiconductor wafers. In some implementations of the invention, the CVD processes described herein may be carried out in a CVD reactor, such as a reaction chamber available under the trade designation of 7000 from Genus, Inc. (Sunnyvale, Calif.), a reaction chamber available under the trade designation of 5000 from Applied Materials, Inc. (Santa Clara, Calif.), or a reaction chamber available under the trade designation of Prism from Novelus, Inc. (San Jose, Calif.). However, any reaction chamber suitable for performing MBE, PLD or CVD may be used.

Figure 36:
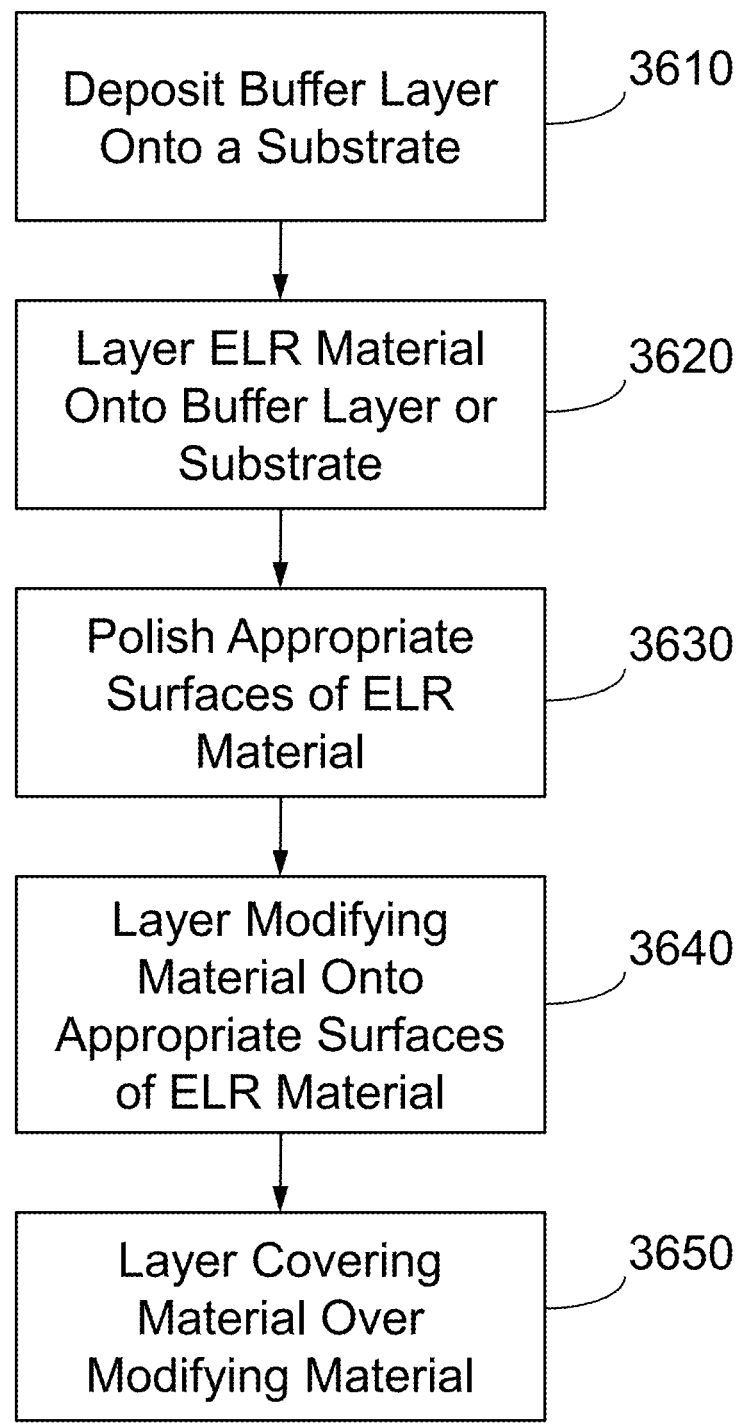
FIG. 36 illustrates a process for forming a modified ELR material according to various implementations of the invention.

FIG. 36 illustrates a process for forming a modified ELR material according to various implementations of the invention. In particular, FIG. 36 illustrates a process for forming and/or modifying an a-b film 3100. In an optional operation 3610, a buffer layer is deposited onto a substrate 2420. In some implementations of the invention, the buffer layer includes PBCO or other suitable buffer material. In some implementations of the invention, substrate 2420 includes LSGO or other suitable substrate material. In an operation 3620, ELR material 3110 is layered onto substrate 2420 with a proper orientation as described above with respect to FIG. 31. As would be appreciated, depending on optional operation 3610, ELR material 3110 is layered onto substrate 2420 or the buffer layer. In some implementations of the invention, the layer of ELR material 3110 is two or more unit layers thick. In some implementations of the invention, the layer of ELR material 3110 is a few unit layers thick. In some implementations of the invention, the layer of ELR material 3110 is several unit layers thick. In some implementations of the invention, the layer of ELR material 3110 is many unit layers thick. In some implementations of the invention, ELR material 3110 is layered onto substrate 2420 using an IBAD process. In some implementations of the invention, ELR material 3110 is layered onto substrate 2420 while subject to a magnetic field to improve an alignment of the crystalline structures within ELR material 3110.

In an optional operation 3630, appropriate surface(s) 2710 (which with respect to a-b films 3100, corresponds to primary surface 3130) of ELR material 3110 is polished using various techniques described above. In some implementations of the invention, the polishing is accomplished without introducing impurities onto appropriate surfaces 2710 of ELR material 3110. In some implementations of the invention, the polishing is accomplished without breaking the clean chamber. In an operation 3640, modifying material 2720 is layered onto appropriate surfaces 2710. In an optional operation 3650, a covering material, such as, but not limited to, silver, is layered over entire modifying material 2720.

The flowcharts, illustrations, and block diagrams of the figures illustrate the architecture, functionality, and operation of possible implementations of methods and products according to various implementations of the invention. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved.

Furthermore, although the foregoing description is directed toward various implementations of the invention, it is noted that other variations and modifications will be apparent to those skilled in the art, and may be made without departing from the spirit or scope of the invention. Moreover, various features described in connection with one implementation of the invention may be used in conjunction or combination with various other features or other implementations described herein, even if not expressly stated above.

What is claimed is:

1. A composition comprising:
   a first layer comprising BSCCO; and
   a second layer comprising a modifying material, wherein the modifying material of the second layer is bonded to the BSCCO of the first layer, wherein the modifying material comprises an element selected from the group consisting of: chromium, copper, bismuth, cobalt, vanadium, titanium, beryllium, gallium, selenium, and silver;
   wherein the modifying material of the second layer is bonded to a face of the BSCCO of the first layer, wherein the face is not substantially perpendicular to a c-axis of the BSCCO,
   wherein the composition has improved operating characteristics over those of BSCCO.

2. The composition of claim 1, wherein the modifying material of the second layer is bonded to a face of the BSCCO of the first layer, wherein the face is substantially perpendicular to any line in an "a-b" face of the BSCCO.

3. The composition of claim 1, wherein the modifying material of the second layer is bonded to a face of the BSCCO of the first layer, wherein the face is substantially perpendicular to a b-axis of the BSCCO.

4. The composition of claim 1, wherein the modifying material of the second layer is bonded to a face of the BSCCO of the first layer, wherein the face is substantially perpendicular to an a-axis of the BSCCO.

5. The composition of claim 1, wherein the modifying material of the second layer is bonded to a face of the BSCCO of the first layer, wherein the face is substantially parallel to the c-axis.

6. The composition of claim 1, wherein the composition operates at a higher temperature than that of BSCCO.

7. The composition of claim 6, wherein the composition demonstrates extremely low resistance at a higher temperature than that of BSCCO.

8. The composition of claim 6, wherein the composition transitions from a non-ELR state to a ELR state at a temperature higher than that of BSCCO.

9. The composition of claim 1, wherein the composition has a transition temperature greater than that of BSCCO.

10. The composition of claim 6, wherein the composition operates at a temperature greater than any one of the following temperatures: 100K, 150K, 200K, 250K, or 300K.

11. The composition of claim 1, wherein the composition carries a greater amount of current in an ELR state than that carried by BSCCO in its ELR state.

12. The composition of claim 1, wherein the second layer is deposited onto the first layer.

13. The composition of claim 1, wherein the first layer is deposited onto the second layer.

14. The composition of claim 1, wherein the BSCCO of the first layer is formed on the second layer.

15. A method comprising:
    bonding a modifying material to a face of BSCCO, wherein the modifying material comprises an element selected from the group consisting of: chromium, copper, bismuth, cobalt, vanadium, titanium, beryllium, gallium, selenium, and silver;
    wherein the face of the BSCCO is not substantially perpendicular to a c-axis of the BSCCO.

16. The method of claim 15, wherein bonding a modifying material to a face of BSCCO comprises depositing the modifying material onto the BSCCO.

17. The method of claim 15, wherein bonding a modifying material to a face of BSCCO comprises forming the BSCCO on the modifying material.

18. The method of claim 15, wherein bonding a modifying material to a face of BSCCO comprises bonding a first layer comprising the modifying material to a second layer comprising the BSCCO.

19. A composition comprising:
    a first layer comprising an extremely low resistance material, wherein the extremely low resistance material is BSCCO;
    a second layer comprising a modifying material, wherein the second layer is bonded to the first layer;
    a third layer comprising the extremely low resistance material; and
    a fourth layer of the modifying material, wherein the third layer is bonded to the fourth layer;
    wherein the modifying material of the second layer is bonded to a face of the BSCCO of the first layer, wherein the face is not substantially perpendicular to a c-axis of the BSCCO, and
    wherein the modifying material of the fourth layer is bonded to a face of the BSCCO of the third layer, wherein the face is not substantially perpendicular to a c-axis of the BSCCO.

* * * * *